United States Patent [19]

Garric et al.

[11] Patent Number: 5,411,358
[45] Date of Patent: May 2, 1995

[54] DISPATCHING APPARATUS WITH A GAS SUPPLY DISTRIBUTION SYSTEM FOR HANDLING AND STORING PRESSURIZED SEALABLE TRANSPORTABLE CONTAINERS

[75] Inventors: George Garric, Perthes; André Lafond, Nemours, both of France

[73] Assignee: International Business Machines Corporation, Armonk, N.Y.

[21] Appl. No.: 102,075

[22] Filed: Aug. 3, 1993

[30] Foreign Application Priority Data

Aug. 4, 1992 [XH] Hague Agreement ......... 92480110.3

[51] Int. Cl.⁶ .................................................. B65G 1/04
[52] U.S. Cl. ..................................... 414/277; 414/940
[58] Field of Search ................. 414/217, 940, 277–283, 414/331

[56] References Cited

U.S. PATENT DOCUMENTS

| | | | |
|---|---|---|---|
| 4,964,776 | 10/1990 | Wakita et al. | 414/282 X |
| 4,981,409 | 1/1991 | Hirose et al. | 414/280 X |
| 4,995,430 | 2/1991 | Bonora et al. | 414/940 X |
| 5,059,079 | 10/1991 | Foulke et al. | 414/940 X |
| 5,064,337 | 11/1991 | Asakawa et al. | 414/940 X |
| 5,143,193 | 9/1992 | Geraci | 414/277 X |
| 5,220,548 | 6/1993 | Nakatsukssa et al. | 414/280 X |
| 5,284,412 | 2/1994 | Shiraiwa et al. | 414/940 X |

FOREIGN PATENT DOCUMENTS

| | | |
|---|---|---|
| 0273791 | 7/1988 | European Pat. Off. |
| 2610609 | 8/1988 | France ............................... 414/281 |
| 2199022A | 6/1988 | United Kingdom . |

OTHER PUBLICATIONS

Solid State Technology, vol. 33, No. 8, Aug. 1990, pp. S1–S5, Claude Doche, "Wafer Confinement for Control of Contamination in Microelectronics".

*Primary Examiner*—David A. Bucci
*Attorney, Agent, or Firm*—Harold Huberfeld

[57] ABSTRACT

The dispatching apparatus with a gas supply distribution system (300) basically comprises an automatic handler 301 and a vertical stocker (302). The vertical stocker has a frame (308) formed by an assembly of tubes supporting a plurality of support stations or bins (309) each provided with gas infectors (311) connected on the one hand to the gas injection valves of the container and on the other hand to a compressed ultra pure neutral gas supply installation. As a result, during the processing idle times, an adequate overpressure of said neutral gas is maintained in the interior space of the container enclosing the workpiece, e.g. a silicon wafer. The automatic handler (301) basically comprises a handling robot (305) having an extending arm (306) provided with gripping means (307) adapted to the container design. The handling robot (305) is affixed on an elevator (304) for vertical movement and is able to rotate about it. The automatic handler (301) is adapted to transfer of containers (100) between the vertical stocker and conventional conveyors (401, 402) or between the conveyors themselves.

9 Claims, 22 Drawing Sheets

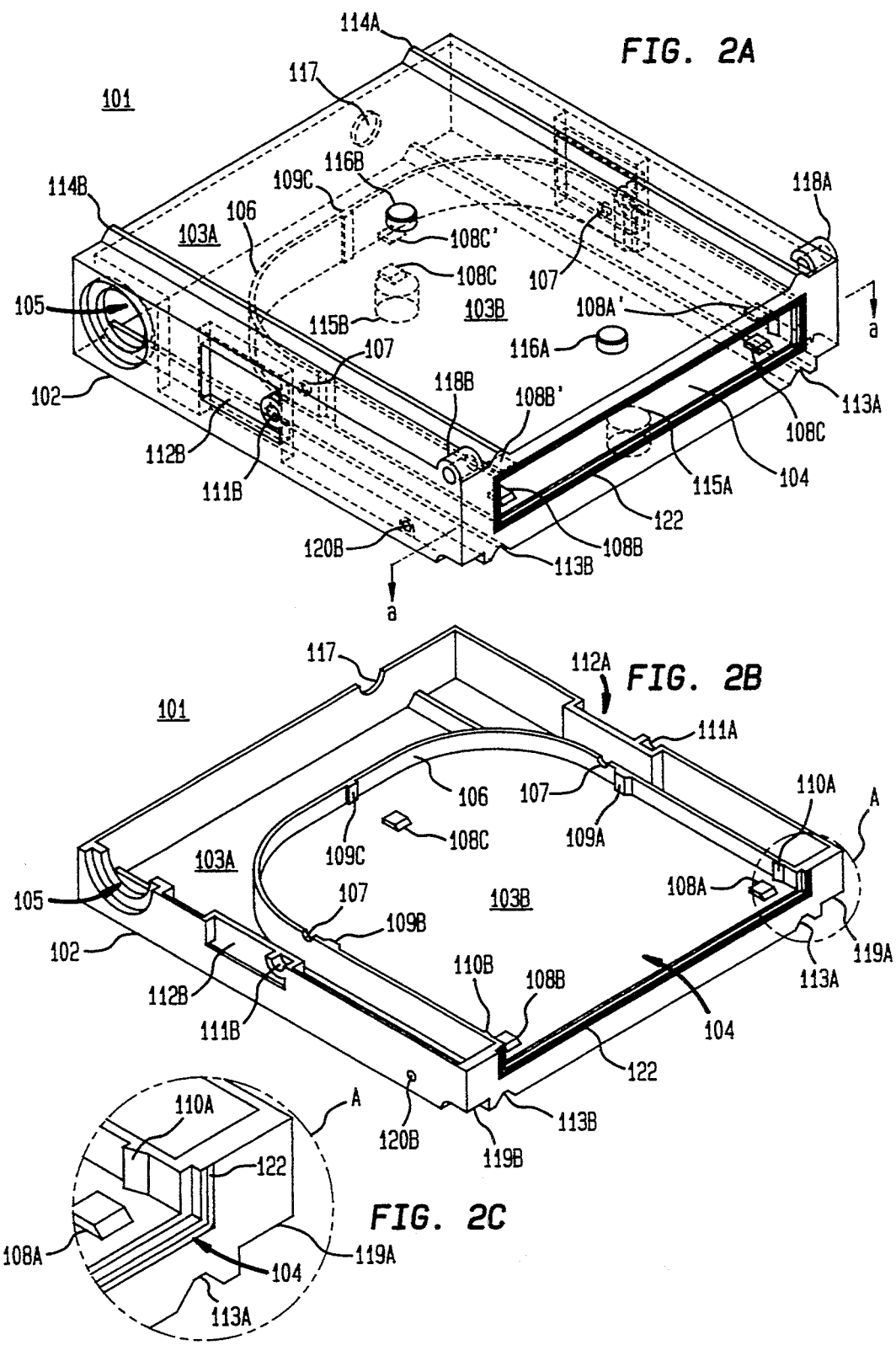

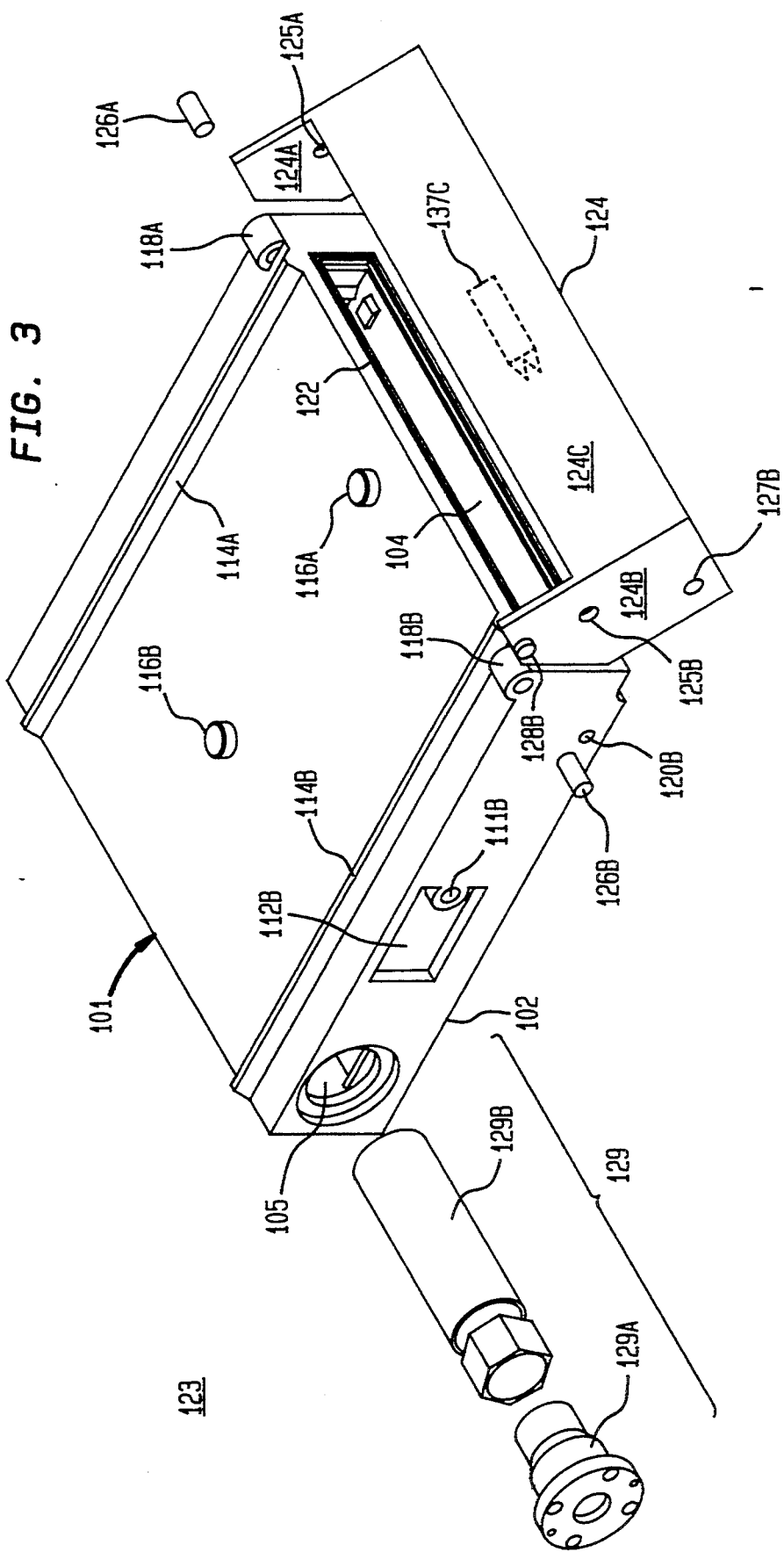

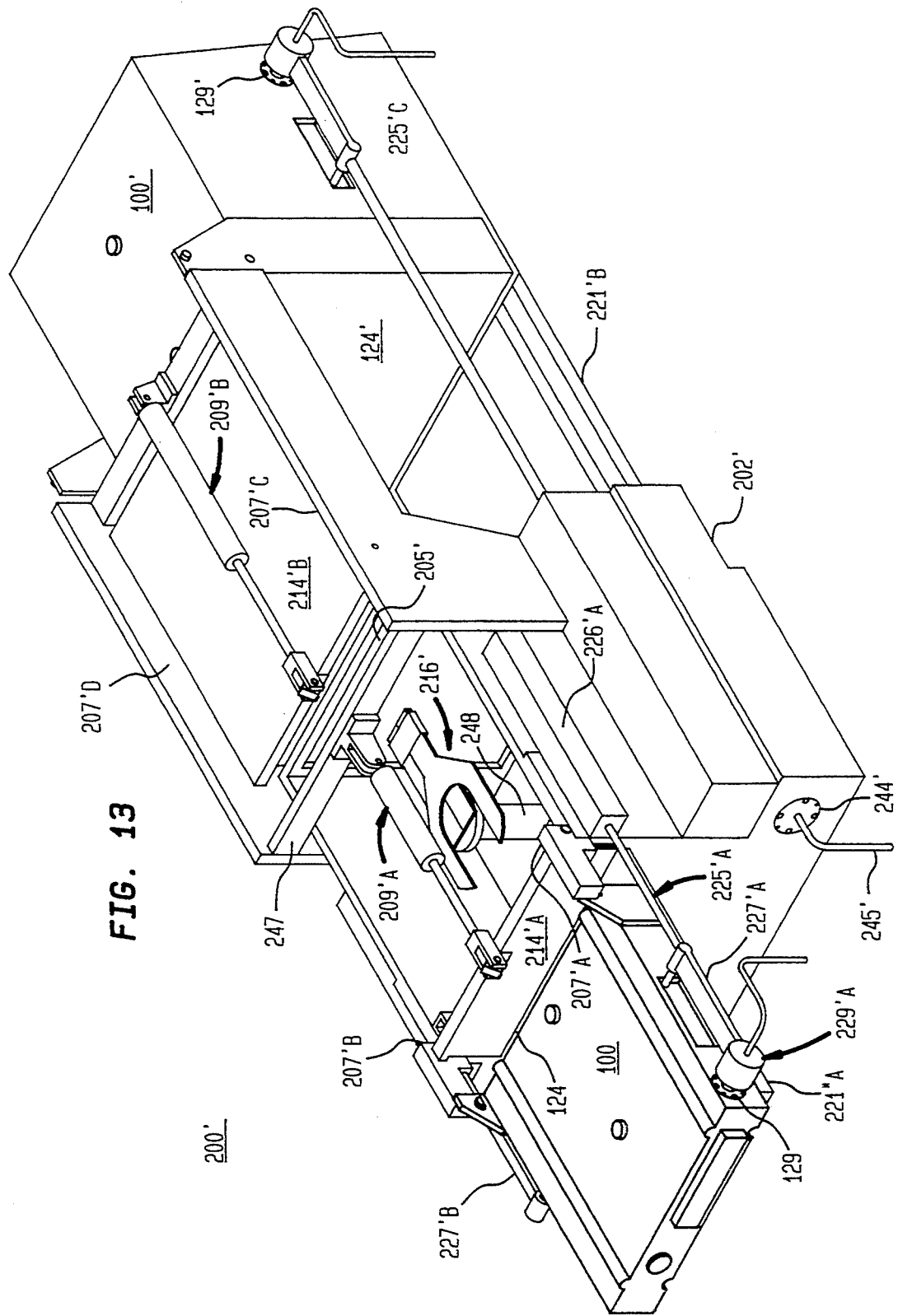

DISPATCHING APPARATUS WITH A GAS SUPPLY DISTRIBUTION SYSTEM FOR HANDLING AND STORING PRESSURIZED SEALABLE TRANSPORTABLE CONTAINERS

FIELD OF INVENTION

The present invention relates to container handling and storing systems and more particularly to a family of dispatching apparatus provided with a gas supply distribution system for handling and storing pressurized sealable transportable containers. Each container encloses a work piece, typically a semiconductor wafer, in a protective gaseous environment. Said gas supply distribution system aims to maintain said protective gaseous environment during the processing idle times.

COPENDING APPLICATIONS

Pressurized sealable transportable containers for storing a semiconductor wafer in a protective gaseous environment, U.S. application No. 08/101,599, filed Aug. 3, 1993.

Pressurized interface apparatus for transferring a silicon wafer between a pressurized sealable transportable container and a processing equipment; U.S. application No. 08/102,076, filed Aug. 3, 1993.

Fully automated and computerized conveyor based manufacturing line architectures adapted to pressurized sealable transportable containers; U.S. application No. 08/101,608, filed Aug. 3, 1993.

The first application is directed to a family of pressurized sealable transportable containers which store a single semiconductor wafer in a protective gaseous environment having a positive differential pressure with the outside ambient (e.g. the atmosphere). It is the essential constituent of this group of four inventions. The second application is directed to a family of pressurized interface apparatus for interfacing the container and a processing equipment. The role of the interface apparatus is to transfer said wafer from the container into a processing equipment for treatment and vice-versa without breaking said protective gaseous environment. The third application is directed to a family of dispatching apparatus with a gas distribution system for handling and storing the containers during the wafer idle times between different processing steps while still maintaining said protective gaseous environment. The fourth application is directed to the optimal integration of above elements with conventional conveyor means and a computer system to result in a fully automated and computerized manufacturing line which is modular, flexible and fully compatible with the Continuous Flow Manufacturing (CFM) concept in a Computer Integrated Manufacturing (CIM) environment.

There are three major principles at the base of these inventions.

1. In essence, the container is adapted to store a single semiconductor wafer.

2. Except of course during treatment in the processing equipment, the semiconductor wafer is permanently surrounded by a protective gaseous environment having a static pressure higher than the one of the outside ambient. To that end, the container is filled with a compressed ultra pure neutral gas. As a result, the container interior space has a positive differential pressure with respect to the outside ambient. Within the container, the protective environment is safe, clean and still. This pressurized neutral gas constitutes said desired protective gaseous environment which fully isolates the wafer from any contamination existing in the outside ambient. Preferably, the gas is continuously rejuvenated through a high efficiency filter by a permanent connection of the container to a supply installation of said compressed ultra pure neutral gas, except during the very short times of transportation in the manufacturing facility. Likewise, to that end, the pressurized interface apparatus and the dispatching apparatus are provided with gas feeding means. Moreover, the container and the pressurized interface apparatus have been specifically designed so that during the transfer operations therebetween, the wafer is still protected by an efficient curtain or shower of said gas. Therefore, there is no isolation breakdown during the whole wafer processing/treatment. Finally, fabrication of contamination-free wafers under the conditions appropriate in ultra clean rooms is henceforth feasible without the huge facilities that are usually required in that respect.

3. Usage of conventional conveyors. All these elements have been designed to be fitted with conventional conveyors, that are widely recognized as a convenient transportation system, fully adapted to mechanical automation and computerization.

DESCRIPTION OF THE PRIOR ART

Semiconductor wafers (hereinafter referred to as "wafers") are the base material for the production of VLSI chips. Wafers, usually stored in carriers or jigs, may only be handled and transported in extremely clean environments, because even minute dirt or dust particles render them unusable for further processing. Therefore, control of particulate contamination is imperative for cost effective, high-yield and profitable manufacturing of VLSI chips. Because design rules increasingly call for smaller lines definition, it is necessary to exert greater control on the number of particles and to remove particles with even diminishing sizes. For instance, contamination particles may cause incomplete etching in spaces between conductive lines which in turn, result in electrical failures in the final chips.

Particles sizes down to 0.1 μm can still be very damaging in the semiconductor processing because of the very small geometries employed today in fabricating the semiconductor devices integrated in the VLSI chips. Typical semiconductor processes today employ geometries which are 0.5 μm in the manufacturing lines, therefore particles which have geometries measuring greater than 0.05 μm substantially interfere with such 0.5 μm geometry semiconductor devices. Because, the trend of course is to have even smaller and smaller geometries, which today in research and development laboratories approach 0.1 μm and below, hence contamination by even smaller particles becomes of paramount importance.

The main sources of particulate contamination are personnel, equipment, installation (including clean rooms) and chemicals. Particles within the equipments and chemicals are termed "process defects". To minimize process defects, processing equipment manufacturers must prevent machine generated particles from reaching the wafers and suppliers of gases and liquid chemicals must deliver cleaner products. Particles given off by personnel and clean room facilities are certainly the most important source of contamination. Because they are easily ionized, they tend to cause defects onto the wafer surface.

The continuous trend in the semiconductor industry has been to build even increasing elaborated (and thus expensive) clean rooms with HEPA (High Efficiency Particulate Air) filters and recirculating air systems to thoroughly control contamination by particles. Filter efficiencies of 99.99999% and up to ten complete air exchanges per minute are customary requirements to date to obtain an acceptable level of cleanliness in the clean rooms. As a matter of fact, since different people, types of equipment, and materials (including filters, fans, . . . ), are also present in the clean room environment, the clean room cannot be maintained as particle free as desired. In particular, although usage of improved clean rooms reduces particle emission by these different sources, they do not fully contain such emissions. Moreover, admittedly it is virtually impossible to maintain clean rooms free of particles of 0.1 $\mu$m size and below.

As a matter of fact, clean rooms rated class <1 are quite impossible to build. In addition, chemical contaminant control in recycled air is a dramatic challenge because of the complex and costly installation thus required. Moreover, exploitation and maintenance costs of such clean rooms become really prohibitive. Note also, the low flexibility of the manufacturing lines constructed in such clean rooms, because existence of walls, floors, conditioning systems, . . . etc. In addition, the tracking and management of processed wafers in such manufacturing lines, according to the host computer of the Floor Control System (FCS), are difficult and require many manual operations.

Wafers are only partially protected against particulate contamination and poorly protected against chemical contamination. For example, photoresists are more and more sensitive to chemical product traces contained in the recycled air. This is an ever increasing problem, when recycled air is used in that respect, because HEPA filters significantly reduce the particulate contamination level but are inoperative with respect to contaminant chemical molecules.

In order to decrease wafer particle contamination and to enhance thereby production throughput, a number of techniques to design improved and clean enclosures instead of said carriers have been recently introduced for storing and transporting the wafers to be used solely or in combination with the clean room concept.

As far as such enclosures are concerned, there are two basic schools of thought depending upon they are of the "open type" or of the "closed type". In the former case, the enclosure consists of a container including an air cleaning device, a battery as a power source, a fan unit, and a particulate air filter. The storing chamber which is directly connected to the air cleaning device, has a first opening for receiving the filtered air flow and a second opening for loading and unloading the carrier or holder containing the wafers, both openings facing each other. As a result, the major part of the filtered air flows in a laminated stream passing along the surfaces of the wafers with a fairly high speed, serving to protect the wafers from the intrusion of the particles contained in the environmental air, and removing the undesired particles originally adhered to the said wafer surfaces.

Illustrative of this first approach is U.S. Pat. No. 4,963,069 (Ref. D1) assigned to Meissner and Wurst GmbH. What is sought here is the cleaning effect of the laminar gas flow. Note the absence of a door closing the container, because the container is open on the side opposite to the fan unit.

A variant to this approach consists to have a conventional wafer carrier moving in a clean tunnel. According to this implementation, a plurality of air blowers spaced with each other are disposed along a side wall of a clean tunnel, thereby outer air is supplied into a tunnel zone by way of a HEPA filter. A clean air produced within the tunnel zone is circulated by disposing air outlets and a suction port in a zone of each blower. Thus, a constant clean air flow can be circulated above the carriers supporting the wafers within the clean tunnel during the whole wafer carrier transportation. An example of this approach described in U.S. Pat. No. 4,660,464 (Ref. D2) assigned to Sanki Kogyo KK. As illustrated in FIG. 4 thereof, the physical implementation of the tunnel is relatively complex and room consuming. This approach is penalized by an obvious lack of flexibility due to the heavy implementation that is required.

Although conceptually simple, the "open type" container approach does not appear to meet the present and future manufacturing needs, and to date most technical experts seem to rely more on enclosures of the "closed type", i.e. wherein the wafers are hermetically enclosed. The "open type" approach was considered because the admitted difficulty to ensure airtight sealing of the "closed type" enclosure. Should the enclosure become damaged, the wafers would be immediately contaminated. However, the same problem exists with respect to the "open type" approach, for example, should a failure occur in the air cleaning device or in the battery. In addition, this approach is not reliable in case of shocks and exploitation costs are very high (the filter needs frequent changes).

The major contribution to the "closed type" enclosure state of the art in that respect, is known under the brand name of the Standardized Mechanical InterFace (SMIF) concept. The SMIF concept was first described in the article "SMIF: a technology for wafer cassette transfer in VLSI manufacturing", by Mihir Parikh and Ulrich Kaempf, Solid State Technology, July 1984, pp. 111–115 (Ref. D3). Further details can be found in patent specifications U.S. Pat. No. 4,532,970 (Ref. D4) and U.S. Pat. No. 4,534,389 (Ref. D5) both assigned to Hewlett-Packard Cy. In essence, according to the fundamentals of the SMIF concept, the proposal consists to reduce particle contamination by significantly limiting particle fluxes onto wafers by mechanically ensuring that during transport, storage and processing of the said wafers, the gaseous media, generally air, surrounding the wafers is essentially stationary relative thereto. To have a plurality of wafers permanently surrounded by a still gaseous ambient in a clean enclosure is therefore the essential characteristics of the base SMIF concept.

Its reduction to practice results in a standard SMIF system which basically comprises four essential parts.

First, a small box having a still clean gaseous internal environment, referred to as the base SMIF box, consisting of a box top or cover sealingly mating with a box base for hermetic tight and enclosing a wafer cassette. The gaseous media surrounding the wafers results from the specific ambient which prevailed at the time the wafer cassette was enclosed within the base SMIF box. A standard cassette carries about 25 wafers. The base SMIF box is used for storing and carrying wafers to and from a processing equipment and between different processing equipments.

Second, an interface apparatus referred to as the base SMIF interface apparatus, which essentially consists of a removable canopy that fully covers the input/output port of the specific processing equipment. The canopy demarcates a still, particle-free air volume referred to as the canopy interior space to interface with the processing equipment. The latter is typically a mask aligner, an evaporator, a RIE etcher and the like. On the other hand, the internal environment within the processing equipment is separately maintained and cleaned, so that the processing equipment need not to be necessarily installed in a clean room. The SMIF box is placed at an interface port on top of the canopy, referred to as the canopy port, forming an hermetic seal therewith. Then, the cassette containing the wafers is withdrawn from the SMIF box and transferred by an elevator/manipulator assembly to the close vicinity of the said input/output port for processing. Next, the wafers are extracted from the cassette and introduced in the processing equipment chamber, either manually by an operator manipulating a gripper via a glove port or automatically using a loading/unloading robot. Thus, the base SMIF box can be carried in a non-clean atmosphere to an appropriate processing equipment where the wafers are processed in a controlled clean environment without contamination and without having to make the entire manufacturing facility clean.

Third, a conventional storage station provided with a number of racks or compartments is required to store the base SMIF boxes during the wafer processing idle times.

Fourth, a transportation system for moving the base SMIF boxes between the base SMIF interface apparatus and the storage station. Conventionally, the base SMIF box is manually transported from one processing equipment to another or from the storage station to one processing equipment and vice versa. But, alternatively, the standard SMIF system may preferably further include an automatic transportation and handling system, typically, a robotic vehicle, usually referred to as the Automated Guided Vehicle (AGV), controlled by the FCS through a wireless link.

The standard SMIF system described above may encompass a large variety of variants, however the four basic components mentioned above still remain: the SMIF box, the SMIF interface apparatus (enclosing the processing equipment), the storage station and the robotic vehicle (in the automated version). There is a plethora of pertinent references in that respect.

For instance, a typical base SMIF box is shown in U.S. Pat. No. 4,674,939 (Ref. D6) assigned to ASYST Technologies Inc., and more particularly in FIG. 3. According to that reference, there is described a sealable transportable box which defines an interior space for containing a number of wafers. The SMIF box includes a box top or cover and a box base which supports the box top. It further includes a box door for opening and closing the box. The box door is a support which is adapted to receive the cassette holding the wafers within the said interior space. The wafers in the cassette are retractable with the box door. Once the SMIF box has been placed down on top of the canopy port and firmly secured and sealed therewith, an elevator inside the canopy, is actuated to withdraw the canopy port door with the box door (the wafer cassette is attached thereto), down and out of the box. The wafers in the cassette can now be extracted from canopy port door/-box door assembly for subsequent adequate treatment in the processing equipment chamber. The box top ensures hermetic sealing at the canopy port location thereby preventing any ingress of dirt particles within the canopy interior space. All individual elements are carefully adjusted one with respect to the others, to provide dust-tight seals therebetween.

The above SMIF box has a number of inconveniences. First of all, it requires a large number of mechanical parts and the assembly thereof is quite complex. But the major inconvenience lies in that particle contamination may still arise, in particular during transportation when a SMIF box is disturbed and during the idle time periods the wafers are not processed when the SMIF boxes are stored under not optimal clean room conditions, simply because the SMIF box is not fully hermetically sealed.

Whenever a SMIF box is disturbed, by bumping for example, many small particles are freed from the surface and find their way as contaminants onto the semiconductor wafer present in the SMIF box. In particular, the greatest the number of wafers stored in the SMIF box, the most likely this contamination by silicon particulates. As a matter of fact, when a SMIF box becomes contaminated, it is very difficult to remove said small contaminant particles since the force of attraction of small particles to the interior surfaces of the container is very high. In addition, the SMIF box shape and construction result in easy particle trapping. Scrubbing and washing techniques thus have been developed for removing said small particles, but they tend to be cumbersome and are not entirely effective because of the number of the different mechanical parts and their complex assembly mentioned above.

On the other hand, the chemical contamination problem is not addressed, because the gaseous media which surrounds the wafers is the ambient which prevailed at the time the cassette was loaded in the SMIF box, generally a clean air ambient but with no special care with respect to potentially existing contaminant chemical molecules.

Therefore, there was still a need for an improved enclosure really effective for reducing this global contamination. However, as far as particulate contamination is concerned, two significant improvements have been recently made to the base SMIF box, in an attempt to solve this acute problem.

According to U.S. Pat. No. 4,739,882 (Ref. D7) again assigned to ASYST technologies Inc, the first improvement consists in inserting a liner into the SMIF box interior space surrounding the cassette (for illustration, see more particularly FIG. 3). In a preferred embodiment, the liner comprises a top liner located between the box top and the box base, made of a semi-rigid material which maintains a concave shape and surrounds the cassette or holder independently of any mechanical support. In another preferred embodiment, the liner further includes a base liner which is adapted to fit on the surface of the box door. The base liner has a sealing lip around its perimeter for exerting a force between the base and the box door for encouraging a dust-tight seal therebetween. The top liner includes a compression means for exerting a force between the box top and box base. The top liner sits on the box base.

Typically, the top liner is a thin, flexible plastic liner which requires mechanical support to be held in a tent shape. The top liner is made from a non-contaminating material such as a thermoplastic, examples of which are vinyl, acrylic or fluoroplastic. Thermoplastics can be conformed by well-known techniques into relatively thin or thick transparent films. In any embodiment, such thermoplastic films are manufactured by processes which result in a low number of very small contaminant particles. A fluoroplastic is a generic name for polytetrafluorethylene and its copolymers. One such well known fluoroplastic is TEFLON (a trade mark of du Pont).

The liners are essentially disposable. Typically, a liner is destroyed after one or several uses. It is expected that a liner would last 1 week to 3 weeks under expected processing conditions. Although the liner environment is as clean as possible, contaminants generated by bumping as mentioned above are present. The contaminants collected on the external surface of the liner, cause the liner to become dirty and become of potential source of contamination for the subsequent processing steps at the opening of the SMIF box. By replacing the liner, the container is restored to its original "clean" state without the need to replace the entire SMIF box itself. Although particulate contamination was significantly reduced thanks to the presence of such liners, contaminants were still noticed onto the wafer surfaces.

A further improvement is described in U.S. Pat. No. 4,724,874 (Ref. D8) again assigned to ASYST Technologies Inc. In this reference, the improved SMIF box has a similar construction with respect to the SMIF box just described above in U.S. Pat. No. 4,739,882. The originality now mainly consists in the provision of a valve and a conduit in the box door for communicating between the interior space of the box and a pump when an injector/extractor assembly is sealably inserted in the valve. As illustrated in FIGS. 2 to 4 of U.S. Pat. No. 4,724,874, this assembly is mounted through the port plate. The conduit includes a filter for filtering the gas, e.g. air (or nitrogen) passing through the conduit. Still according to U.S. Pat. No. 4,724,874, the improved SMIF box once affixed onto the canopy port, is cleaned by alternatively pressurizing and evacuating the internal air through said filter. Thus, air may be circulated throughout the interior space of the improved SMIF box without opening it.

Similarly, the base SMIF interface apparatus is also modified to take in account this gas cleaning improvement. It thus includes means for supplying the gas to the improved SMIF box. Moreover, the canopy environment pressure is also independently controlled, because the canopy interior space is likewise connected to the pump (num. 102 in FIG. 2). As a result, connecting the improved SMIF box interior space to the said pump via said injector/extractor assembly, allows not only to clean the wafers but also to match the pressures between the said improved SMIF box interior space and the canopy interior space before the wafer cassette is retrieved from the improved SMIF box and introduced in the processing equipment.

According to U.S. Pat. No. 4,724,874, the permanent still air approach that has prevailed on the prior base SMIF boxes is no longer used, probably because it revealed to be not fully satisfactory. As a matter of fact, the prior base SMIF concept has included the principle that the wafers move from the SMIF box to the processing equipment by disturbing the least possible amount of air within the box. The admitted advantage of this approach is that any particulate in the enclosed clean air would not damage the wafers because the air remains relatively still or stagnant during the various handling/transportation steps. Now, according to U.S. Pat. No. 4,724,874 it has been found that stagnant air, too, has many particles which may also cause damage simply by static attraction. The first attempt to solve this problem mentioned above with reference to U.S. Pat. No. 4,739,882, was the insertion of a disposable liner between the wafer cassette and the box top. The recognition that the permanent still air approach causes contamination and damage has therefore created the need explicated in U.S. Pat. No. 4,724,874, for a temporary dynamic cleaning as similarly practiced in some respects in the "open type" enclosures. This air cleaning of the internal environment of the SMIF box interior space with which the wafers are exposed is performed by successive pressurization/evacuation of the enclosed air. It aims first to release the particles, then to collect them for subsequent elimination. The final result is therefore a significant departure from the base SMIF still air approach which employed no active pressurization/evacuation of the SMIF box internal space. It is important to notice that the air cleaning step is performed on the totality of the wafers enclosed in the cassette and only when the improved SMIF box is affixed onto the canopy port. The essence of the improved SMIF concept is therefore an hybrid approach to the solution of the contamination problem. The wafers are enclosed in a still air ambient during the storage and the transportation but are subjected to a vigorous dynamic air flow cleaning before being processed.

In summary, the ultimate SMIF solution described in U.S. Pat. No. 4,724,874 and more particularly in FIG. 4 basically consists of an improved SMIF box for use with an improved interface apparatus.

The improved SMIF box construction still includes a housing having an interior space for containing a wafer cassette. A plastic liner is inserted into the said interior space to surround the cassette. The liner forming material appears to be limited to plastics because of the flexibility requirements. The box includes a box top and a box door are designed for tight closure. The port plate mentioned above is sealably mating to the box top. The port door includes a sealing surface and is affixed to the port plate. The box door includes a relatively sophisticated latch mechanism for mechanically opening and closing of the port door. But now, the improved SMIF box further includes a conduit and a valve for establishing a communication between its interior space and a pump via an injector/extractor which is sealably inserted through the port plate when the SMIF box is affixed on the canopy port. The conduit includes a filter for filtering the fluid passing through it.

Likewise, the improved SMIF interface apparatus still consists of a canopy which is adapted to the specific processing equipment and covers the input/output ports thereof. In addition to the canopy port, the interface apparatus includes a motor driven elevator/manipulator assembly that is required to extract the wafer cassette from the SMIF box and transport it to the processing equipment input/output port and reciprocally. As apparent from FIG. 2 of U.S. Pat. No. 4,724,874, this is a relatively complex mechanism and a potential source of wafer contamination. But now, the improved interface apparatus further includes means for connecting the interior space of the improved SMIF box and of the canopy to a pump. It is important to notice that in accordance with the teachings of this reference, the need for gas cleaning is performed at localized areas, i.e. when the improved SMIF box is affixed on the canopy port and thus, only for the corresponding periods.

Still according to this ultimate SMIF solution, no significant improvements are suggested in U.S. Pat. No. 4,724,874, as far as the storage station and the transportation technique are concerned with regards to the base SMIF solution.

Finally, although the base SMIF solution has been ameliorated in some extent, it still remains some major inconveniences in the ultimate SMIF solution, as it will be analyzed below.

First of all, should the SMIF boxes not fully hermetically sealed, because its interior space is not pressurized, particles from the outside ambient are not completely prevented to enter into the immediate internal wafer environment. Admittedly, it would be too difficult and expensive to built totally hermetic SMIF boxes.

Recent experiments have shown that when small particles become attached to a surface such as a SMIF box, they are not effectively removed by air circulation and filtration techniques. As a matter of fact, circulating and filtering air (or other inert gas) within the improved SMIF box does not readily remove the contamination particles which are attracted and held in contact with the internal surfaces thereof.

During the air cleaning step which is performed only when the improved SMIF box is affixed onto the canopy port, a relatively important quantity of gas is injected therein and flows directly onto the wafers. Because, filtering is not 100% perfect, the particles remaining in the filtered gas which is spread over the wafers, are likely to be deposited thereon, i.e. the reverse effect of what is sought in reality.

Consequently, the wafers are not effectively isolated from particulate contamination during the whole sequence of fabrication steps.

In addition, the chemical contamination aspects have been completely missed in U.S. Pat. No. 4,724,874, because the air which is employed during said air cleaning step is the ambient air pressurized by a pump. The wafers stored in the improved SMIF box when the latter is mounted onto the canopy port are therefore in contact with an ambient which contains contaminant chemical molecules.

The SMIF box construction is rather complex, therefore, to clean the different parts of the SMIF box is difficult. Moreover, assembling said parts manually by an operator is also a potential source of contamination for the SMIF box.

SMIF boxes are not readily stackable, and typically are designed for lonely usage.

As apparent from the above, SMIF boxes are well adapted to receive a cassette which carries a plurality of wafers. None of the described SMIF boxes appear to have been specifically designed for carrying a single wafer. To date, silicon wafers are by far the most extensively used in the semiconductor industry and with the continuous increase of the silicon wafer diameter, SMIF boxes weight even heavier and become unhandy. A SMIF box of 25 silicon wafers weights about 5 kgs. Consequently, 200 mm diameter wafers seem to be the extreme limit for multiple silicon wafer SMIF boxes. By the way, the largest the capacity of the cassette, the greatest the risk of contamination by silicon particulates during the handling/transportation steps.

On the other hand, the present trend in advanced wafer processing is to evolve towards the Single Wafer Treatment (SWT) for process uniformity and quality reasons. Single wafer processing equipments are extensively used for PECVD, RIE, RTP and other processes. Only some processes, such as CVD Al because of its low deposition rate cannot be implemented this way. Batch processing is then required. Typical advanced single wafer processing equipments use a system configuration comprising a wafer transfer robot which transfers a wafer stored in a multiple wafer cassette to and from a single wafer processing chamber generally operating under vacuum. In that respect, the SMIF box does not appear adequate, because when a wafer is processed in a single wafer processing equipment, the other wafers are idling and become readily contaminated. Moreover, if a SMIF box contains wafers to be processed in different equipments, the individual wafer follow-up process is quite cumbersome if even possible.

In addition, to date, the Single Wafer Treatment (SWT) approach appears to be the only adequate way to fulfill the Continuous Flow Manufacturing (CFM) concept requirements in a Computer Integrated Manufacturing (CIM) environment, and in that respect again, SMIF boxes still do not appear to be well adapted. By CFM, it is meant a technique for reducing the lead times and thus the idle times. In particular, it is important to optimize the chaining of the various processing steps in order to fabricate the chips faster. By a CIM environment, it is meant an installation, e.g. a manufacturing line, that is automated and fully under computer control.

However, the demand of simultaneously handling a plurality of wafers may continue. For example, because of the nature of the semiconductor material, e.g. gallium-arsenide (GaAs) wafers have a smaller diameter when compared to silicon wafers or because of the nature of the processing step: e.g. wafer rinsing/dipping steps are usually completed by batch. More generally, this demand may exists for other types of workpieces in different fields of the technology. So that, for universal use, any valuable innovative "closed type" enclosure design should have the ability to be simply adapted to batch processing.

As far as the improved SMIF interface apparatus is concerned, it still does not appear to be adequate in some respects. First, it requires a relatively sophisticated implementation from a mechanical point of view. In particular, the step of withdrawal mentioned above, necessitates complex latch/release mechanisms in particular at the canopy port between the port door and the box door, as illustrated by FIG. 3 of U.S. Pat. No. 4,724,874, mainly because the weight of the cassette (5 Kgs). Additionally, such a complex mechanism is a potential source of wafer contamination. Moreover, the canopy delineates a large volume interior space. Should air be used as the internal ambient because of its low cost, it would cause undesired oxidation effects to the exposed silicon. On the contrary, should nitrogen be used, because of the large volume delineated by the canopy, it would result in a very costly solution.

SMIF boxes are still stored into individual racks or compartments of a huge storage station (see FIG. 4 of the above cited article). As mentioned above, all the handling is manual or requires a robotic vehicle. In the latter case, it is relatively a heavy and costly solution. Generally, the robotic vehicle follows a guide line or track that contains an electromagnetic radiation emitting material. The electromagnetic radiation can be detected by a photocell sensor. The robotic vehicle is controlled by a radio frequency communication link. The radio frequency signals are serial in nature, slow in the amount of information transmitted, and may be subject to electromagnetic interferences from the other equipments used in the factory.

Finally, for a complete disclosure, note that the problem of permanent and efficient identification of the SMIF boxes has also been addressed in the SMIF solutions, for example in WO-A-87/03979 (Ref. D9) still assigned to ASYST Technologies Inc. But, according to the SWT approach, and for many reasons, it is highly desirable now, to have the host computer of the Floor Computer System (FCS) permanently tracking each wafer individually for appropriate processing thereof instead of following a number of wafers contained in a cassette as practiced pursuant to the prior SMIF solutions.

As apparent from the above statements, the implementation of the proposed ultimate SMIF solution leads to many deficiencies and inherent limitations. As a result, there is ever a primary need for an innovative solution much more effective for totally eliminating wafer contamination, globally less complex and better adapted to the SWT approach and to the requirements of the CFM concept in the CIM environment.

Applicant's inventors have thus conceived and developed a new manufacturing concept. The essential feature of the base SMIF concept is maintained, i.e. providing a clean enclosure with a still gaseous ambient to protect the wafers (and thus eliminate the need of ultra clean rooms). Two specific features of the improved SMIF concept are also included therein: the broad idea of having a protective liner and that the canopy interior space can be pressurized to match the improved SMIF box interior space pressure. The new concept is basically described by the following key words: Contamination-free, global Automation, and Single workpiece/wafer Treatment. The new concept will be thus referred to below by the acronym COAST.

As a matter of fact, the COAST concept significantly departs from the said ultimate SMIF solution on at least three points. Firstly, the main objective is no longer to develop improved wafer gas cleaning techniques (as described in Ref. U.S. Pat. No. 4,724,874) but instead, to eliminate any potential risk of wafer contamination including both chemical and particulate contaminations. The objective is contamination-free workpiece fabrication. Secondly, it aims to reduce human intervention to a minimum. To that end, all the intervening elements are designed for being fully adapted to a global automation concept. Thirdly, it is essentially based upon the SWT approach, which appears to be the future of the semiconductor wafer processing.

BRIEF SUMMARY

According to the COAST concept, a single wafer is thus stored, transported, and handled before and after processing while it is permanently surrounded by a protective gaseous environment consisting of an ultra pure neutral gas having a positive differential pressure with the outside ambient, for total isolation therewith. There is no isolation breakdown at any time during the whole wafer processing step sequence. Because, this environment is quasi still, the COAST concept is therefore broadly in compliance with the still air approach of the base SMIF concept but it necessitates generation and preservation of this pressurized protective neutral gaseous environment.

Obviously, the COAST concept aims to comply with the Continuous Flow Manufacturing concept in a Computer Integrated Manufacturing environment, that is of paramount importance in the present and future of advanced semiconductor device manufacturing.

The COAST concept is articulated around three basic innovative elements. First, a family of pressurized sealable transportable containers which store a single silicon wafer in a pressurized protective gaseous environment. Second, a family of pressurized interface apparatus adapted to said containers. The interface apparatus performs the automatic wafer transfer operation between the container and the processing equipment (associated to said interface apparatus), without breaking the said protective gaseous environment. Third, a family of dispatching apparatus with a gas distribution system adapted to handle and store a plurality of such containers during the processing idle times while permanently maintaining said protective gaseous environment therein. These three innovative base elements have been especially designed for use with conventional conveyors and for total compatibility with an information handling system to comply with the above mentioned CFM concept in a CIM environment. Consequently, these elements, when integrated with a standard computer system and conventional conveyors including intra-bay and extra-bay sections, result in a plurality of fully automated and computerized conveyor based manufacturing lines that have outstanding flexibility and modularity advantages. Essential features of said basic innovative elements will be described below.

1. The containers

According to the COAST concept, the novel pressurized sealable transportable container basically includes a box-shaped cassette reservoir provided with an access opening normally tightly closed by releasable door means for hermetic sealing and containing therein an adequate quantity of pressurized ultra-pure neutral gas in its interior space. In the steady state (container door is closed), the pressure which prevails within the container referred to as Pcont, has a first or nominal value p to develop a small positive differential pressure $\Delta p$ (typically $\Delta p = 5000$ Pa) with respect to the outside ambient. The nominal pressure p must be high enough to prevent ingress of contaminants within the container interior space but not too high, an excess of pressure could cause in particular undesired opening of the said door means. This gas is supplied by a compressed ultra pure neutral gas supply installation through gas injection valve means (including a high efficiency filter). Unlike the ultimate SMIF solution which requires huge quantity of gas to supply the canopy environment, the present container thus encloses only a limited quantity of it. The container of the COAST concept is made as hermetic as possible. However there is admittedly some gas leakage during storage and transportation. Moreover, there are also some gas losses during the transfer operations mentioned above.

In a preferred embodiment, the cassette reservoir includes a drilled inner wall that demarcates two regions within said container interior space: a first region in relationship with said gas injection valve means to form the reservoir properly said and a second region or receptacle adapted to receive either a wafer or preferably a wafer holder. The holder is provided with a transfer opening enclosing a single wafer and is adapted to be inserted in and removed from and from the said receptacle through the said access opening at the beginning and at the end of the wafer processing step sequence. On the other hand, the holder includes a casing provided with minute via-holes that are designed, so that the gas flowing from the reservoir into the holder interior space does not so easily penetrate therein. The holder includes means for softly but firmly maintaining the wafer therein. The holder which further plays both the roles of the liner and cassette of the ultimate SMIF solution (U.S. Pat. No. 4,724,874) is preferably made of a transparent and non-contaminating material such as a plastic or pure $SiO_2$ (quartz). It is either disposable or cleanable. For example, if it is made of quartz, it can be cleaned for re-use. Likewise, in a preferred embodiment, the cassette reservoir is preferably made of a transparent and non-contaminating material such as a plastic or if made of an opaque material such as stainless steel, it is provided with a transparent window so that identification data attached to the wafer can be directly and automatically read by an appropriate reader, e.g. by a bar code reader.

Said door means preferably consists of a pivoting cover provided with sealing means, typically an O-ring surrounding the access opening and closing means, typically drawback springs, for tight and hermetic closure. Preferably, it further includes release means adapted to cooperate with corresponding means provided to the front face of the pressurized interface apparatus for automatic opening of the said pivoting cover.

Whenever necessary, in a departure from the SWT approach, the holder can be readily adapted to receive a plurality of wafers instead of a single wafer to implement a multiple wafer container version. In turn, the container receptacle can also be readily adapted to receive different types of multiple wafer holders, including commercially available wafer holders or standard cassettes.

Moreover, the pressurized sealable transportable container overall design is adapted to be transported by conventional conveyors.

Finally, Applicant inventors' solution to the general problem of storing and transporting a wafer to be treated in a series of processing equipments, therefore consists in a relatively simple container where any source of contamination is prevented, because the wafer is permanently enclosed in a pressurized protective ultra pure neutral gaseous environment. The container is stackable and perfectly suited to the Single Wafer Treatment approach (but easily adaptable to multiple wafer batch processing if so desired). Basically, the COAST concept remains in line with the "closed type" enclosure approach with a still gas environment therein. However, unlike the base SMIF solution, the stagnant gas consisting of air or an inert gas is no longer at the atmospheric pressure, but is necessarily a compressed ultra pure neutral gas that is permanently maintained under pressure with respect to the outside ambient. As a result, any ingress of dirt particles and chemical contaminants into the container from the said outside ambient, is constantly prevented. Air and some inert gases such as $CO_2$ react with the silicon wafer surface and produce an undesired oxide layer, that has to be subsequently removed.

2. The pressurized interface apparatus

Still according to the COAST concept, in a first preferred embodiment limited to a typical single IN/-OUT section version, the novel pressurized interface apparatus essentially includes a box-shaped housing provided with two openings: a port window closed by controlled lid means located in the front face of the housing and a communication gate opposite to said port window defining thereby a port zone or loadlock chamber therebetween. The communication gate permits communication between the interface apparatus interior space and the processing equipment chamber either directly or indirectly. Depending upon the application or the specific treatment step performed in the chamber, the communication gate may also be provided with lid means. The interface interior space also contains a pressurized protective gaseous environment generated either directly by a connection to the said gas supply installation via specific gas injection valve means inserted in the interface housing or indirectly, by the processing equipment itself, depending upon the application. Normally, in the steady state, the interface interior space is at the same nominal pressure p that the container interior space to ensure the positive differential pressure $\Delta p$ mentioned above is obtained. A transfer robot is mounted inside the interface interior space whose role is to grasp the wafer stored in the container and to transfer it in the processing equipment for being treated. The pressurized interface apparatus further includes a container receiving zone adjacent to the housing front face having a rest zone and an active zone. It still further includes actuator means provided with gas feeding means, so that during the waiting time the container remains in the rest zone of the pressurized interface apparatus, the container is firmly held and permanently connected to the said compressed ultra pure neutral gas supply installation. Actuator means are intended to grip the container and move it from the rest zone to the active zone in order to have the container sealably mating with the port window before wafer unloading takes place.

The method of unloading the wafer from the container to transfer it into the processing equipment reads as follows.

Assuming the container is in the waiting state, i.e. firmly maintained by the actuator means in the rest zone in front of the port window and supplied with gas. The interface interior space is pressurized at the said nominal pressure p. Once the host computer commands a transfer operation, the lid closing the port window is first opened. The interface interior space would be protected from contamination thanks the gas stream which instantly would flow outwardly as a result of the positive differential pressure existing therein. However, during this step of lid opening, a second pressure P is momentarily applied to the interface interior space to ensure an adequate flow rate V (typically $V = 0.4$ m/s) of the gas stream flowing outwardly. This second pressure or blower pressure aims to ensure an efficient protective gas curtain for still better protection of the interface interior space when the lid is being opened. Then, the container is pulled by the actuator means towards to opened port window. As far as it moves closer and closer, the container door is progressively released and, for the same reasons, the enclosed wafer is not contaminated. Likewise, during this step of door release, the said blower pressure P is momentarily applied to the container interior space. As a matter of fact, the gas stream which flows outwardly from the container and from the port zone forms an efficient protective gas curtain which hinders any ingress of pollutants in the two interior spaces. The actuator means moves the container until its access opening is sealably mating against the front face of the housing, forming thereby an hermetic sealing therewith. The O-ring surrounding the access opening mentioned above is useful in that respect. This terminates the process of engaging the container. The container now lies in the active zone and is in the ready state. Because, the access opening is mating with the port window, the two interior spaces are merged in a common interior space maintained at the nominal pressure p, unless specific requirements from the processing equipment suggests otherwise. Finally, the wafer may be then safely unloaded from the container and loaded into the processing equipment chamber for subsequent treatment.

Of course, the reciprocal steps must be undertaken to load the wafer in the container after treatment. The process now includes to disengage the container and move it from the active zone to the rest one where it is clamped and fed with gas. The transfer IN (unload) and transfer OUT (load) operations are thus performed without any wafer contamination. It can be noticed that during the short duration the container door is opened, only a very small gas stream flows over the wafer, because the presence of said minute via-holes. In that respect, the COAST concept may be considered as still in accordance with the base SMIF concept of a still gaseous environment.

In this preferred embodiment, the front face of the novel pressurized interface apparatus is provided with means that cooperates with the door means for automatic opening thereof.

In another embodiment, the novel interface apparatus may be readily adapted to the multiple wafer containers mentioned above. As a consequence, it can be further adapted to the transfer of a wafer between a single wafer container and a multiple wafer container and vice versa.

In a further another preferred embodiment, the novel pressurized interface apparatus consists of a dual section version which includes two identical sections to the one described above, now referred to as the IN and OUT sections. But, in this case, a container transfer device is required therebetween.

Finally, whichever its version, the novel pressurized interface apparatus is adapted to operate with conventional conveyors under full control of a computer system.

3. The dispatching apparatus with a gas distribution system

Still further according to the said COAST concept, there is proposed a novel dispatching apparatus with a gas distribution system that stores the said pressurized sealable transportable containers in support stations, in particular during the idle period of the wafer processing. To that end, it is adapted to permanently connect the containers to the said gas supply installation. Moreover, it has an handling function of transferring the containers between the said support stations and the conveyors.

The dispatching apparatus essentially comprises two parts: a tower-shaped tubular frame having tubes on which support stations or bins are affixed and a 3 dimension automatic handler including an elevator (for the Z or vertical movement) and a handling robot (for angular movement and extension in a horizontal plane) provided with gripping means adapted to the container design.

It is a major feature of the COAST concept, that each of the said support stations be provided with gas injector means adapted to said container gas injection valve means and connected to the said compressed ultra pure neutral gas supply installation.

The dispatching apparatus is structurally adapted to be operative with conventional conveyors, and of course, is also fully controlled by the said computer system.

A typical transfer operation reads as follows. For instance, once the computer system decides to transfer a container moving onto a conveyor to a selected support station of the dispatching apparatus for storage, the automatic handler is first activated to grasp the container with its gripping means. Then, the container is adequately moved in the 3 dimensions to be laid down in the said selected support station. It is accurately centered and locked therein due to appropriate centering and positioning means. Next, the gas injector means are inserted in the container gas injection valve means and the gripping means are then released. The container interior space is maintained at said nominal pressure p. The handler is now ready for another transfer operation.

4. The fully automated and computerized conveyor based manufacturing lines

As apparent from the above, the three disclosed innovative base elements have been specifically designed for being adapted to operate with conventional conveyors under control of a standard computer system, to benefit of the significant advantages that result of this type of convenient transportation system. Among these, one may cite reliability, simplicity, identification data (e.g. bar code) reader adaptability, low cost, and easy total mechanical automation.

Therefore, still further according to the said COAST concept, there is provided a plurality of fully automated and computerized manufacturing lines that comply with the CFM concept in a CIM environment. As mentioned above, global automation is one essential feature of the COAST concept. These manufacturing lines may be organized in a great variety of architectures that all have the same outstanding advantages in terms of flexibility and modularity.

Typically, the novel dispatching apparatus is adapted to operate with conventional conveyors, and in particular is readily associated to the standard by-pass station construction for transfer therebetween. Obviously, the dispatching apparatus has a key role to play in the said novel manufacturing lines for an efficient implementation of the CFM concept.

In a preferred embodiment, said manufacturing line architecture includes:

a) pressurized sealable transportable containers of the type described above, i.e. basically consisting of a box-shaped housing provided with an access opening sealed with releasable door means and gas injection valve means enclosing a wafer for subsequent treatment in a plurality of processing equipments;

b) conveyor transportation means;

c) gas supply installation means comprising a compressed ultra pure neutral gas supply source and a delivery system;

d) dispatching apparatus means with a gas distribution system of the type described above, i.e. basically comprising:

storage means for storing the containers consisting of a frame supporting a number of support stations or bins each provided with gas injector means connected to said gas supply installation means;

handling means for transferring said containers between said bins and said conveyor transportation means;

e) interface apparatus means adapted to receive said containers and transfer the wafer enclosed therein into one of said processing equipments of the type described above i.e. basically comprising:

container receiving means for receiving (sending) a container from (to) said conveyor transportation means;

a pressurized port zone or loadlock chamber with releasable lid means to interface said container receiving means with said processing equipment and to that end, including transfer robot means for transferring the wafer between the container and the processing equipment.

actuating/gas feeding means for moving/gas supplying the container when placed on the container receiving means;

f) computer means for overall control of said conveyor transportation means, dispatching apparatus means, gas supply installation means, interface apparatus means and said processing equipments.

OBJECTS OF THE INVENTION

It is a primary object of the present invention to provide a dispatching apparatus with a gas supply distribution system for handling and storing pressurized sealable transportable containers.

It is another object of the present invention to provide a dispatching apparatus including a stocker consisting of frame supporting bins for storing the said containers wherein said bins are designed for connecting said containers to a compressed ultra pure neutral gas supply installation to maintain adequate pressurization therein.

It is another object of the present invention to provide a dispatching apparatus whose design is adapted for integration with conventional conveyors.

It is another object of the present invention to provide a dispatching apparatus adapted to global automation.

It is still another object of the present invention to provide a dispatching apparatus which fully complies with the Continuous Flow Manufacturing concept in a Computer Integrated Manufacturing environment.

BRIEF DESCRIPTION OF THE DRAWINGS

FIGS. 2A–2C show a perspective isometric view of the base housing with no hidden lines removed detailing its construction structure, and a cut-away view of the housing of FIG. 2A along line a—a, and an enlarged portion of the housing of FIG. 2A.

FIG. 3 shows a schematic perspective view of the cassette-reservoir comprised of the housing of FIG. 2A provided with a pivoting cover and gas injection valve means.

FIG. 13 shows a variant of the pressurized interface apparatus of FIG. 11 once adapted to transfer a wafer from a single wafer container to a multiple wafer container.

DETAILED DESCRIPTION OF THE PREFERRED EMBODIMENTS

INTRODUCTION

Figure 1B:
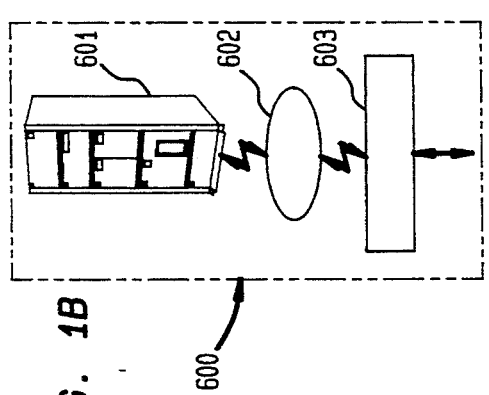
FIGS. 1A–C show a schematic perspective view of the three innovative base elements according to the COAST concept: the pressurized sealable transportable containers, the pressurized interface apparatus and the dispatching apparatus with a gas distribution system once integrated with a standard intelligent flexible intra-bay/extra-bay conveyor system and a Floor Computer System (FCS).
Figure 1C:
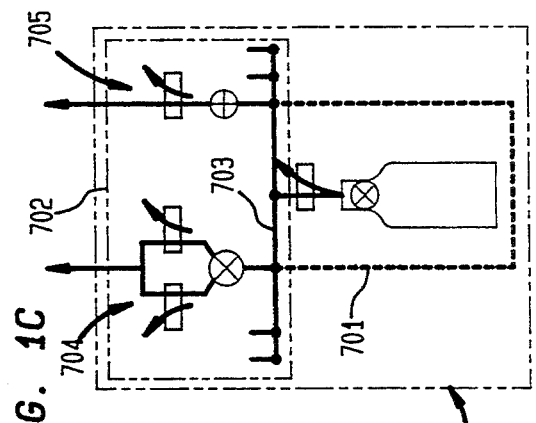
Figure 1A:
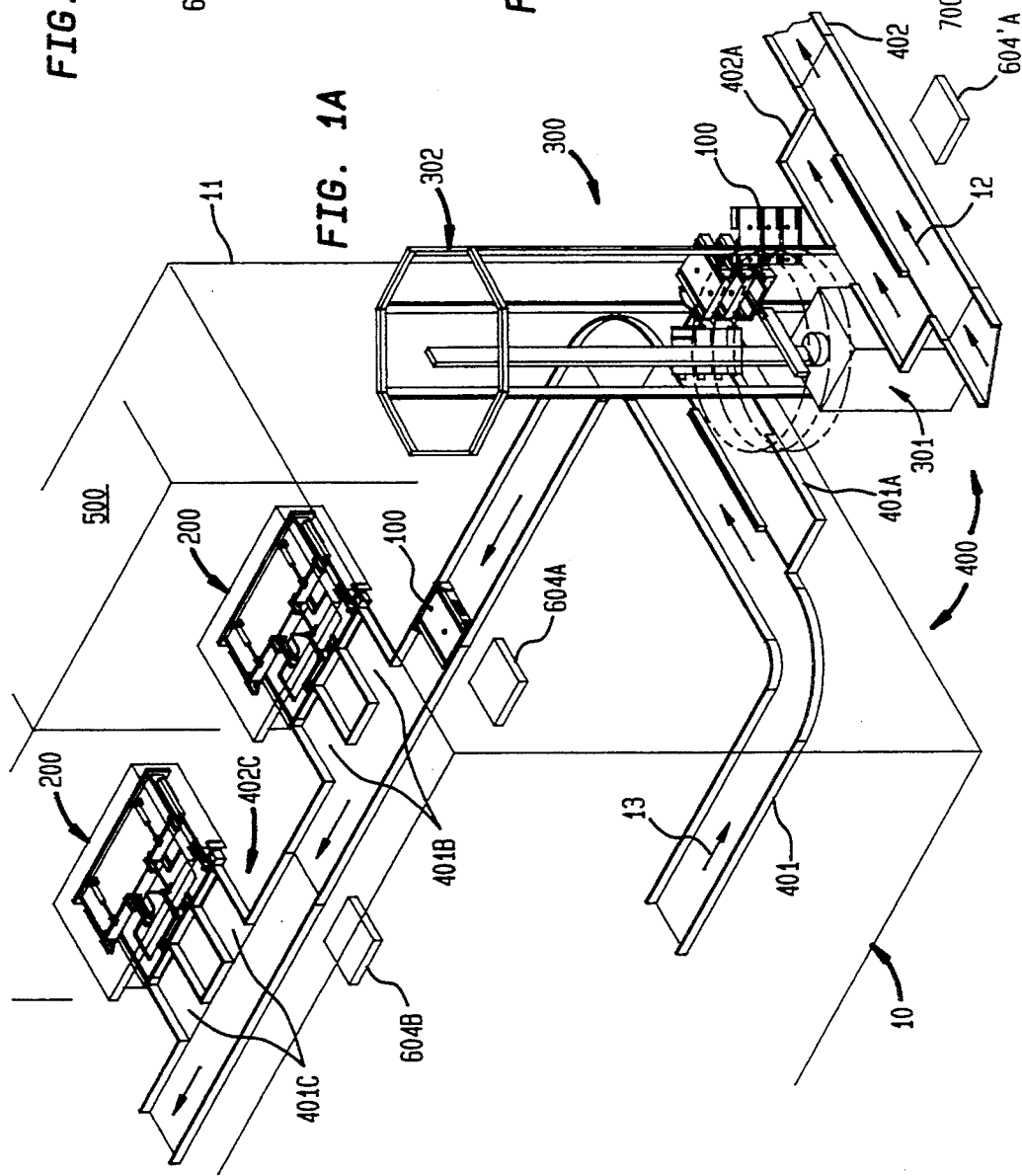

FIG. 1 shows a schematic perspective view of a partial installation dedicated to a determined process area 10, illustrating the three innovative base elements of the COAST concept: the container, the pressurized interface apparatus and the dispatching apparatus. A plurality of containers 100, two interface apparatus 200, and one dispatching apparatus 300 have been illustrated in FIG. 1. A flexible intra-bay belt conveyor system 401 ensures container transportation to and from processing equipments 500 (they can be different) within said process area 10. Conventional computer system 600 comprises a general purpose host computer or work station 601, a Local Area Network (LAN) 602 and a micro-controller 603 dedicated to this process area 10 for overall operation control. Such a computer system 600 may be referred to as the Floor Computer System (FCS). The micro-controller 603 interfaces with local intelligence distributed in the processing equipment, the dispatching system 300, . . . etc. In the following description, the leading role is assigned to the host computer 601, however it must be understood that some intelligence is delegated to the micro-controller 603. A plurality of bar code readers generically referenced 604 have also been represented in FIG. 1. Finally, a gas supply installation 700 including a compressed ultra pure neutral gas supply source referenced 701 and a delivery block 702 comprising manifold 703, a network of high quality stainless pipes with electropolish interior surface finish, and an adequate number of electro-valves and pressure regulators/controllers for controlled gas flow delivery is also illustrated in FIG. 1. Outlets 704 allow delivery of three pressure values: 0, p, and P, while outlets 705 allow only two pressure values 0 and p. These values will be explicated later. Usage of ultra pure neutral gas totally avoids wafer chemical contamination. Note that, for sake of simplicity, the gas supply distribution network and the electrical wire network that are required for said overall operation control have not been represented in FIG. 1. As such, FIG. 1 may be considered showing a partial schematic view of a fully automated and computerized conveyor based manufacturing line, typically for semiconductor wafer processing. In addition, for servicing process area 10, an extra-bay conveyor 402 with its by-pass station 402A is added. Conveyors 401 and 402 are intra-bay and extra-bay elements of a conveyor transportation system 400.

Optionally, the interface apparatus 200, the intra-bay conveyor 401 and the processing equipments 500 may be fitted in umbrella 11 for coarse dust protection. Note also, that a portable additional active umbrella may be used atop a processing equipment when it is required to open the chamber for maintenance or set-up adjustments purposes. The active umbrella produces the conditions adequate for a clean environment within said chamber.

In one preferred embodiment of the COAST concept, the container first includes a box-shaped housing provided with an opening on the front face whose access is controlled by a pivoting cover which, at rest, applies firmly against it for hermetic sealing. It further includes gas injection valve means to be connected to the compressed ultra-pure neutral gas supply installation, defining thereby a pressurized interior space therein. As such, the housing will be referred to as the cassette reservoir. The cassette reservoir includes a drilled inner wall that demarcates two regions: a first region connected to said gas injection valve means to form the reservoir properly said and a second region or receptacle adapted to receive a holder. The role of the drilled inner wall is to permit easy gas circulation and communication between the reservoir and the receptacle. The wafer holder is an enclosure provided with a transfer opening on its front face defining thereby an interior space. The wafer is inserted in the said holder interior space through the said transfer opening where it is maintained by support means. The wafer holder rear face is provided with minute via-holes so that the wafer enclosed therein is surrounded by a gaseous environment of said neutral gas having a positive differential pressure with respect to the external ambient. The container interior space has a static nominal pressure p higher than the outside ambient pressure, e.g. the atmospheric pressure. Typically, the nominal pressure p is approximately 5000 Pa above the pressure of the outside ambient. A perforated rim encompasses the transfer opening and creates a protective gas curtain at the container pivoting cover opening.

Still in this preferred embodiment, the pressurized interface apparatus basically comprises two identical input (IN) and output (OUT) sections for increased throughput. The IN section first comprises a container receiving zone for receiving the container including a rest zone and an active zone. In the rest zone the container is firmly secured and connected to an outlet 704 of said gas supply installation 700 so long as it remains in the waiting state to maintain said nominal pressure mentioned above. It further comprises a port zone consisting of a housing provided with a port window closed by a port lid on the side facing the container and a communication gate in direct relationship with the chamber of a processing equipment on the opposite side. A transfer robot mounted in the port zone interior space permits the transfer of the wafer between the container and the input port (pre-process station) of the processing equipment. A similar construction applies to the OUT section. In a typical embodiment, the IN and OUT sections have a common interior space. The common interior space is pressurized either via gas injection valve means connected to the said ultra pure neutral gas supply installation or by the chamber ambient if adequate. A container transfer device moves the empty container between the rest zones of the IN and OUT sections. The IN section is used to transfer a wafer from the container into the processing equipment through the port zone. The OUT section is used for the reverse movement.

Still further in this preferred embodiment, the dispatching apparatus with a gas distribution system first comprises means for handling and storing the containers. To that end, it includes an automatic handler comprising an elevator fixed on a rotating head and a handling robot provided with gripping means to grasp the containers. It further includes support means affixed to a tower-shaped frame of a vertical stocker to support the containers during storage. According to the COAST concept, said support means are provided with gas injector means, so that during the periods the containers are stored, a permanent connection with the said ultra-pure neutral gas supply installation 700 is secured.

Still further in this preferred embodiment, the conveyor transport system includes conventional flexible belt conveyors designed with standard by-pass stations at the close proximity of said interface and dispatching apparatus.

Now turning again to FIG. 1, there is illustrated one pressurized sealable transportable container referenced 100 being transported by intra-bay conveyor 401 and a plurality of others stored in the dispatching apparatus 300. The role of the latter is therefore to store a multiplicity of containers 100 during the processing idle times (if any), i.e. the periods where a wafer languishes idle between two successive processing steps e.g. when the appropriate processing equipment 500 is not immediately available.

According to the COAST concept, dispatching apparatus 300 has the key role of regulating the container continuous flow during wafer processing. The dispatching apparatus 300 basically comprises an automatic handler 301 and a vertical stocker 302. As a matter of fact, in full accordance with the principles of the COAST concept, the vertical stocker 302 is adapted to the container design, and in particular it allows direct connection thereof to the said ultra-pure neutral gas supply installation 700. The gas injection valve means of each container 100 stored in the stocker, is permanently connected to an outlet 705 for gas rejuvenation. The automatic handler 301 basically comprises a handling robot having an extending arm provided with gripping means. The handling robot is affixed on an elevator for vertical movement and is able to rotate. The vertical stocker comprises a tower-shaped frame having tubes supporting a plurality of support stations or bins, each being provided with gas injector means connected to said gas supply installation 700. As a result, during the processing idle times mentioned above, an adequate pressure of said neutral gas is maintained in the interior space of the container enclosing the wafer to be processed. The host computer 601, according to the information stored therein, decides which container 100 is to be transferred and which specific processing equipment 500 is to receive it, depending on urgency of processing and availability of equipments. Upon host computer control, dispatching apparatus 300 transfers the specified container 100 from stocker 302, to the input/output port of by-pass station 401A of intra-bay flexible conveyor 401 thanks to the handling robot. Conveyors 401 and 402 are conventional flexible air track or belt conveyors, such as for example, models JETSTREAM or CARRYLINE, that are commercially available from NEU TRANS SYSTEM, Marcy en Bareuil, France. Any other type of conveyors may be used as well. Such conveyors are well adapted to be fully automated under computer control, and as such, are often referred to as intelligent conveyors. Two different types of by-pass stations have been illustrated in FIG. 1. For example, by-pass station 401A comprises a single input/output port formed by an indentation in the central portion thereof, while by-pass station 401B consists of two separate input and output ports. Necessary container direction changes result from adaptation of a number of levers, piston, independently controlled secondary belts, ... that are not shown in FIG. 1, but are trivial for the man skilled in the art. Location and processing stage of any container, and therefore the condition of the corresponding wafer enclosed therein, has to be permanently determined under the control of the host computer 601. This can be simply achieved thanks, for instance, to a label bearing a bar code that is stuck on a face of the container 100, in combination with the bar code readers mentioned above, that are judiciously located along the conveyors. Any other type of contactless identification systems would be appropriate as well. For instance, the full automatic follow-up system referenced 0F73/EOR71, available from BALOGH SA 75010 Paris, France.

A typical dispatching apparatus operation reads as follows. Let us assume that, within the flux of incoming containers 100 transported by the main belt conveyor 402 in the direction of arrow 12, the host computer 601 decides to transfer a specified container 100 into the by-pass station 402A. When this container reaches the input port of by-pass station 402A, a tilt lever or a piston (not shown) pushes this container therein and the container is moved by the secondary belt of by-pass station 402A, until it reaches the central input/output port zone thereof where a lever stops it. Next, the handling robot of handler 301 grasps the container and places it in an unoccupied support station of the vertical stocker 302. It is immediately connected to the said gas supply installation via said gas injector means.

Assuming now this container 100 stored in vertical stocker 302 has to be processed in a processing equipment 500 through corresponding interface apparatus 200. The container is first released from the said gas injector means. Then, the handling robot sizes it and moves it in the central input/output port zone of by-pass station 401A of intra-bay conveyor 401 where it is laid down. Next, a lever (not shown) pushes the container 100 towards the main belt of conveyor 401. The container is then transported in the direction given by arrows 13 (as illustrated by one container 100 in FIG. 1) until it reaches the input port of by-pass station 401B in front of the corresponding interface apparatus 200. The container is then pushed into said input port still using a tilt lever (not shown), then moved towards the IN section rest zone of pressurized interface apparatus 200. As far as the container arrives in the IN section rest zone of interface apparatus 200, it is gripped by a pair of controlled clamping actuator devices, and simultaneously connected to an outlet 704 of said ultra-pure neutral gas supply installation 700. The container remains in the rest zone of the IN section until processing equipment 500 is available under host computer control. During this period, the nominal pressure p is maintained within the container interior space. In normal operating conditions, the waiting time in the said rest zone is quite limited. Following host computer request, the container is moved towards the IN section port zone.

The interface apparatus port lid is first raised and, at the end of the movement, the pivoting cover of the container (which is U-shaped) is opened and the lateral sides of the cover are slidably engaged into slots formed in the interface apparatus housing. During this step, the blower pressure P is momentarily and successively applied to the two interior spaces to generate an efficient gas curtain to prevent any intrusion of contaminants therein. At the end of this step, the container access opening is hermetically applied to the IN section port window for an hermetic seal therebetween, ensuring thereby a total continuity between the two internal spaces. According to COAST concept, because internal space of the container and the one of the interface apparatus are both pressurized, no external contamination may affect the wafer during this whole preliminary step. When desired, the wafer is unloaded from the container by the transfer robot and transferred to the processing equipment 500, typically to the pre-process (or loading) station thereof, then treated in the processing equipment chamber. At the end of the processing, the wafer is available in the post-process (or unloading) station of the processing equipment 500, then transferred again in the port zone of the interface apparatus for subsequent loading in the container. During wafer processing, the empty container is transferred from the IN section to the OUT section. The same procedure as described above is employed thanks to a second pair of controlled clamping actuator devices until the container is applied against the OUT section port window, still forming an hermetic closure therewith. Another transfer robot picks up the wafer from the processing equipment post-process station, and transfers it into the container. Now the said second pair of controlled clamping actuator devices move back the container to the rest zone of the OUT section still without breaking the gas isolation for the same reasons as mentioned above. The port lid is closed, in turn, the container pivoting cover (due to drawback springs) is automatically closed, and further locked, hermetically sealing thereby the container interior space. The wafer enclosed therein is again encompassed by a pressurized protective gaseous environment. Finally, upon request made by the host computer 601, container 100 is moved back to the output port of by-pass station 401B and pushed onto conveyor 401 for further processing or for being stocked again in vertical stocker 302.

THE CONTAINERS

Single wafer containers (SWC)

Description of the preferred embodiment of the pressurized sealable transportable container of the COAST concept will be made in the single wafer application context in conjunction with FIGS. 2 to 7.

FIG. 2 comprises FIGS. 2A and 2B. FIG. 2A is an isometric view with no hidden lines removed of the base component of container 100 referred to as frame 101 which details its construction. FIG. 2B shows frame 101 of FIG. 2A in a cut-away view along line aa to illustrate the lower half thereof.

Now turning to FIG. 2, frame 101 essentially consists of a substantially parallelepipedic or box-shaped housing 102 with bottom, top and four lateral faces including front and rear faces, fabricated for instance in a molded plastic material to form a solid part which can be integral or not. Housing 102, defines an interior space 103 (not illustrated) with a slot-shaped access opening 104 on the front face and an aperture 105 (wherein a highly efficient filter and a quick seal connect gas injection valve are to be subsequently inserted) on a lateral face. Access opening size and shape are determined by the workpiece to be processed. Preferably, housing 102 is provided with a drilled inner wall 106 which laterally defines two regions within said internal space 103. Inner wall 106 has holes 107 made therein. Number, location, and size thereof are still defined according to the workpiece to be processed pursuant to rules detailed hereafter. Role of holes 107 is to ensure adequate gas flow circulation between reservoir 103A and receptacle 103B. FIG. 2 shows a typical design with two 1 cm diameter holes close to the middle of the inner wall lateral sides, deemed to be appropriate for a 20 cm diameter silicon wafer application. First region 103A, adjacent to aperture 105, delineates the reservoir properly said. Second region 103B, accessible through access opening 104, will be the receptacle to lodge the wafer or preferably a wafer holder. There is a number of advantages to use the wafer holder of the COAST concept as it will be explained later. The internal face of the housing bottom is provided with wafer holder positioning supports referenced 108a, b and c. Likewise, the internal face of the housing top is provided with corresponding supports referenced 108a', b' and c'. Within region 103B, inner wall 106 is provided with wafer holder positioning stoppers referenced 109a, b and c and further includes wafer holder clamping devices 110a and b on the two opposite lateral sides of inner wall 106 at the vicinity of access opening 104. Each housing external lateral side is provided with a blind hole to allow frame 101 to be firmly gripped by a retractable finger mounted on an actuator device. As shown in FIG. 2, preferably blind hole 111A is made in a recess 112A. Similar construction applies to the other lateral side with blind hole 111B made in recess 112B. A metal insert may be inserted in blind holes 112A and B to limit wear. Once retractable fingers have been engaged in corresponding blind holes 111A and 111B, frame 101 may be safely and accurately moved. Recess profile can be designed so that the recess may be used as a handle for easy hand manipulation or to receive a clip for assembling two (or more) frames. Housing 102 has different external positioning/centering means along the three X, Y and Z axes. First of all, as illustrated in FIG. 2, the external face of housing bottom has two groove-shaped positioning guides 113A and B crossing its entire surface. Reciprocally, the external face of the housing top is correspondingly provided with two rail-shaped positioning guides 114A and B. Moreover, the external face of the housing bottom is provided with two centering holes 115A and B that are useful either for moving the frame or for its accurate positioning/centering, for instance, in the support station of the stocker 302 whose bottom is typically provided with corresponding centering pins or buttons. Moreover, when the said buttons are properly engaged in said holes, the container 100 is perfectly and securely positioned. The external face of the housing top is also provided with corresponding centering pins 116A and B, designed to allow easy stacking of frame 101 and an accurate positioning with respect to the handling robot of automatic handler 301. Optionally, on its rear face, housing 102 includes an aperture 117 to receive an observation plug for monitoring or for visual inspection as explained below. Housing 102 is designed to receive door means (not shown) to close hermetically access opening 104. In the described preferred embodiment, as illustrated later, said door means is typically a pivoting cover. To that end, housing 102 has bored elements 118A and B adapted to receive the pivots of the said pivoting cover and drawback springs for housing hermetic closure (note that, the housing bottom has corresponding recesses 119A and B still for stacking purposes). Optionally, housing 102 is further provided with two cover locking dimples 120A and B to ensure total lock-up when the pivoting cover will be applied against access opening 104 for sealing, as it will be described later. Obviously, the pivoting cover must not be released even in case the container is submitted to shocks or vibrations during transportation. The drawback springs mentioned above are designed to fulfill this objective. Housing 102 may be constructed in a single molded part to be integral or assembled by different constitutive parts using standard bonding or fastening techniques. Simple internal construction with minimum asperities is recommended to facilitate its cleaning.

The detailed construction of a portion A of housing 102 at the vicinity of opening 104 is shown in the enlarged view of FIG. 2. The front face of housing 102 includes a flange 121, whose role will be described later in conjunction with FIG. 4. Finally, an O-ring 122 is mounted in a groove at the periphery of opening 104 to cooperate with the pivoting cover (and the front face of the interface apparatus housing as explained later on) to make an hermetic seal therewith. Other sealing means such as the VATON seal sold by VAT Inc. which is directly vulcanized onto the sealing plate, for instance, the housing front face, has outstanding qualities in terms of tightness, cleanliness and lasting. Alternatively, the O-ring may be mounted at the periphery of the housing front face. This terminates the description of frame 101 which comprises housing 102 provided with O-ring 122.

FIG. 3 shows the cassette reservoir 123 still according to the said first preferred embodiment. It includes frame 101 as described above, to which an appropriate releasable door means is adapted. Still according to this preferred embodiment, said door means is an essential part of the cassette reservoir 123. Said door means is for closing the access opening 104 and sealing the cavity or housing interior space from the outside ambient for isolation therewith. Typically, pivoting cover 124 is U-shaped with lateral sides 124A and B and front part 124C. Lateral side 124A is provided with a hole 125A which cooperates with bored element 118A and pin 126A or the like. Similar construction applies to lateral side 124B in that respect to make cover 124 fully pivotable as a result of that pivot assembly. As it will be illustrated later on, the U-shaped cover 124 will play the role of a tunnel once it is set horizontal, i.e. when it approaches the interface port window. The pivot assembly further comprises a drawback spring (not shown) associated to each pin 126A and B so that cover front face 124C is normally firmly applied against O-ring 122 for hermetic sealing. Optionally, lateral side 124B also includes a ball detenting device 127B formed in a recess thereof which cooperates with dimple 120B on the lateral side of housing 102 for improved locking-up once cover 124 is firmly secured against opening 104 due to the closing action of the drawback springs mentioned above. Same construction applies to lateral side 124A. Each lateral side, e.g. 124B, is provided with a roller bearing, e.g. 128B, which will be used to automatically lift up the cover 124 when container 100 is applied against the front face of the interface port housing. Cassette reservoir 123 further includes as a second essential part of its construction, gas injection valve means 129 comprising quick connect seal plug 129A (including a non return valve) and a high efficiency filter 129B forming an assembly lodged in aperture 105. The quick connect seal and the high efficiency filter are respectively available from the LEE COMPANY SA Versailles, France and from MILLIPORE Corp. or PALL Corp. Because, ultra pure neutral gas is delivered from a source that is quality certified by the gas manufacturer, no wafer chemical contamination can occur. The role of the filter 129B is to trap undesired particles, for instance, metallic particles, that could be generated when an injector is inserted in the quick connect seal. In summary, cassette reservoir 123 must be understood as the frame 101 provided with pivoting cover 124 and gas injection valve means 129.

Figure 4A:
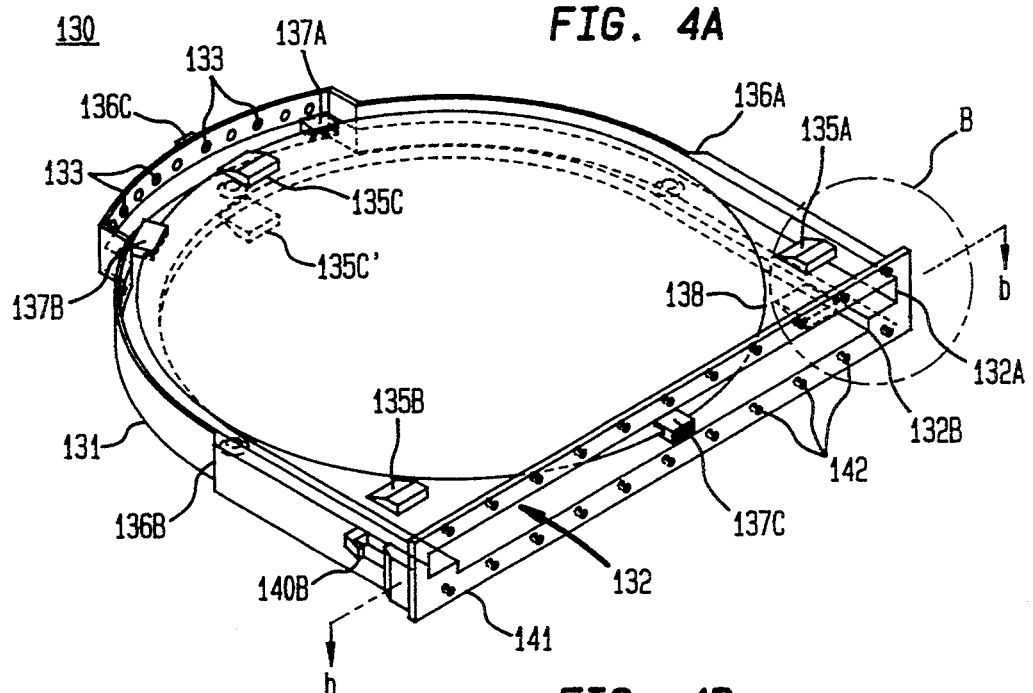
FIGS. 4A–4C show a perspective isometric view with no hidden lines removed of a typical wafer holder enclosing a wafer, a cut-away view of the holder of FIG. 4A along line b—b, and an enlarged view of a portion of the holder of FIG. 4A.
Figure 4B:
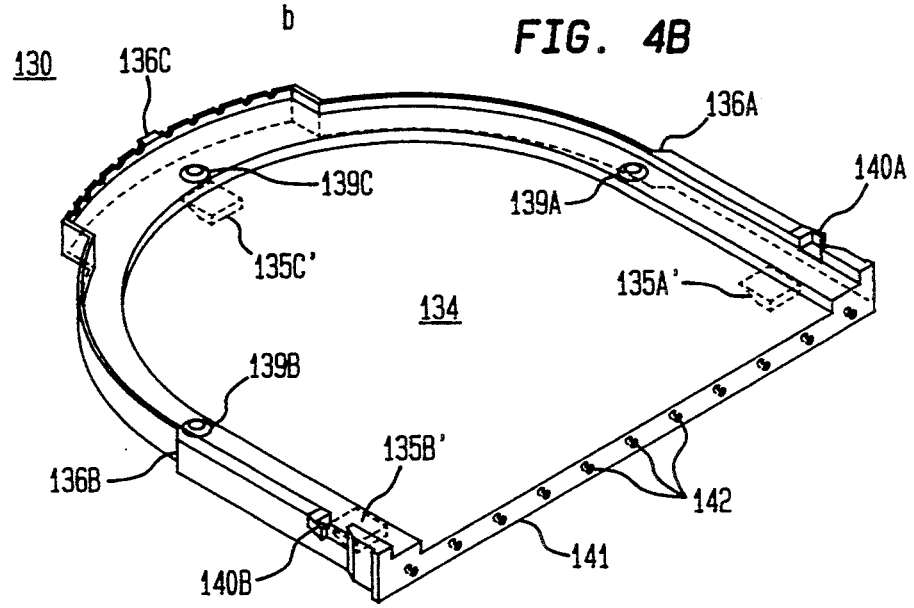
Figure 4C:
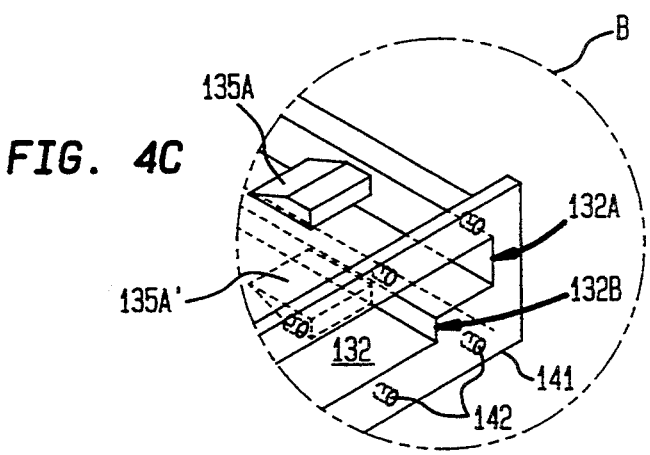

Details of the wafer holder construction will now be illustrated in conjunction with FIG. 4 comprised of FIGS. 4A and 4B. FIG. 4A shows the isometric view with no hidden lines removed of the wafer holder having a silicon wafer enclosed therein still pursuant to the said first preferred embodiment. FIG. 4B shows a cutaway view of the wafer holder of FIG. 4A along line bb to illustrate the lower half thereof. Although theoretically not mandatory (e.g. it is not a requisite if the workpiece is a ceramic substrate) usage of a wafer holder is highly recommended, at least in all advanced semiconductor applications.

Now referring to FIG. 4, wafer holder 130 essentially consists of a casing 131 provided with a slot-shaped transfer opening 132 for wafer insertion/extraction. Casing general shape is designed to broadly fit the receptacle region 103B as defined in the interior space of housing 102 by inner wall 106 (FIG. 2). The rear part of casing 131 which is opposite to transfer opening 132 is provided with minute via-holes 133 for gas communication between receptacle 103B and interior space 134 of casing 131. Via-holes 133 are so designed to cooperate with holes 107 (FIG. 2) to render negligible the likelihood of wafer contamination by particulates not filtered in the high efficiency filter 129B as explained later in more details. The external upper and lower faces of casing 131 comprise each three pads 135a, b and c and 135a', b', c'. Pads 135 cooperate with their respective supports 108 of housing 102 to ensure casing excellent and accurate fitting inside the cassette reservoir receptacle 103B (FIG. 2).

Casing 131 also includes stoppers 136a, b and c which cooperate with respective stoppers 109a, b and c of housing 102 for precise centering of holder 130 into receptacle 103B of cassette reservoir 123. Stopper 109c and 136c are also designed for accurate fitting and to create a small gap between the drilled inner wall 106 and the rear and lateral walls of casing 131 for gas circulation therebetween depending casing contour. As illustrated in FIG. 4A, the internal lateral face of casing 131 is provided with two soft swiveling pads 137a and b. Note that swiveling pad 137c represented in FIG. 4A is in reality affixed on the back face of cover front side 124C (see reference 137C in dotted line in FIG. 3). They all have a limited moving flexibility to facilitate wafer insertion in casing 131 and extraction thereof, as well. The swivelling pads 137 have a typical V-shaped profile to receive the silicon wafer 138. As mentioned above, they are fixed to allow a certain flexibility for example, by a piece of an elastic material. In particular, the use of this elastic material to fix swiveling pad 137c on the internal face of cover 124C is recommended because it improves the secureness of wafer 138 when cover 124 is closed. Support pads 139a, b and c are required for soft wafer support. Swiveling pads and support pads cooperate to impede detrimental particulate generation effects due to shocks and vibrations during the handling and transportation of containers. The swiveling pads 137 can be advantageously made from TEFLON (a trademark of Du Pont). Support pads 139 are molded with the casing body. The swiveling pads are designed to contact the wafer surface only at the periphery of its edge so that the functional chips are not impacted in case of shocks. As a result, the wafer 138 is firmly secured unlike the prior base SMIF solutions. Support pads are in contact with the wafer backside surface. Note that other support pad configurations may be designed as well. Lateral side of casing 131 also includes two resilient tabs 140a and b that engage in clamping devices 110a and b of housing 102 (FIG. 2) to accurately lock the casing 131 into receptacle 103B. Tabs 140a and b are each provided with an ear, so that the wafer holder 130 is extracted from the cassette reservoir 123 at the termination of the wafer processing, by using a declipping gripper introduced thru transfer opening 132. On the casing front side, a rim 141 is provided with a plurality of perforations 142 arranged at the periphery of transfer opening 132, whose role will be explained later. Typical diameter of perforations 142 is approximately in the 1–5 mm range.

Typically, the casing 131 is made from a non-contaminating plastic. Non contaminating materials include thermoplastics, examples of which are vinyl, acrylic or fluoroplastic. Thermoplastics can be conformed by well-known techniques into relatively thin or thick transparent films. A fluoroplastic is a generic name for polytetrafluorethylene and its copolymers. One such well known fluoroplastic is TEFLON (a trade mark of du Pont).

It can be constructed by a single injected piece or by assembling the two upper and lower halves of casing 131 either by gluing or bonding. Due to its simple construction, casing 131 can be efficiently and readily cleaned. However, it may be desirable to have it disposable, i.e. thrown away after each full processing cycle or even in the course thereof if so required. Casing 131 can also be made of pure SiO$_2$ or quartz. In the latter case, because casing 131 is more expensive and difficult to built, it may be desirable to have it thoroughly cleaned before being re-used. Other materials such as stainless steel could be contemplated as well, but would require obvious construction adaptation.

To make clear how the rim 141 mates with flange 121, the details of the casing 131 and rim 141 are shown in the enlarged view of FIG. 4. Opening 132 is in fact comprised by the juxtaposition of two sub-openings: 132A for slidably engaging the wafer 138 in the wafer holder and 132B where a vacuum operated gripper will be inserted therein to slightly lift up the wafer and hold it before it is extracted (reciprocal movement for insertion). When holder 130 is slidably engaged in access opening 104, the rear face of perforated rim 141 is laterally moved until it applies against flange 121 (see FIG. 2) for excellent peripheral mating.

Figure 5:
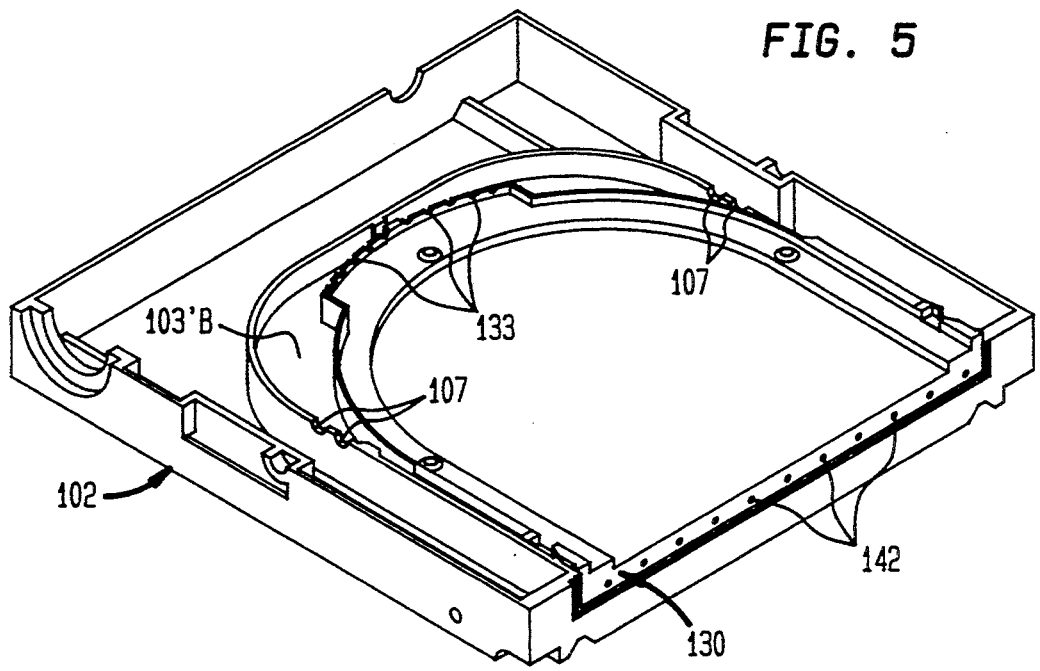
FIG. 5 shows a cut-away view of the lower halves of housing of FIG. 2B and wafer holder of FIG. 4B once assembled all together.

As illustrated in FIG. 5, once the wafer holder 130 has been inserted in the cassette reservoir receptacle 103B, the remaining interior space, defines a volume which fully surrounds the wafer holder, not only on its rear and lateral faces (as apparent from FIG. 5) but also above and under it due to the presence of supports 108 and 135. This remaining interior space will be referred to as the internal chamber 103'B which essentially communicates with the outside ambient thru said perforations 142 (when said pivoting cover 124 is opened).

Figure 6:
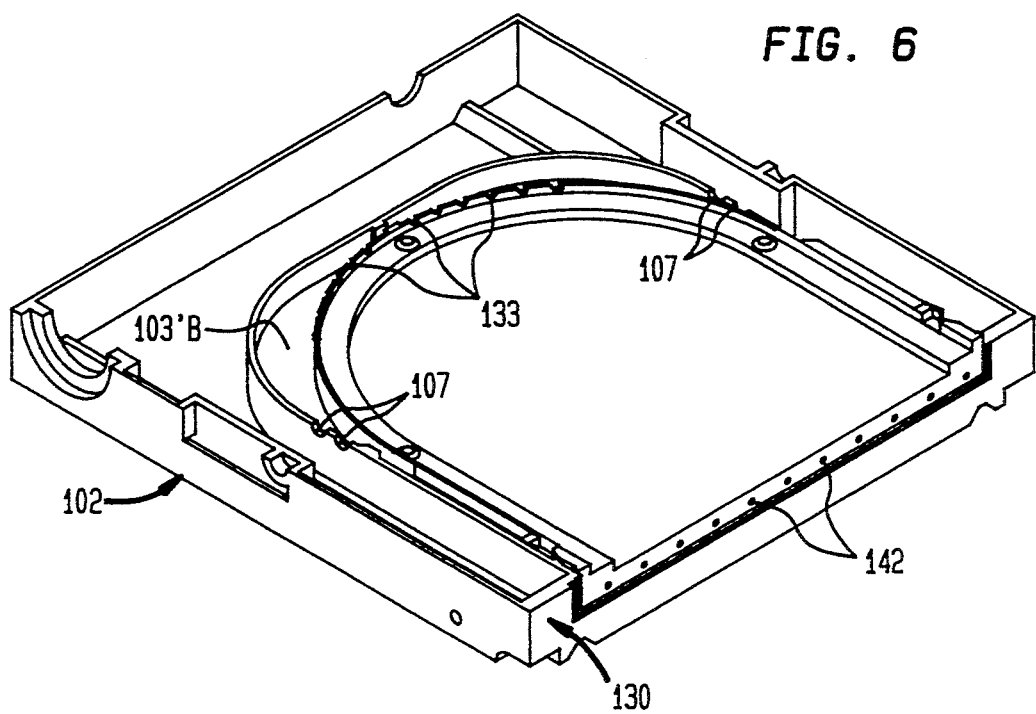
FIG. 6 shows the assembly of FIG. 5 but using a wafer holder of a different design.

FIG. 6 shows the assembly of FIG. 5 wherein a wafer holder 130 having a different contour design has been illustrated. The difference only lies in the profile or contour of the holder casing which does not exhibit any longer the typical protruded rear face profile of the FIG. 4 wafer holder.

Figure 7:
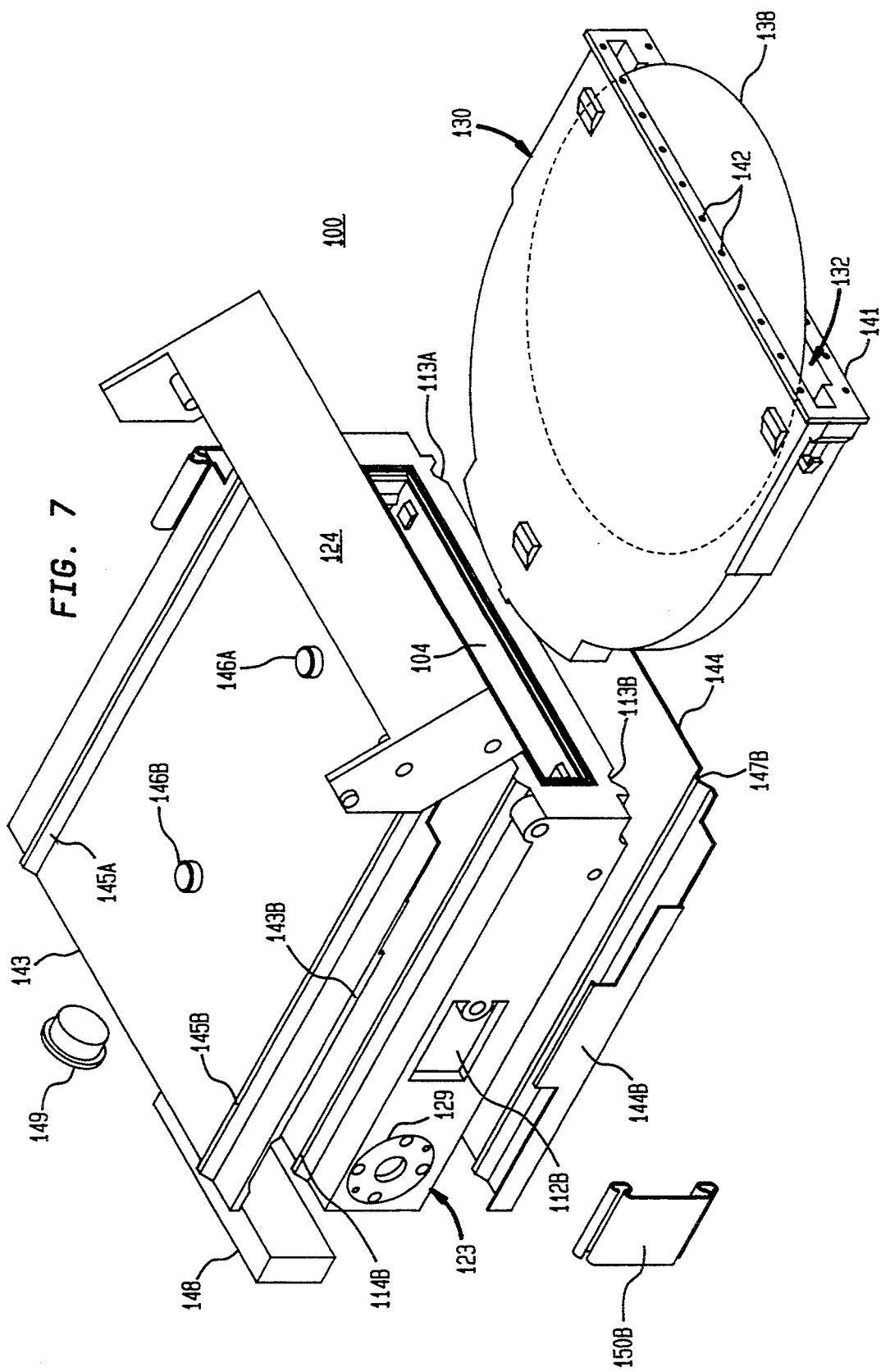
FIG. 7 shows a schematic exploded perspective view of the cassette reservoir and holder assembly to result in the container of the COAST concept further including some optional components.

FIG. 7 first illustrates the cassette reservoir 123 of FIG. 3 (with pivoting cover 124 partially removed to permit access opening 104 to be visualized) and wafer holder 130 enclosing a wafer 138. FIG. 7 further illustrates some other elements that can be fitted to the cassette reservoir 123, for improved operation thereof. Container 100 is thus basically comprised of cassette reservoir 123 and holder 130. Optionally, cassette reservoir 123 can include upper and lower protective shells 143 and 144. Because the preferred material for frame 101 is plastic as mentioned above, due to the many handling and sliding operations during the transport of the container on the conveyors, the cassette reservoir may wear prematurely. These shells 143 and 144 are made of a hard and stout material, such as stainless steel, to protect the cassette reservoir during all said handling/transportation steps. For closely fitting, upper shell 143 is correspondingly provided with rail-shaped positioning guides 145A and B and with centering buttons 146A and B fitting with corresponding buttons 116A and B (note that in this case, guides 114A and B and pins 116A and B. The flanges of shell 143 have protruding members 143A and B designed for clipping in recesses 112A and B. Similar construction applies to the lower shell 144, where corresponding grooves 147A and B may be noticed. It further includes two centering holes (not shown) corresponding to holes 115A and B (see FIG. 2). Thanks to clipping, upper and lower anti-wear shells 143 and 144 firmly apply against top and bottom external faces of cassette reservoir 123 for excellent protection thereof, while still allowing the stacking capabilities mentioned above.

In addition, a label or bar code tag 148 is affixed on the rear face of cassette reservoir 123 for identifying the container by the host computer of the Floor Control System in case of there is no direct wafer identification data reading. The container is transported to various locations where processing operations are performed. For example, a typical remote recognition system for monitoring the progress of the container enclosing the semiconductor wafer through a series of processing steps is based on bar code recognition technology. Each container is provided with an optically visible bar code tag coded to be responsive to within reading range of a bar code reader unit. A reader unit transmits a modulated light beam signal to the coded bar code tag, then reads and decodes the light beam reflected back which is collected by an optical receiver to uniquely and permanently identify the container. As illustrated in FIG. 1, reader units of this type generically referenced 604, are Judiciously disposed at appropriate locations of the conveyor system 400. As a result, information generated from the reader units permits monitoring the progress of each semiconductor wafer through the multiple processing equipments by the host computer. Commercially available bar code tag substrates of anodized aluminum, stainless steel, polyimide synthetic resin such as KAPTON, perfluorinated synthetic resins such as TEFLON, polyester synthetic resin and ceramic, are adequate in all respects. However, other contactless wafer data identification systems, for instance based on infra-red signals or the like could be envisioned as well.

A significant advantage of the disclosed single wafer container design, is the exhaustive follow-up of each wafer, and thus of the chips resulting therefrom, not only during processing but also after fabrication including in the field once the chips have been packaged in a system. An excellent knowledge of the wafer history allows to construct a data base useful for statistics maintenance or feedback corrective actions for reliability improvement. Note that to date, some data are already written onto the chip backside (identifying the manufacturing periods, the references of equipments, ...). This trend will surely continue if not significantly increase in the future for example for ultra dense microprocessors.

As a matter of fact, direct wafer reading may become important in the future of silicon wafer manufacturing when very personalized treatment are conducted. One can readily imagine that some typical process parameters will be writ ten directly onto the wafer to be taken in consideration in the subsequent processing steps or even after chip fabrication, e.g. in the field for maintenance. To that end, if some constituents of the cassette reservoir, i.e. frame 101, holder 130 and/or shells 143 and 144, are made from an opaque material such as stainless steel, a transparent window may be adapted thereto for direct wafer identification data reading.

If necessary, an observation plug 149, tuned on one or several specific internal gas parameters can be inserted in optional aperture 117 of frame 101 (FIG. 2). Visual monitoring of some parameters such as humidity, temperature, purity, ... of the gas enclosed in reservoir 103A by an operator may be required in some cases/applications. Finally, resilient clips 150A and B may be inserted in said recesses 112A and B respectively on each housing lateral face, to interlock two containers. A number of containers can be easily piled-up for handling or transportation.

In FIG. 7, cassette reservoir 123 is represented with pivoting cover 124 in a semi-open position, out of his lodgment, and the wafer holder 130 partially enclosing a wafer 138 not fully inserted in the cassette reservoir for sake of illustration. Once holder 130 fully enclosing wafer 138 is totally inserted in receptacle 103B and cover 124 closed for hermetic sealing, container 100 may be transported or stored. It may be transported either manually by an operator or automatically, for instance by the intelligent flexible conveyor 400 or stored in a dispatching apparatus 300, as explicated above by reference to FIG. 1.

In essence, the major characteristic of container 100 is to permanently maintain its interior space 103 containing the wafer holder 130 (enclosing a wafer or not) under pressure and, except short periods of transportation, to be systematically connected to the compressed ultra pure neutral gas supply installation 700 for maximum safety. An ultra-pure neutral gas, such as N2, Ar, He, . . . is introduced therein in a conventional way by inserting a gas injector (connected to the said gas supply installation) in the quick connect seal plug 129A (see FIG. 3). As explained below, the gas injector will be a retractable nozzle adapted to said gas injection means. N2 is the preferred gas because of its low cost. The ULPD (Ultra Low Particulate Design) gas cabinet system sold by AIRCO is a valuable contender for gas supply installation 700.

With pivoting cover 124 closed, when the compressed neutral gas is injected through said gas injection valve means, the gas is first filtered in high efficiency filter 129B before being introduced in the interior space of container 100 to fill the reservoir 103A. Then, it passes in receptacle 103B through holes 107 and fills the said remaining space 103'B. Typically, hole size diameter ranges from 2 to 10 mm. Within container 100, wafer holder 130 is fully surrounded by the gas. The gas passing from reservoir 103A into chamber 103'B results in a first baffling effect for trapping incoming particulates that could remain. Next, it finally fills the interior space 134 of casing 131 in passing through via-holes 133. This also produces a second baffling effect, very efficient because holes 107 and via-holes 133 are offset and because of the minute size of via-holes 133. The container interior space is maintained at a nominal pressure p sufficient to prevent ingress of contaminants from the outside ambient but not too high in order not to exert an excessive pressure on the pivoting cover 124 to avoid any undesired release thereof. Consequently, the wafer 138 enclosed in holder 130 is fully encompassed by said neutral gas at an adequate positive differential pressure $\Delta p$ with respect to the outside ambient. Via-hole number, size, orientation, and location may be designed so that the likelihood to have residual contaminant particulates remaining in the filtered gas supplied by reservoir 103A, to reach the wafer surface, is really close to zero. Typically, via-hole size diameter ranges from 0.2 to 2 mm and are spaced from each other by a predetermined distance such as 2 to 5 mm. A very efficient additional protection effect to trap the said remaining particles and to divert them from reaching the wafer is thereby produced. The combination of holes 107 of the drilled inner wall 106 with the via-holes 133 of the perforated rear face of casing 131 to produce these two baffling effects, is a prominent point of the disclosed COAST concept from a particulate trapping point of view.

The preferred range of the nominal pressure p is: 1.005–1.1 10E5 Pa to produce a positive differential pressure $\Delta p$ of about 500–10 000 Pa with respect to the outside ambient. The typical average value is approximately 5000 Pa. Although the container is normally designed to be as much hermetic as possible, there could be some gas leakage possibilities especially during conveyor transportation or should long duration storage in the stocker be required. This is one of the reasons why the gas will have to be periodically rejuvenated. Another reason is the necessity to open the container pivoting cover for each wafer transfer which causes non-negligible gas losses.

Now let us see how the wafer is protected from outside contamination when the pivoting cover 124 is released. Normally, the container is connected to the said gas supply installation 700 so that a protective neutral gas environment pressurized at the said nominal pressure p is maintained within its interior space. Preferably, when the pivoting cover 124 has to be released, the blower pressure P is applied to said interior space. The aim is to produce the desired gas stream flowing outwardly having the ade quate gas flow rate V for maximal protection. Holes 107 are so designed to allow a significant quasi laminar gas flow passing above all the enclosed faces of the wafer holder when the cover 124 is in the open position. However, these holes 107 can be only coarsely calibrated because their size is not really critical. Next, this gas flow passes through perforations 142 and can be directed either horizontally or obliquely to create a gas curtain which protects the wafer 138 from any ingress of contaminants. Likewise, the number, size, orientation and location of perforations 142 may be so designed to achieve an efficient gas curtain for wafer protection when the pivoting cover 124 is released. It is remarkable to notice that during this time of gas curtain generation, the wafer is quite in a still environment because of the size ratio between holes 107 and via-holes 133. Because, the container 100 is connected to the said gas supply installation 700 when the pivoting cover 124 is released to maintain production of said protective gas curtain, the container could stay in this position as long as desired. On the other hand, should the dynamic cleaning effect mentioned above in connection with U.S. Pat. No. 4,724,874 required, it would suffice to enlarge the diameter size of via_holes 133.

Theoretically, cassette reservoir 123 could be readily adapted to store a single wafer in a pressurized protective environment without using wafer holder 130. In this instance, the wafer would be maintained therein by the supporting means generically referenced 108 in FIG. 2 that have just to be adapted in that respect. However, only the first baffling effect mentioned above would be obtained. But the combination of holes 107 of the drilled inner wall 106 with the via-holes 133 of the rear wall of wafer holder 130 as described above to produce the second baffling effect mentioned above, appears nevertheless to be a requisite as far as high value product wafers (e.g. 64 Mbit and above DRAM chips, VLSI and ULSI bipolar chips) are produced. Likewise, one may also use a non-perforated holder rim for some particular applications. The gas curtain that was produced has to be replaced by a shower effect through the holder opening. In this case, via-holes 133 have to be designed with larger diameter that mentioned above.

Other container designs may be readily envisioned while still in accordance with the basic principles of the COAST concept. In particular, the drilled inner wall 106 may be a drilled plate dividing the interior space 103 in upper and lower regions. The former constituting the reservoir and the latter the receptacle. Underneath, this perforated plate, the air flows unhindered downwards upon the whole surface of the wafer holder. Likewise, other solutions to the above described door means described as a pivoting cover can be implemented, e.g. magnetic doors, vertical shutters, vacuum doors . . . etc.

Finally, the container 100 is of relatively simple structural design and do not require any complex latching mechanisms to ensure its sealing. As illustrated in FIG. 1, handling by a belt conveyor and stacking in a stocker are easy. Moreover, its unrivaled design allows usage of transparent materials or windows for direct reading of the wafer identification data. Because of its hermetic structure and low volume reservoir, it can be inexpensively filled with costly ultra pure neutral gas. Hermetic sealing gives a real autonomy and safety to the container, should a failure occur for instance, in the gas supply installation. Usage of soft swiveling and support pads permits to significantly reduce the silicon particulate generation, that inevitably result from the friction produced between said pads and the wafer during handling and transportation.

Multiple wafer containers (MWC)

Indeed, the Single Wafer Treatment approach is the essence of the COAST concept and appears of bright future, however, the demand of handling a plurality of wafers for batch processing may still continue, for instance, for GaAs wafers (of smaller diameter sizes when compared to silicon wafers) or for some specific processing steps such as cleaning, hot thermal processing . . . etc. Although container 100 such as described in conjunction with FIGS. 2 to 7 is perfectly suited for single wafer storing, transport and handling, it can be readily adapted to receive a plurality of wafers should a multiple wafer holder be required. Thus, description of a second preferred embodiment in that respect, encompassing different variants adapted to multiple wafer batch processing, is now given with reference to FIGS. 8 and 9.

Figure 8A:
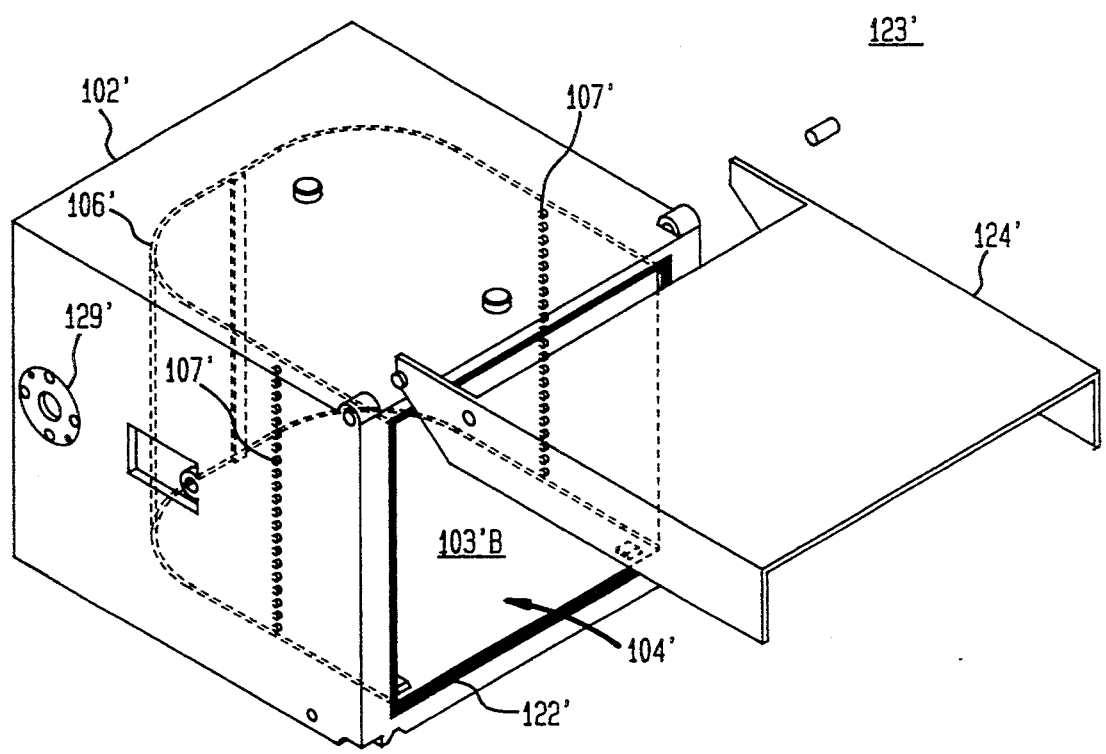
FIG. 8A which shows the cassette reservoir of FIG. 3 and FIG. 8B which shows the holder of FIG. 4 when both adapted to receive a plurality of wafers.
Figure 8B:
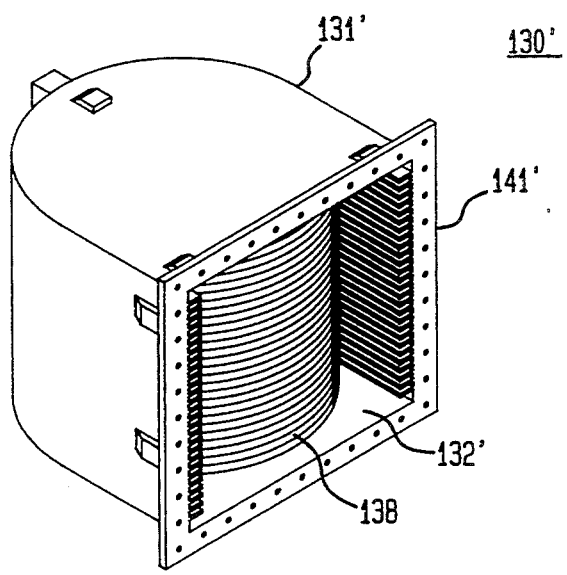

FIG. 8 is comprised of FIG. 8A and FIG. 8B wherein FIG. 8A schematically shows the substantive elements of cassette reservoir 123 of FIGS. 2 and 3, now referenced 123', once directly derived therefrom for adaptation to receive the multiple wafer holder 130' of FIG. 8B. In turn, the latter directly derives from the wafer holder 130 of FIG. 4. Corresponding elements bear corresponding references. Note, because of the relatively large volume of access opening 104', it may be worthwhile to use two gas injection valve means 129'A and B on both lateral sides of housing box 102' instead of one. As apparent from FIG. 8, only minor adjustments substantially limited to size changes are required. However, the two holes 107 apparent in FIG. 2 now become a full set of hole pairs referenced 107' in FIG. 8A, there is one hole pair for each wafer 138. Comments made above with respect to the number, size, and location of holes 107 in drilled inner wall 106 (FIG. 2) still apply.

FIG. 8B shows the corresponding wafer holder 130' once adapted to store a plurality of wafers 138. For sake of simplicity, some details of the housing 102' and of the casing 131' have not been represented in FIG. 8B. Transfer opening 132' now comprises a series of slots, which, when compared with the FIG. 4 holder, gives a typical castellated shape to its internal lateral sides. Wafer holder 130' of FIG. 8B is still provided with a set of via-holes 133' (not shown) corresponding to said slots and thus in this case, in broad relationship with said set of hole pairs. As a result, the efficient trapping of contaminants mentioned above is only obtained in some extent. Finally, a piece of soft foam such as polyurethane foam or the like (not shown) is stuck on the internal face of cover 124' (FIG. 8A) to maintain the wafers secured in the holder 131' (once inserted in container 100') when cover 124' is closed.

Some processing equipments may be designed to receive commercially available multiple wafer carriers, such as the well-known H-bar models designed and manufactured by FLUOROWARE Inc.

Figure 9A:
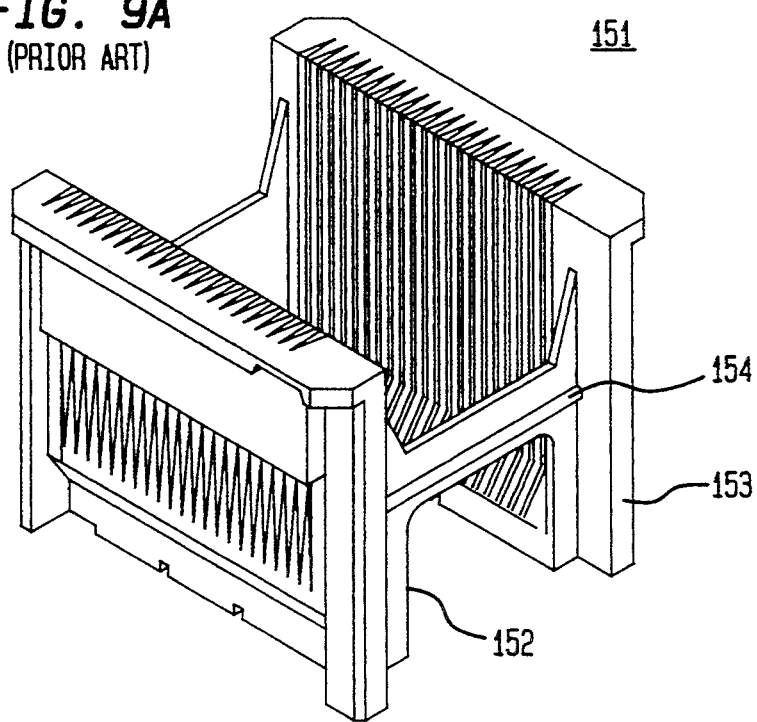
FIG. 9A which shows a typical commercially available wafer cassette and FIG. 9B which shows the cassette reservoir of FIG. 3 when adapted to receive such a cassette.

FIG. 9A (which corresponds to FIG. 1 of U.S. Pat. No. 4,949,848 (Ref. D10) assigned to FLUOROWARE Inc.) shows such a typical wafer carrier appropriate for being used as the cassette in the multiple wafer container 123' of FIG. 8A, once slightly modified.

Now turning to FIG. 9A the wafer carrier referenced 151 which has an H-shaped end wall 152 with a flange 153 supporting a horizontal indexing bar 154 commonly used for indexing the wafer carrier. Such carriers are commercially available from FLUOROWARE Inc. under reference A192-80M and the like.

Figure 9B:
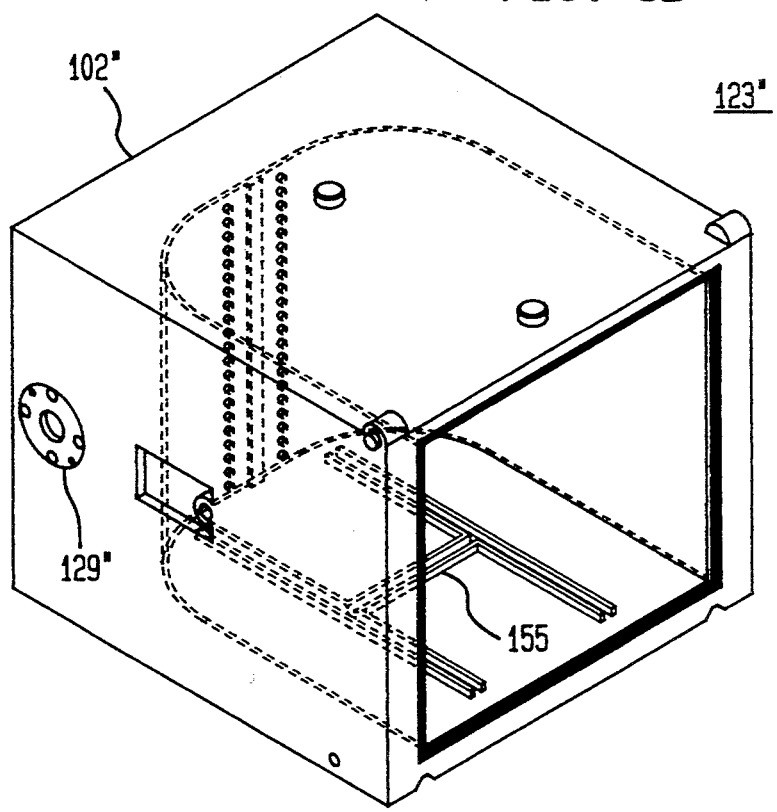

As illustrated in FIG. 9B, the cassette-reservoir 123' (pivoting cover 124" is not shown) of FIG. 8A may then be readily adapted to this type of carrier. In this instance, the only adaptation in the cassette reservoir now referenced 123" consists in the provision of a H-bar female attachment system 155 onto the internal face of the housing bottom of the housing now referenced 102". Obviously, the advantages mentioned above in connection with the description of the wafer holder 130 (FIG. 4), and in particular the second contaminant trapping effect and the gas curtain effect produced by perforations 142 of holder 130, are no longer obtained.

THE PRESSURIZED INTERFACE APPARATUS

The interface apparatus of the COAST concept has great versatility potential. In particular, it can be designed to interface either a single wafer container (SWC) and a processing equipment (PE) or a single wafer container and a multiple wafer container (MWC).

The SWC/PE interface apparatus

Figure 10A:
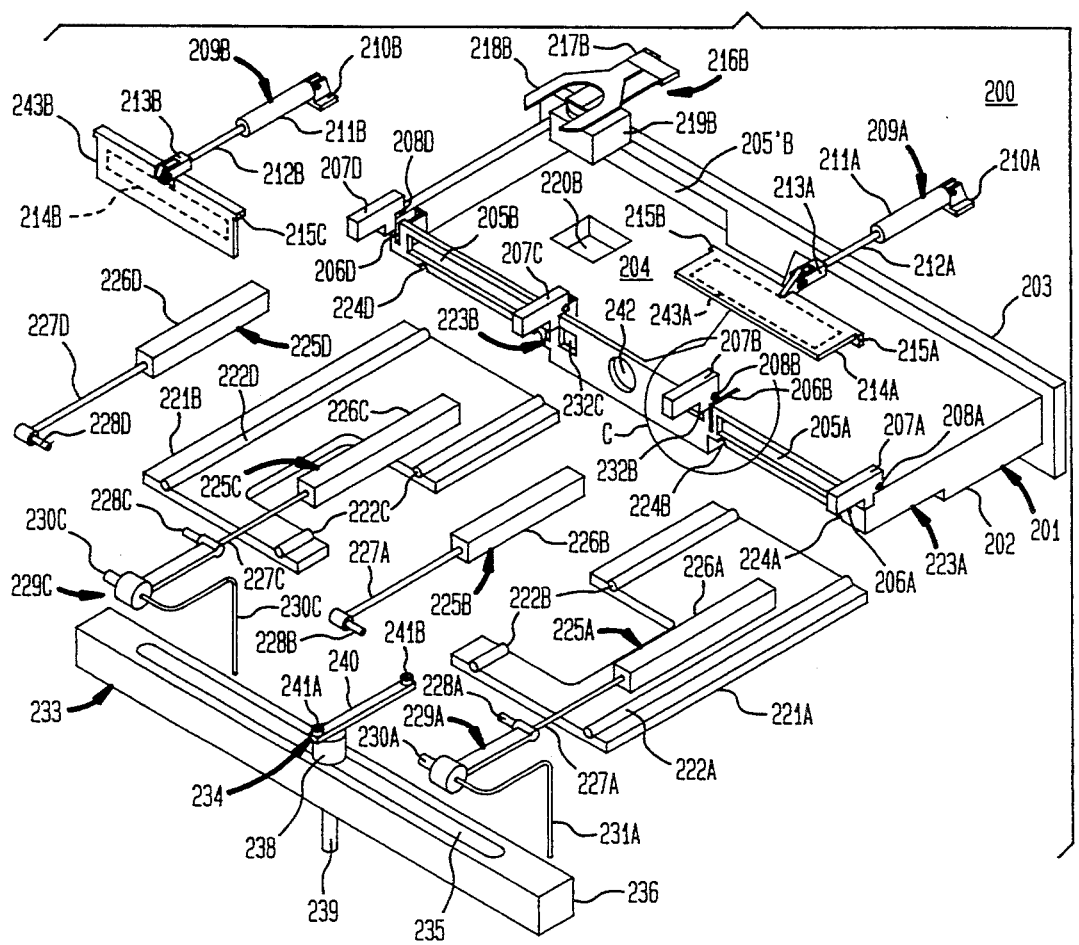
FIGS. 10A and 10B show a schematic exploded perspective view of the different parts composing the pressurized interface apparatus of the COAST concept, in a typical dual section version and an enlarged portion of the apparatus of FIG. 10A.
Figure 10B:
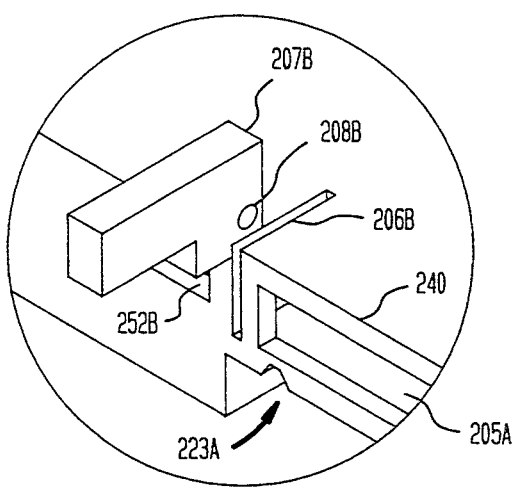

FIG. 10 shows a partially exploded view of the different elements forming the pressurized interface apparatus 200 of the COAST concept in a dual-port version consisting of two independent IN/OUT sections to match most conventional processing equipments provided with respective input port (pre-process or load station) and output port (post-process or unload station). Usually, a typical processing equipment further includes a loadlock to interface between said ports and the treatment chamber properly said. The said stations may or not be connected to the said gas supply installation 700.

In the dual-port version illustrated in FIG. 10, interface apparatus 200 first includes a frame 201 which essentially consists of a box-shaped housing 202 provided with a rim 203 at its rear face. Housing 202 delineates an interior space 204 as apparent in the left most part of FIG. 10 where the housing top surface has been removed. In FIG. 10, the interior space 204 is common to both the IN and OUT sections, however, a separating wall creating two independent interior spaces, one for each section, could be envisioned as well. The front face of housing 202 is provided with two port windows 205A and B. Similarly, the rear face of frame 201 is provided with two corresponding communication gates 205'A and B for communicating with the said pre-process and post-process stations respectively. The interior space between one port window and one communication gate is referred to a port zone. A pair of notches 206a and b and a pair of thrusts 207a and b are disposed on the sides of window 205A. Similar construction applies to port window 205B with notches 206c and d and thrusts 207c and d. Thrusts 207a to d are each provided with a bored hole referenced 208a to d respectively. A lid actuator device 209A is affixed onto the top surface of housing 202. It comprises a fixing means 210A to attach the device to the housing top surface, jack 211A, extension arm or piston 212A and a fork-shaped head or yoke 213A in FIG. 10, the door means consists of pivoting lid 214A whose movement is controlled by arm 212A via yoke 213A and a bored protruding ear fixed on the lid as illustrated in FIG. 10. The lid 214A has two blind holes 215a and b that cooperate with respective bored holes 208a and b and pins (not shown) to ensure its pivoting once movable arm 212A is retracted. As far as port window 205B is concerned, similar construction applies to lid actuator device 209B and lid 214B. The role of lids 214A and 214B is to controlably permit or prevent access into interior space 204 through port windows 205A and 205B respectively. Role of lids 214A and B is to maintain interior space 204 fully hermetic once closed. As apparent in the left most part of FIG. 10, a rotating transfer handler 216B with movable arm 217B and a standard vacuum operated fork-shaped gripper 218B is mounted and affixed on the internal face of the housing bottom within interior space 204. For instance, handler 216B body has a protrusion 219B enclosing the driving motor which engages in recess 220B of housing 202. However, to further eliminate a potential contamination source, protrusion 219B may be located outside the housing. Similar construction applies to rotating transfer handler 216A not visible in FIG. 10.

Interface apparatus 200 further includes two rest container receiving zones, one for each port zone (or section). In the IN section, the receiving zone essentially consists of centering support 221A provided with two centering rails 222a and b, which partially engages in a recess 223A constructed at the right bottom of housing 202 under opening 205A. Rails 222a and b fit with corresponding grooves 224a and b. Similar construction applies to centering support 221B provided with rails 222c and d adapted to recess 223B and grooves 224c and d. Each container receiving zone is subdivided in two zones: a rest zone remote from housing front face and an active zone at the close vicinity of the housing front face. Centering supports 221A and B are preferably provided with an aperture or perforated in the said active zone.

The IN section of interface apparatus 200 further includes a pair of clamping actuator devices 225a and b encompassing window 205A. Actuator device 225a is normally fixed onto the lateral side of housing 202 on the right of window 205A. It comprises jack 226a, movable arm or piston 227a, retractable finger 228a and finally, a retractable gas feeding system 229a including nozzle 230a and hose 231a. The hose 231a is connected to the compressed ultra pure neutral gas supply installation 700. Actuator device 225b is of similar construction except in that the retractable gas feeding system 229a of actuator device 225a is no longer required. Actuator device 225b is lodged in hole 232b. Similar construction applies to actuator devices 225c and d in connection with opening 205B. Normally, gas feeding systems 229a and c are required to produce the protective gas curtain at the opening of pivoting cover 124. However, occasionally in some specific applications (e.g. the workpiece is a ceramic substrate), they may be only optional. Finally, note that other types of clamping actuator devices may be envisioned as well.

Finally, interface apparatus 200 includes a container transfer device 233 to move a container from the IN section rest zone to the OUT section rest zone. It basically comprises an actuator device 234 sliding in groove 235 of support 236. Actuator device 234 comprises jack 238 and movable arm 239. A metal plate 240 (larger than shown in FIG. 10) having two buttons or pins 241a and b is fixed thereon. The latter buttons engage in corresponding holes 15A and B formed in the external bottom face of container 100 (see FIG. 2). Actuator device 234 moves the plate up and down in the vertical direction.

As explained below, the interface apparatus can be optionally provided with an aperture 242 to be fitted with a gas injection valve assembly. Location of this aperture is not critical, for example it may be achieved in the middle of the housing front face. It is essential according to the COAST concept, that the housing interior space 204 which defines the two port zones be pressurized to avoid contamination from the outside ambient. To that end, it has to be fully hermetic, preventing thereby any unnecessary gas leakage through port windows 205A and B of a costly ultra-pure gas.

An enlarged view of portion referenced C of FIG. 10 is also shown to illustrate the detailed construction of notch 206b, thrust 207b and bored hole 208b mentioned above. The two lower angles of the protruding portion of thrust 207b are rounded. Similar construction applies to other thrust 207a, c and d. This adapted profile cooperates with roller bearings 128A and B of pivoting cover 124 (FIG. 3) for automatic opening thereof 124. Finally, FIG. 10 also illustrates the O-ring 243A and B (in dotted line) which permit to lids 214A and B an hermetic sealing with the housing front face at the periphery of port windows 205A and B.

Figure 11:
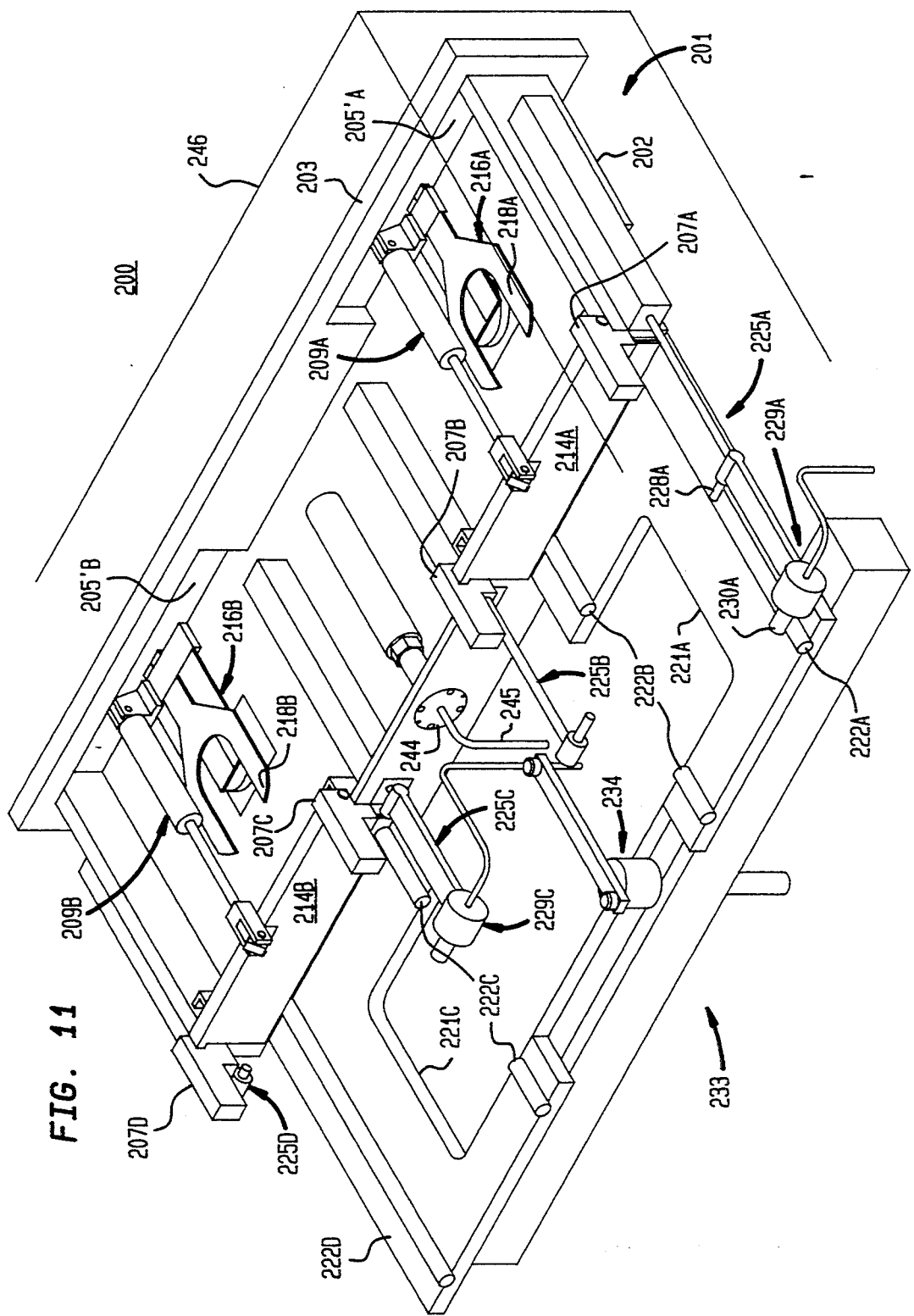
FIG. 11 shows a schematic perspective view of the pressurized interface apparatus of FIG. 10 once the said different parts have been assembled.

In summary, the IN section of interface apparatus 200 therefore basically comprises two zones: a container receiving zone which essentially consists of centering support 221A and a port zone which corresponds to the portion of the housing interior space 204 located between the port window 205A and the communication gate 205'A (visible in FIG. 11). Similar construction applies to the OUT section. The ambient and pressure which prevail within interior space 204 are usually those of the processing equipment pre-process and post-process stations, because communication gates 205'A and B are normally opened and lids 214A and B normally hermetically seal port windows 205A and B. However, as explained later, other situations may be envisioned as well.

As apparent from FIG. 10, the OUT section is identical in all respects to the IN section. Note that an interface apparatus comprising only a single IN/OUT section could be also designed for processing equipments such as Rapid Thermal Anneal (RTA) stations that usually process the wafers only on an individual basis and have only one input/output port.

FIG. 11 is a perspective view which shows the elements of FIG. 10 once the different parts have been properly assembled to construct the dual-section interface apparatus 200, assuming the top surface of housing 202 is transparent.

A gas injection valve means 244 (similar in all respects to device 129 or not) has been inserted in aperture 242 of FIG. 8 and connected to the gas supply installation 700 via hose 245 for pressurization needs. However, alternatively, the source of pressurization may be the processing equipment itself thru the communication gates.

Although not clear from the latter, the container transfer device 233 is positioned a few centimeters underneath the plane defined by the two centering supports 221A and B. Electrical wires that control actuator devices, the tubing network of the gas supply installation, . . . have not been illustrated in FIG. 11 for sake of simplicity. Optionally, a removable (transparent) cover 246 is advantageously used for dust protection of interface apparatus 200, it may be associated with a clean air atmosphere or not.

FIG. 11 makes apparent the different characteristics and features of interface apparatus 200. Besides its simplicity and rugged appearance, it has great flexibility potential for easy adaptation to any conventional processing equipment and for extensive usage with conventional conveyors pursuant to the CFM concept in a full CIM environment. In addition, a defective interface apparatus can be quickly and without effort replaced by a spare pre-qualified unit. Note also, it is possible to obtain a very high cleanliness level within the housing interior space 204 due to the reduction of elements located within it. In accordance with the implementation illustrated in FIG. 11, the major source of potential contamination is the two rotating transfer handlers 216A and B. However, with minimal design changes, a standard wafer orienting device can also be introduced in the interface housing interior space 204 when a specified processing equipment 500 needs to have the wafer appropriately oriented for treatment. A bar code reader or the like can also be associated to the wafer orienting device if required. Moreover, the production and exploitation cost are minima, because the volume of the housing interior space is low (reduced ultra pure gas consumption). Finally, the interface apparatus is adapted to a number of different workpieces, for instance workpiece size changes would only result in changes in the front face housing. Because the pressurized interface apparatus of the COAST concept operates as a loadlock, it may be designed to replace the pre-process and post process stations and the loadlock of the processing equipment mentioned above, as well.

Figure 12A:
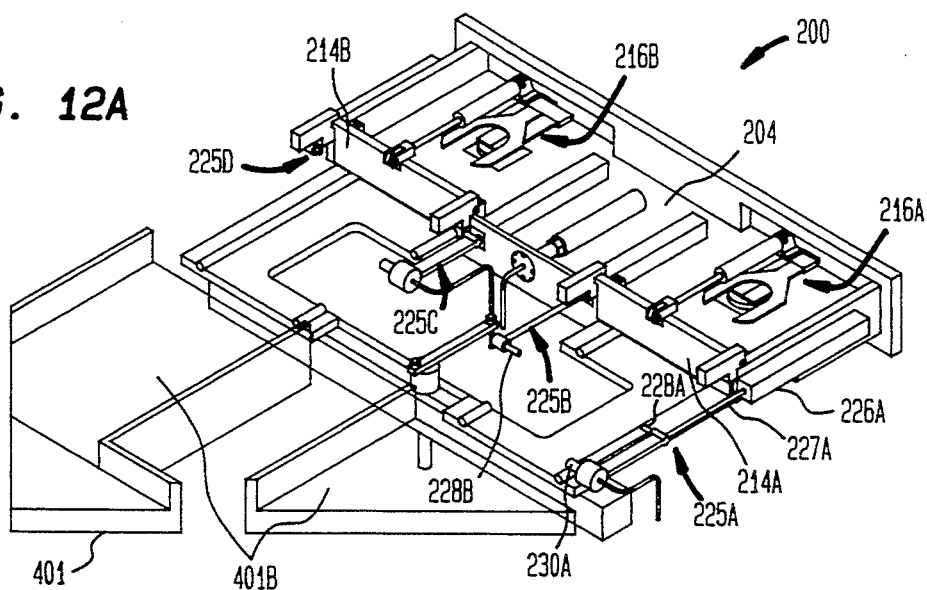
FIGS. 12A to 12O show schematic perspective views of the pressurized interface apparatus during the various operating steps of the wafer transfer (loading/unloading) operations detailing thereby the sequence of the wafer movements.
Figure 12B:
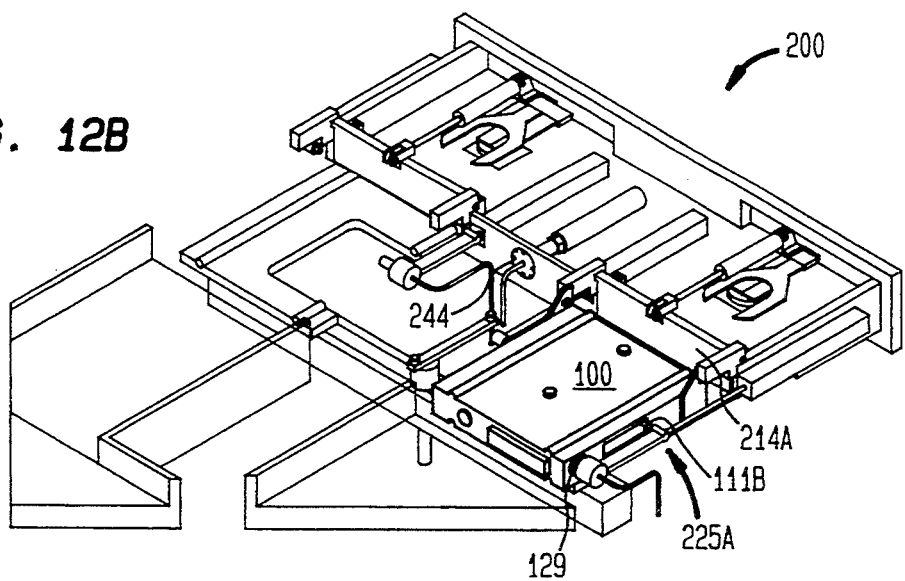
Figure 12C:
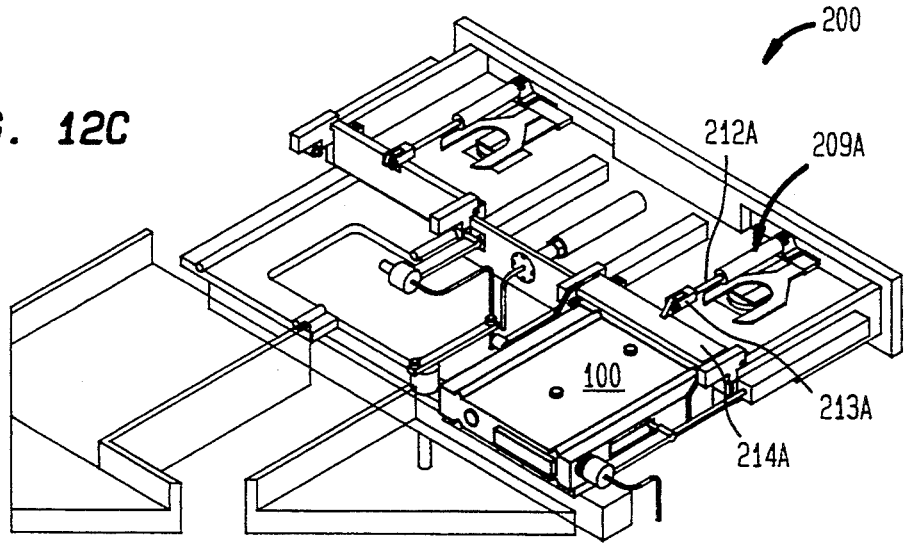
Figure 12D:
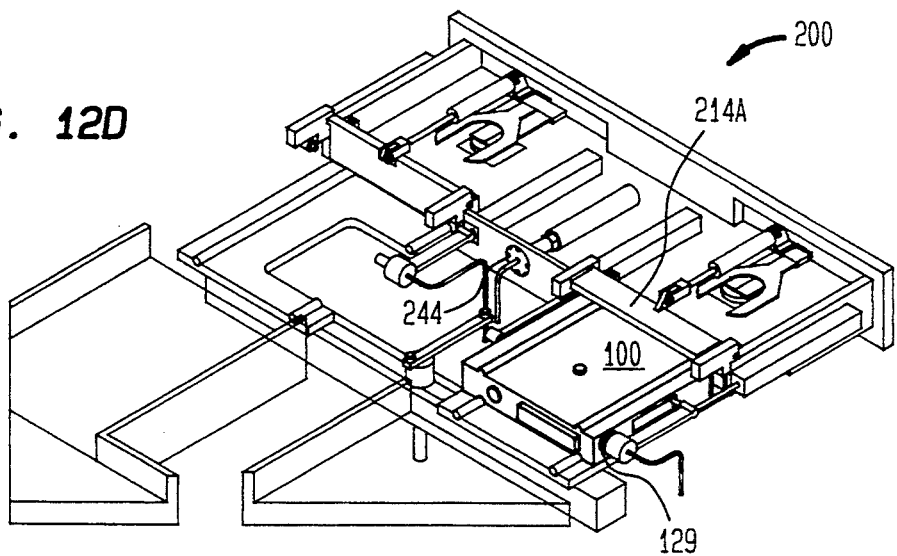
Figure 12E:
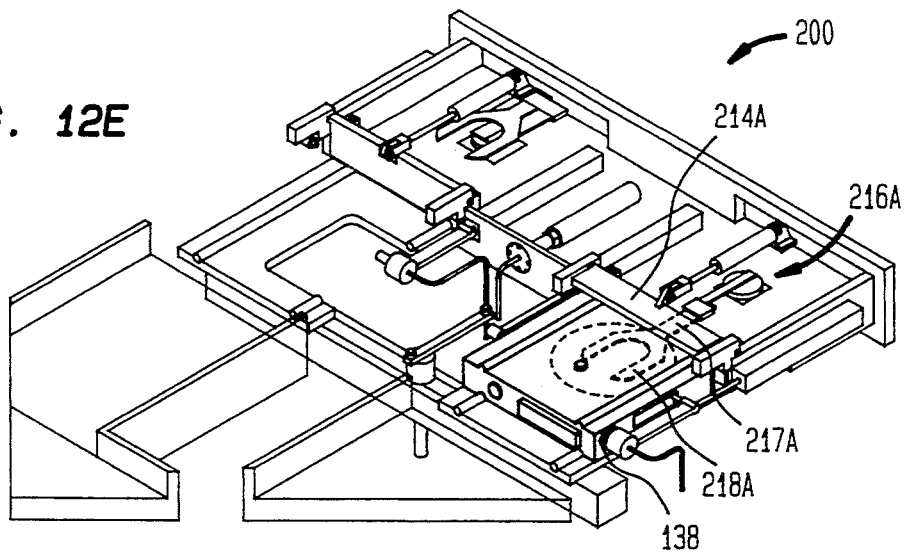
Figure 12F:
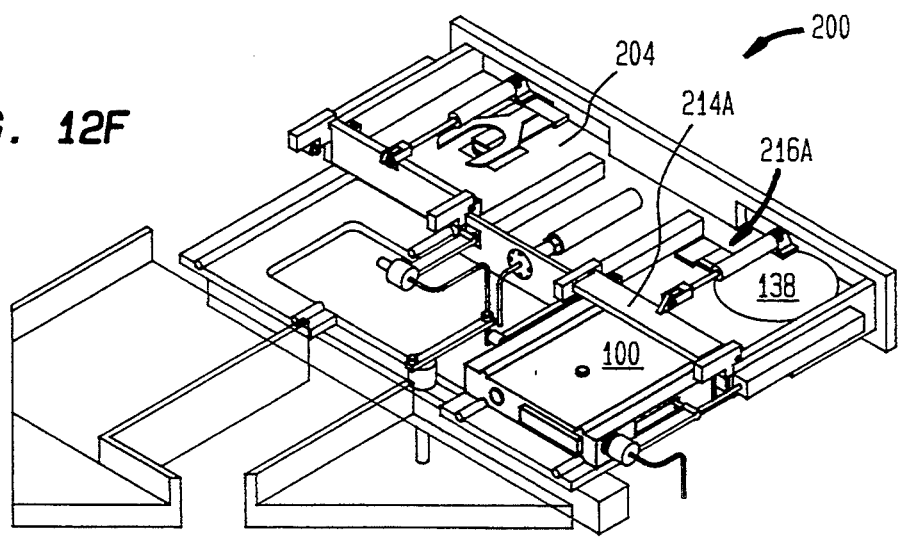
Figure 12G:
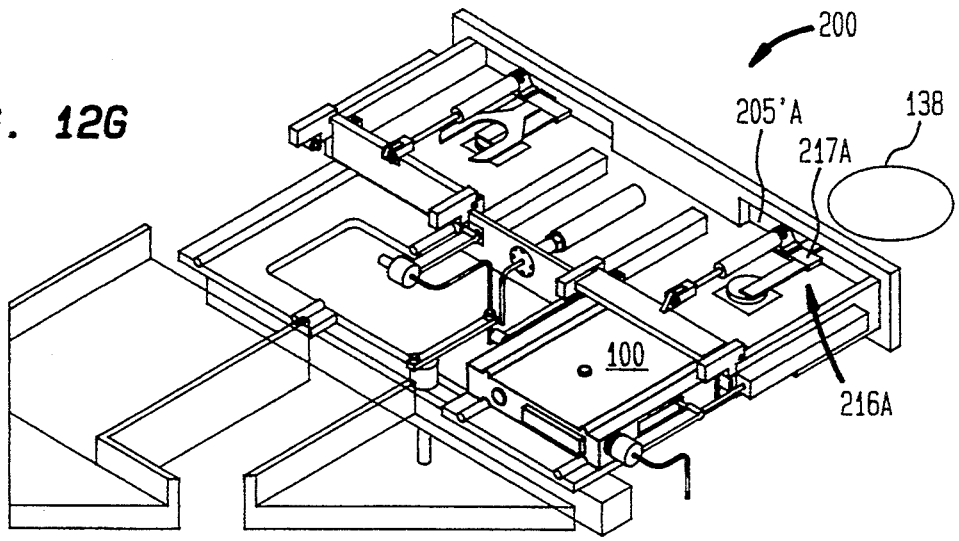
Figure 12H:
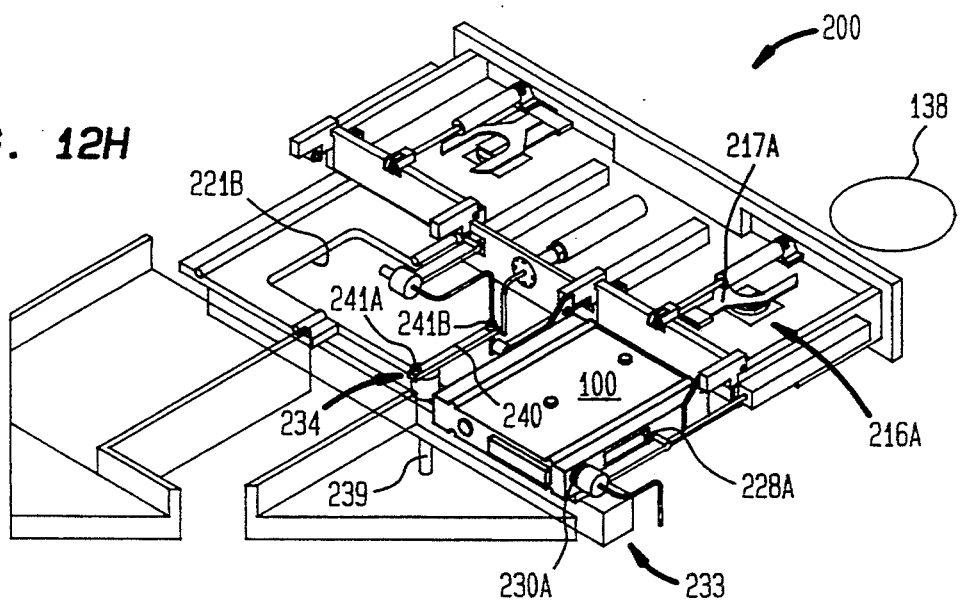
Figure 12I:
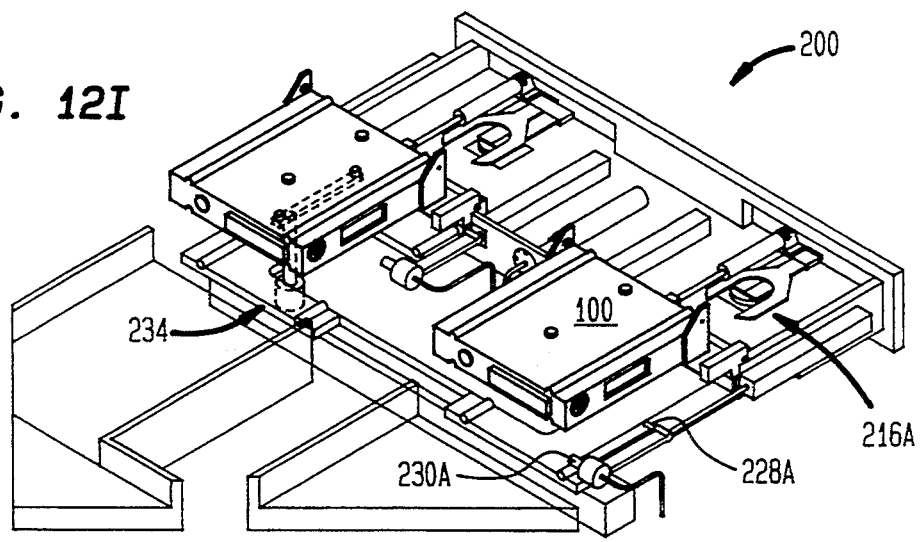
Figure 12J:
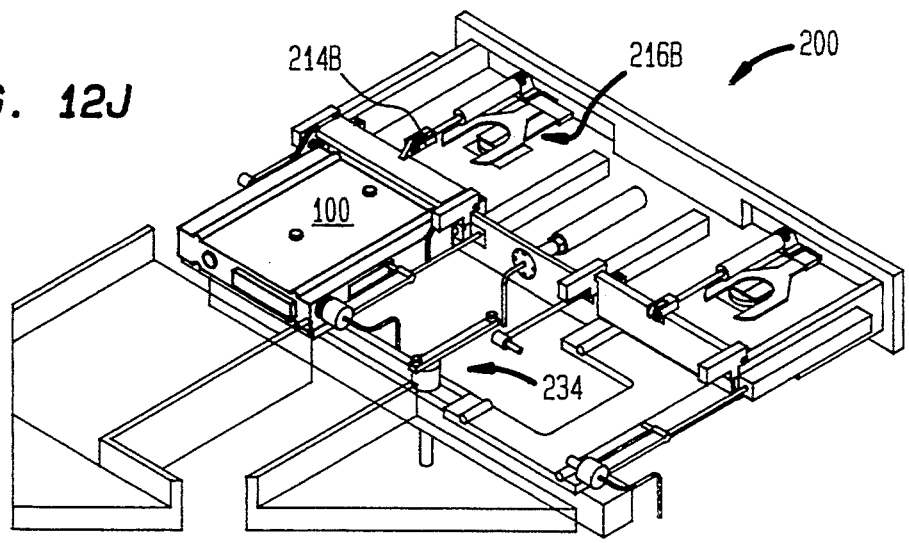
Figure 12K:
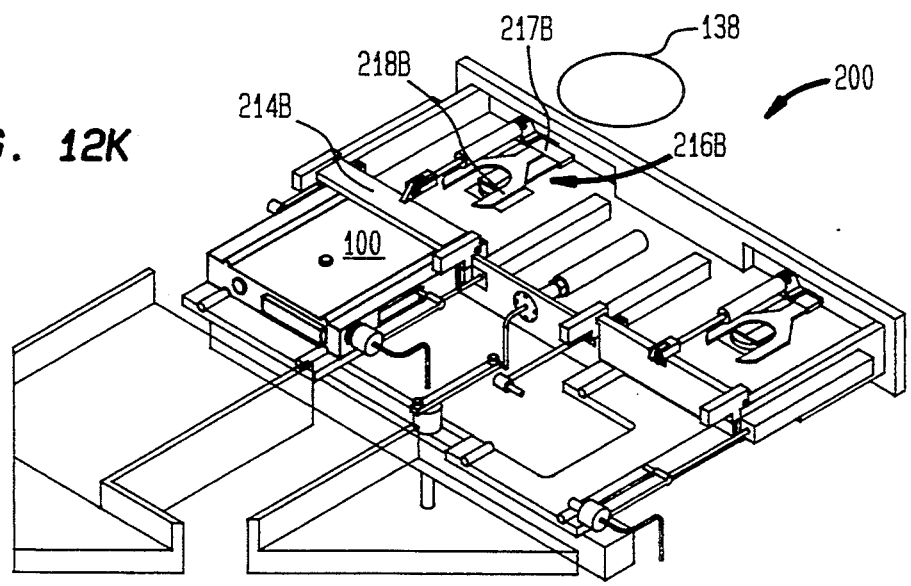
Figure 12L:
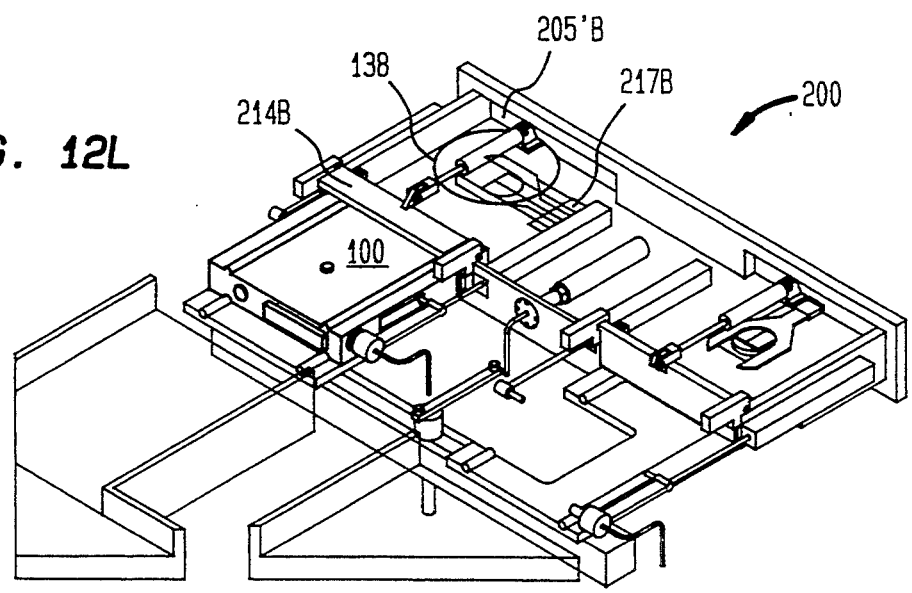
Figure 12M:
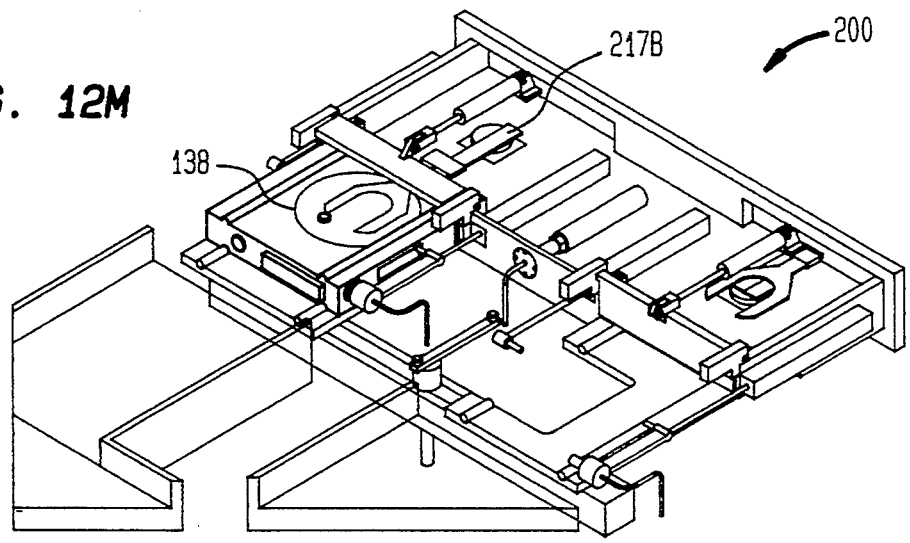
Figure 12N:
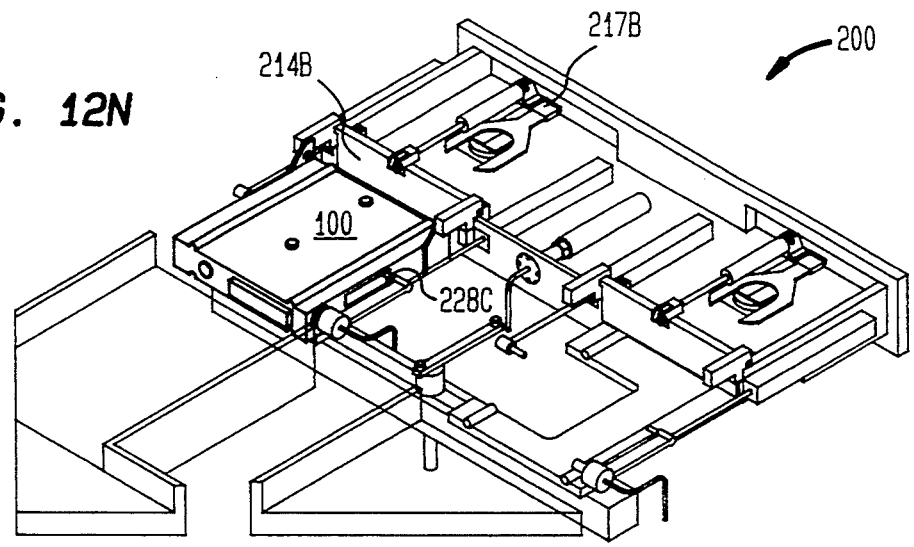
Figure 12O:
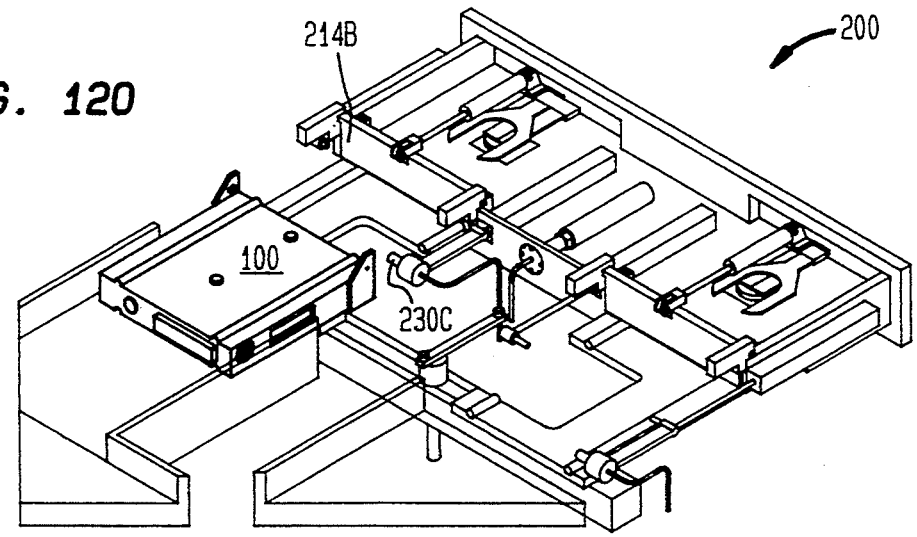

Overall operation of the interface apparatus 200 may be now understood by reference to FIGS. 12A to 12O which illustrate the basic sequence of operating steps for transferring a silicon wafer 138 from container 100 to the processing equipment chamber through the IN section of interface apparatus 200 (transfer IN operation). The reciprocal operation, i.e. the transfer of this silicon wafer once processed from the processing equipment chamber back to the container 100 through the OUT section of the interface apparatus 200 (transfer OUT operation), is also illustrated. FIGS. 12A to 12O show the interface apparatus 200 assuming the housing top surface is transparent to illustrate the successive movements of rotating transfer handlers 216A and B and the different respective positions of the wafer 138 to be processed. The said wafer 138 is enclosed in a container 100 that has to be successively unloaded and loaded. The following description implies references made to the container and interface apparatus elements such as described above in conjunction with FIGS. 2 to 5 and FIGS. 8 and 9 respectively.

In the initial position illustrated in FIG. 12A, lids 214A and B are hermetically closed. The interface housing interior space 204 is pressurized with an ultra pure neutral gas. The movable arms 227a and b of clamping actuator devices 225a and b are extended, while the movable arms 227c and d of clamping actuator devices 225c and d are retracted in their respective rest position.

Metal plate 240 of container transfer device 233 is in the low position. Input and output ports of by-pass station 401B of belt conveyor 401 are also illustrated in FIG. 12A.

In the first sequence step, a container 100 transported on the belt conveyor 401 whose wafer is to be processed in the process equipment 500 (not shown) attached to the interface apparatus 200 of FIG. 12A, is pushed in the container receiving zone of the IN section. The transfer from the main belt conveyor 401 to the IN section can be effected by great variety of manner, for example, by action of a lever (not shown) coupled with a transverse rotating belt (perpendicular to the said conveyor 401) forming said input port, and disposed in front of the IN section. Alternatively, an extension arm (not shown) activated by a jack having holes engaging in buttons 116A and B of container 100 (FIG. 2) could be used as well to pull the container. Similar construction applies to the OUT section with a reverse movement of the transverse belt in the output port thereof. Roller bearings 128A and B of container 100 are efficiently used as stop members when they respectively gently come in contact with thrusts 207b and a. Other systems for an accurate positioning of container 100 in the IN section rest zone, including a retractable lever, sensors, . . . may be contemplated as well. Immediately, the retractable fingers 228a and b, and the retractable nozzle 230a of clamping actuator devices 225a and b are extended and inserted in blind holes 111A and B (FIG. 2) and in the gas injection valve device 129 respectively, for a complete clamping and simultaneous gas feeding of container 100. The container 100 which is now permanently fed with gas can stay in the rest zone of the IN section as long as required by the host computer 601. Positioning rails 222a and b of centering support 221A cooperate with container grooves 113A and B (FIG. 2) for an accurate container positioning. If necessary, proximity sensors can be used to detect container exact position for extremely precise extension of the actuator movable arms 227a and b. FIG. 12B illustrates the container 100 at this stage of the process in the waiting position in the rest zone of the container receiving zone 221A. The two container and interface housing interior spaces are at the nominal pressure p.

The next step consists in the opening of lid 214A which closes port window 205A. To that end, actuator device 209A is activated, the retractable movement of arm 212A commands pivoting of lid 214A thanks to the mechanism coupled to yoke 213A. At the end of this step, pivoting lid 214A is horizontal as illustrated in FIG. 12C. As soon as lid 214A is opened, a continuous flow of neutral gas instantly escapes from port window 205A because interior space 204 of interface apparatus 200 is duly pressurized. Just before lid 214A is opened, the housing interior space 204 is pressurized to the blower pressure, so that Pint=P In fact, the P value is selected so that the gas stream passing through the port window 205A has an adequate gas flow rate typically in the 0.2–2 m/s range, preferably V=0.4 m/sec.

Once lid 214A has been fully opened, the interface interior space pressure is reduced to the nominal pressure (Pint=p), Actuator devices 225a and b pull container 100, roller bearings 128A and B are pressed against thrusts 207a and b which play the role of a cam because of their special profile or contour mentioned above. As a result, container cover 124 is progressively opened while container 100 continues to advance to come closer and closer to port window 205A. As soon as pivoting cover 124 is opened, a continuous gas flow escapes through perforations 142 of container 100 and in a small extent through transfer opening 132 to ensure a complete protection of the enclosed wafer by producing the efficient gas curtain mentioned above. During this step, the said blower pressure P is applied to the container interior-space to ensure an equivalent gas flow rate V. As apparent from FIG. 3, pivoting cover 124 is U-shaped. When laid horizontal, the inverted U forms a tunnel-like structure which is an additional source of protection when the container moves from the rest zone to the active zone. The two gas streams generated internally from the container and the interface port environments flow outwardly downwards through the aperture or perforations formed in the centering support 221A as mentioned above. Container 100 continues its movement until its front face comes to sealably mate with the interface housing front face. O-ring 122 of container 100, then ensures an excellent hermetic sealing therebetween. FIG. 12D illustrates the container position at this stage of the process. Container 100 is in the ready state and stays in the active zone of the container IN section receiving zone. Pivoting cover 124 of container 100 is positioned horizontal and located underneath lid 214A. The lateral sides 124A and B of the U-shaped pivoting cover 124 are slidably engaged in slots 206a and b of interface housing front face (see FIG. 10).

The pressurized gas enclosed in the container 100 flows laminarly on all sides of the wafer holder 130, therefore fully surrounding it, before escaping outside through perforations 142 ensuring thereby said efficient gas curtain at the vicinity of the container access opening. As a result, during all this critical operation, the wafer is surrounded by a protective gaseous environment having a positive differential pressure with respect to the external ambient, which prevents any ingress of contaminants, until the container is firmly and sealably mating with the interface housing front face. At the end of this step, both interior spaces are merged in a single environment and if so desired, connections of gas injection valve devices 129 and 244 to the gas supply installation may then be cut-off. A short idle period is now recommended to stabilize the said single environment. If this step is completed very fast, one can imagine the gas curtain produced by the air contained in the only reservoir be adequate. If so, connection to the gas supply installation at this time may be not a requisite, however the reservoir needs to be filled again should another transfer IN/OUT operation required. Note that during all this step, the wafer is in a substantially still environment because of the size ratio between holes 107 and via-holes 133 which limits gas circulation between the receptacle and holder interior space to produce the above mentioned trapping effects. It is also to be noted that the step sequence of FIGS. 12B to 12D is rapidly completed (approximately 2 sec) to limit gas losses.

FIGS. 12E to 12H illustrate the different movements of the rotating handler 216A and the respective different positions of the wafer 138 during the transfer IN operation. First, the movable arm 217A is extended through port window 205A and the vacuum operated fork-shaped gripper 218A is engaged underneath the wafer 138 within wafer holder 130. The gripper gently moves into the sub-opening 132B until it arrives at the final position, i.e. centered with respect to the wafer. Then, handler 216A slightly lift-up movable arm 217A, so that the gripper 218A gently contacts the back face of the wafer. The vacuum operated means attached to the gripper 218A is now activated to have the wafer firmly gripped by suction (FIG. 12E). Next, the wafer 138 is pulled out from the container 100 and transferred through window port 205A to the housing interior space 204, as a result of the retractable movement of the movable arm 217A and a first rotation of 90 degrees (FIG. 12F). Then, handler 216A rotates again of 90 degrees to allow movable arm 217A to extend again and move the wafer through the communication gate 205′ A (FIG. 12G). The wafer is laid down on the pre-process station of the processing equipment 500 and is now available for treatment. Movable arm 217A is retracted inside the interior space 204. This terminates the transfer IN operation for unloading container 100 and loading the pre-process station of the processing equipment. Simultaneously or subsequently, container 100 is disengaged, i.e. it is pushed back to the rest zone by the actuator devices 225a and b (FIG. 12H). During this phase, cover 124 and lid 214A are successively closed, while the container and housing interior spaces, are still not contaminated because of the protective gas streams generated from the two internal environments that produce the gas curtain mentioned above. Although other variants may be envisioned, the typical scheme is to apply said blower pressure P to generate the desired flow rate V at each time the pivoting cover 124 or a lid (214A or B) is opened. Consequently, the two interior spaces are normally at the nominal pressure p, possibly except when the container lies in the active zone, i.e. when the said two interior spaces are merged in a common interior space, with a single environment depending the type of processing equipment. However, more sophisticated schemes can be employed that required more than the two base pressure values p and P mentioned above. For example, two blower pressures can be employed P1 and P2 with P1 P2, so that when the container is coming to contact the interface housing front face for mating, one has Pcont=P1 and Pint=P2. Values P1 and P2 are different but not too much.

The following TABLE I summarizes the pressure values Pcont and Pint in the two respective interior spaces during the engaging step. The reciprocal disengaging step is totally symmetric.

TABLE I

| OPERATION | Pcont | Pint |
| --- | --- | --- |
| initial waiting status | p | p |
| preliminary to lid opening | p | p |
| lid opening: | | |
| start | p | p |
| pending | p | p |
| end | p | p |

TABLE I-continued

| OPERATION | Pcont | Pint |
|---|---|---|
| preliminary to cover opening | p | p |
| cover opening: | | |
| start | p | p |
| pending | p | p |
| end | p or O | p or O |

The rotating handler 216A is now rotated 180 degrees to come into the initial position shown in FIG. 12A. Then, the container 100 is released from clamping by retracting the fingers 228a and b and nozzle 230a, as a result of the reverse of the movement described in conjunction with FIG. 12B. Next, the container 100 is transferred from the IN section rest zone to the OUT section rest zone of interface apparatus 200. To that end, actuator device 234 of the container transfer device 233 is first driven to have metal plate 240 to pass under the container, until buttons 241a and b and holes 115A and B of container 100 are perfectly aligned. The metal plate 240 is first raised by actuator device 234 to clamp the container 100, then raised again to lift-up the container by about 5 cm to pass above actuator devices 225b and c and move it laterally until the container is located above the OUT section rest zone, as illustrated in FIG. 12I.

Next, actuator device 234 lift-down the metal plate 240, so that the container 100 is laid down upon centering support 221B with a perfect alignment thanks to positioning rails 222c and d cooperating with container grooves 113A and B. Finally, actuator device 234 is moved to its initial position. Once the container 100 is correctly aligned and positioned in the OUT section rest zone, the clamping actuator devices 225c and d are activated to have the sequence of movements described in conjunction with FIGS. 12B and 12C repeated. As illustrated in FIG. 12J, while container 100 remains in the rest zone of the OUT section, lid 214B is released. FIG. 12K shows the respective positions of container 100 now in the active zone of the OUT section container receiving zone, sealably mating with port window 205B according to a sequence of steps described above in conjunction with FIG. 12D. The processed wafer is now available at the post-process station of the processing equipment for unloading. The gripper 218B is in the initial position.

Now, the rotating handler 216B transfers the wafer from the post-process station into the container 100 by the following sequence. The handler 216B is first rotated by 180 degrees about its axis, the movable arm 217B extends through the communication gate 205'B, to present the vacuum operated fork of gripper 218B beneath the wafer and grasps it by activating the vacuum means. Then, the movable arm 217B is retracted and rotated by 90 degrees as illustrated in FIG. 12L. It is rotated again by 90 degrees and extended to insert the wafer into the container (FIG. 12M). Finally, the said vacuum means is released and the wafer then freed from gripper 218B, gently moves down to stay upon the supports pads 139a, b and c and is partially inserted in swiveling pads 137a and b.

Movable arm 217B is retracted. The sequence of steps of disengaging the container is the same that the one described in conjunction with FIGS. 12G and H. Because now adequately fed in gas, the container 100 may safely remain in the rest zone of the OUT section as illustrated by FIG. 12N, as long as required. This terminates the transfer OUT operation wherein the wafer is transferred from the post process (unloading) station to the container.

Once the host computer decides to move again container 100, actuator devices 225c and d push the container 100 onto the transverse conveyor belt of the output port of by-pass station 401B. Fingers 228c and d and nozzle 230c are retracted and movable arms 227c and d are also retracted. Container 100 which is no longer clamped and connected to the gas supply installation (FIG. 120), is moved towards the main belt conveyor 401 and is now available for further processing or handling. Remark, the length of movable arms of actuator devices 225c and d could be adapted for direct container placement onto the secondary belt of by-pass station 401B, or even onto the main-belt of conveyor 401, for example by using a telescopic arm.

The interface apparatus 200 has been described with reference to a preferred embodiment, involving a single wafer container and a standard processing equipment not pressurized. Preferably, pressurization of the interface apparatus interior space being achieved by connecting gas injection valve means 244 to the ultra pure gas supply installation. However, many variants may be envisioned.

First of all, the interface apparatus may be of a single IN/OUT port structure or of a dual port structure with separate IN and OUT sections or not. The latter case is illustrated in connection with FIGS. 10 and 11. According to the dual port structure of FIGS. 10 and 11, the IN and OUT sections are placed side by side, however, the IN section and the OUT section could be superimposed as well. In the latter case, the container transfer device 233 would operate vertically instead of laterally.

Moreover, the pressurized interface apparatus 200 has been described with externally controlled pivoting lids 214A and B, which is by far the preferred solution. However, the man skilled in the art can easily imagine other solutions: internal pivoting lids, or different types of door systems as well. For example, the shutter door moved up and down by a shutter opening/closing mechanism as described in EP-A-462459 (Ref. D10) assigned to Dainippon Screen Mfg. Co., Ltd or a slide door as described in FIG. 2 of U.S. Pat. No. 4,584,045 (Ref. D11) assigned to PLASMA-THERM Inc. However, the above described solution implemented with lid means is by far the simplest one. Note also that door means can also be adapted to the communication gates 205'A and B whenever necessary. In the latter case, the interface port zone would totally operate like a loadlock between the container and processing equipment chamber.

The SWC/MWC interface apparatus

FIG. 13 shows how the dual-port pressurized interface apparatus 200 of FIG. 11 may be simply adapted to perform load/unload operation between different types of containers. In the example illustrated in FIG. 13, a wafer stored in a single wafer container 100 is transferred in a multiple wafer container 100' (FIG. 8) or 100" (FIG. 9). Now turning to FIG. 13 and still assuming a transparent housing cover, basically interface apparatus 200' consists of single port version housing 202' whose front and rear faces are adapted to the size of the container to be fitted therewith. As a result, housing 202' has the typical substantially cubic shape illustrated in FIG. 13 defining a rather large interior space 204'. As far as the housing front face is concerned, the construction is quite similar with the one illustrated in FIG. 11. The lid 214'A which closes first port window 205 (not visible in FIG. 13) is controlled by actuator device 209'A. Actuator devices 225'a and b are provided on the lateral sides of the housing 200' which also includes centering support 221'A on which a SW container 100 rests. The housing front face further includes gas injection valve means 244' connected to the gas supply installation 700 via hose 245' and thrusts 207a' and b' for automatic opening of container pivoting cover 124. Among the minor changes, note a different attachment of actuator device 209'A fixed on cross bar 247 which is fastened to the thrusts 207'c and d. Rotating transfer handler 216' can be now driven in the Z direction thanks to an elevator piston 248. Quite similar construction is made with respect to the rear face of housing 202' with centering support 221'B, actuator devices 225'c and d, thrusts 207'c and d and actuator device 209'B to raise lid 214'B which closes second port window 205' facing first port window 205 (not visible). Although the interface apparatus 200' is adapted to make appropriate transfer of wafers between containers of the same type or of different types, it results in a not optimized operation and involves a lot of gas losses.

A number of steps is necessary to have as many containers 100 to come into contact with the housing front face for wafer unloading before the multiple wafer container 100' is filled up. This sequence of steps globally derives from the sequence illustrated in conjunction with FIGS. 12B to 12H. The SW containers may be stored in a dedicated dispatching apparatus 300, for being subsequently loaded with their own wafer. As clearly mentioned above, the use of multiple wafer containers is not the essence of the COAST concept. Interface apparatus 200' may be adapted to operate with a pile of containers as mentioned above supported by a lift device with indexing means. Of course, the reciprocal transfer, i.e. transferring the wafers stored in a MWC into a plurality of SWC's, is also feasible.

In still another preferred embodiment of interface apparatus 200', first port window 205 is likewise adapted to MW containers, and the rotating transfer handler 216 does not move in the Z direction any longer but is adapted to grip the multiple wafer cassette (e.g. 151 of FIG. 9A) in totality for direct transfer thereof in the processing equipment through second port window 205'.

THE DISPATCHING APPARATUS WITH A GAS SUPPLY DISTRIBUTION SYSTEM

According to the CFM concept, it is necessary to minimize the idle times. Consequently, it would be desirable not to store the containers to accelerate wafer processing. However, from a practical aspect, it is required to regulate the manufacturing fluxes and balance the workloads. On the other hand, elements of a manufacturing line includes electronic components (bar code readers, ...) and computer systems that are a source of potential failures. As a result, a buffer system is required to ensure this desired regulation. The dispatching apparatus of the COAST concept is perfectly suited in all respects to the CFM concept.

As explained above, in conjunction with FIG. 1, the first role of the novel dispatching apparatus of the COAST concept, is to store the containers 100 in the best conditions i.e. connected to the compressed ultra pure neutral supply gas installation 700 during the idle times between the wafer processing steps in the different processing equipments 500. The second role is to handle the containers, and in particular to transfer the containers from the stocker to a belt conveyor or viceversa or between two conveyors, e.g. between intra-bay and extra-bay conveyors.

Figure 14B:
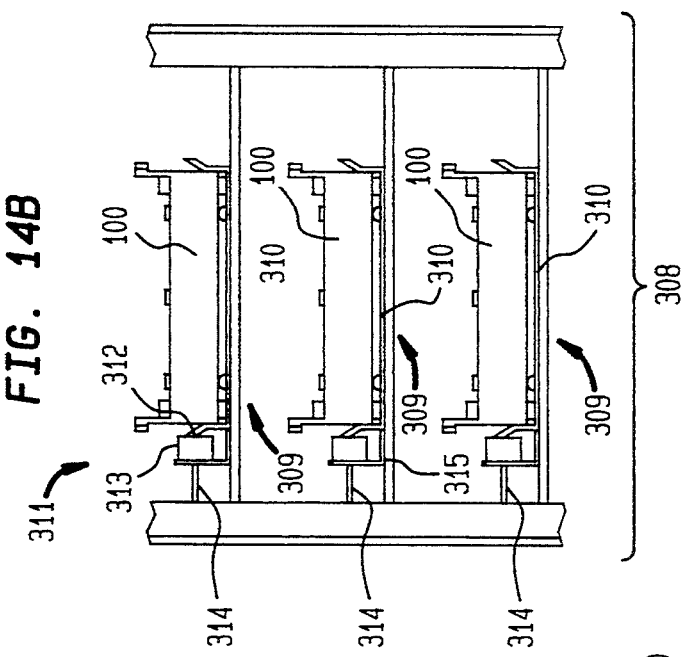
FIGS. 14A and 14B show a schematic perspective view of a tower-shaped implementation of the dispatching apparatus according to the COAST concept and an enlarged view of a portion thereof.
Figure 14A:
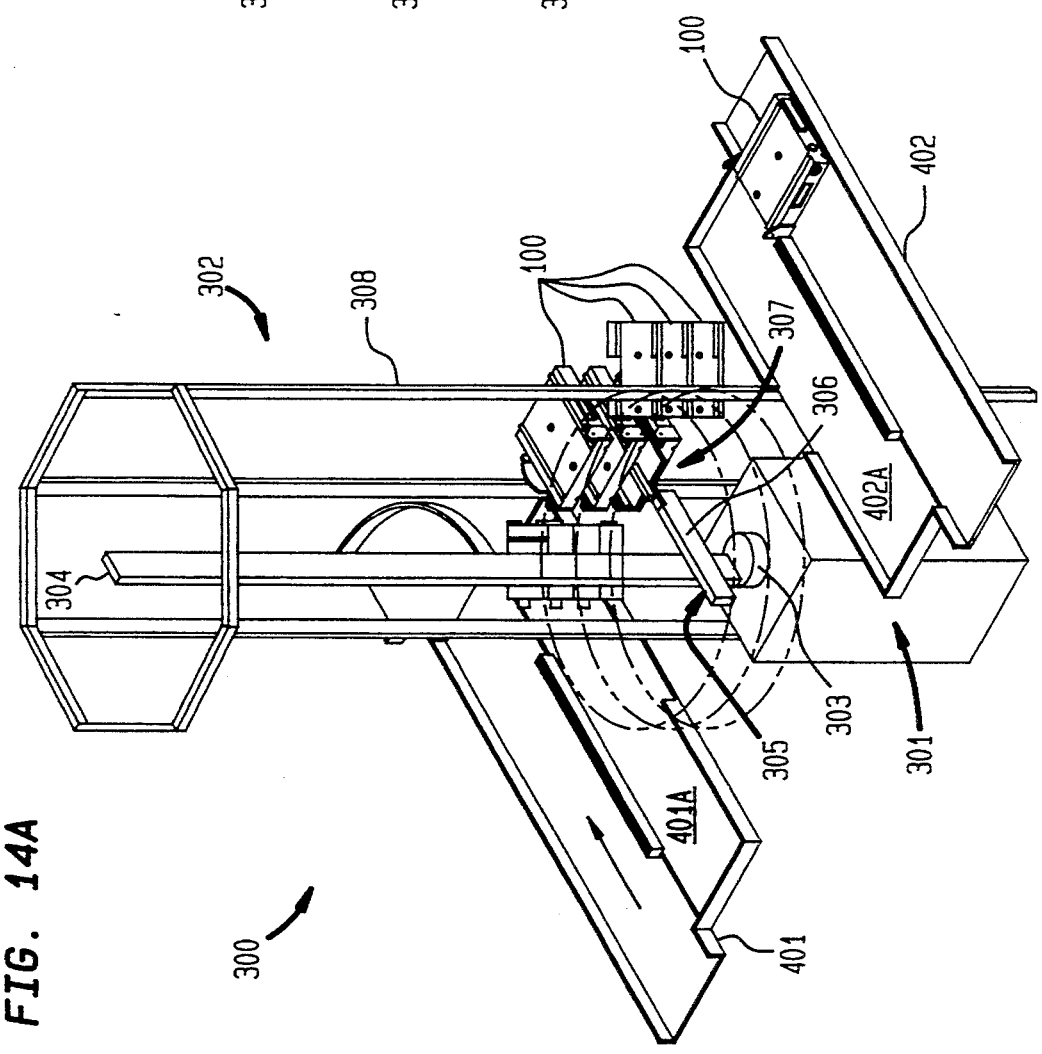

Now turning to FIG. 14, in a preferred embodiment, dispatching apparatus 300, which is fully automated under host computer control, is basically made of innovative 3 axis automatic handler 301 and vertical stocker 302.

The automatic handler 301 is made of a rotatable base 303 supporting a vertical elevator 304 on which a handling robot 305 comprised of an extensible horizontal arm 306 provided with gripping means 307 fixed at the extremity thereof.

The vertical stocker 302 consists of a stainless steel frame 308 made of tubes supporting as many support stations or bins 309 as required by production simulations. The bins 309 are superposed in vertical columns and those vertical columns are positioned on a circle centered about the rotative axis of the handler 301. It results in the typical tower-shaped configuration of FIG. 14. As more particularly illustrated in the enlarged view of FIG. 14, each bin 309 consists of a support plate 310 equipped with a gas feeding system 311 including a retractable nozzle 312 activated by jack 313 and connected to the outlets 705 of neutral gas supply installation 700 by hoses 314. The pressure and quality of the enclosed gas within container 100 can be visually controlled with accuracy thanks to observation plug 149 (FIG. 5) whenever necessary. The gas feeding system 311 is affixed on the plate 310 thereon by corner-plate 315. All the individual hoses 314 are connected to the gas supply installation 700.

Still in this preferred embodiment, nozzle 312 provides automatic control of the gas flow within the container. When extended (container 100 is present), the gas flows through nozzle 312 to feed container interior space, when retracted (absence of container 100) the gas flow is cutoff. As a result, only an electrical (or pneumatic) command of nozzle movement is required.

According to another embodiment of the dispatching apparatus 300, the tubes forming the frame 308 are hollow and thus can be used for gas transportation between the gas supply installation 700 and the bins. According to this implementation, hoses 314 are directly connected to the said tubes. In still another embodiment, the pipes are positioned within said hollow tubes.

Dispatching apparatus 300 facilitates transfer of containers between intra-bay conveyor 401 (or extra-bay conveyor 402) and the stocker 302, or between the conveyors themselves.

The detailed construction of bin 309 and robot 305 will now be given in conjunction with FIG. 15. Each bin 309 is well adapted to receive a container 100. To that end, plate 310 is provided with two sidewalls 310A and B and two positioning buttons 315A and B that engage in corresponding holes 115A and B of container 100 (FIG. 2).

As far as robot 305 is concerned, gripping means 307 may be designed in a great variety of manners. As illustrated in FIG. 15, gripping means 307 first comprises flange 316 provided with two holes 317A and B, wherein pins or buttons 116A and B formed at the external top surface of container 100 engage. A transverse bar 318 is fastened to flange 316 and carries two gripper devices 319 A and B, that are fixed thereon. Gripper device 319A comprises a jack 320A, piston 321A and Jaw 322A whose end is provided with a pad 323A which engages in recess 112A for container clamping. Similar construction applies to gripper device 319B. Once activated, the two Jaws 322A and B are pivoting of about 15–30 degrees to clamp container 100.

Each bin is identified by its position (Z coordinate) in the column, the identification number of the column and the identification number of the stocker in the factory so that each bin has his own address, which is identified in the host computer memory. Moreover, a label is affixed in front of each bin to identify this position and thus the container stored therein, in case of automatic handler failure. Consequently, an operator may determine the right bin at a glance and thus the container to be processed in a processing equipment. It is important to remark that, due to its unrivaled design, dispatching apparatus 300 is not only well adapted to work with conventional conveyors, but it may accommodate different heights thereof. Standard processing equipments may have input/output ports at different heights, thus the use of dispatching apparatus 300 with inclined conveyor parts, readily solves the problem of port height adaptation. Note, dispatching apparatus is also operable as a lift device.

Figure 15:
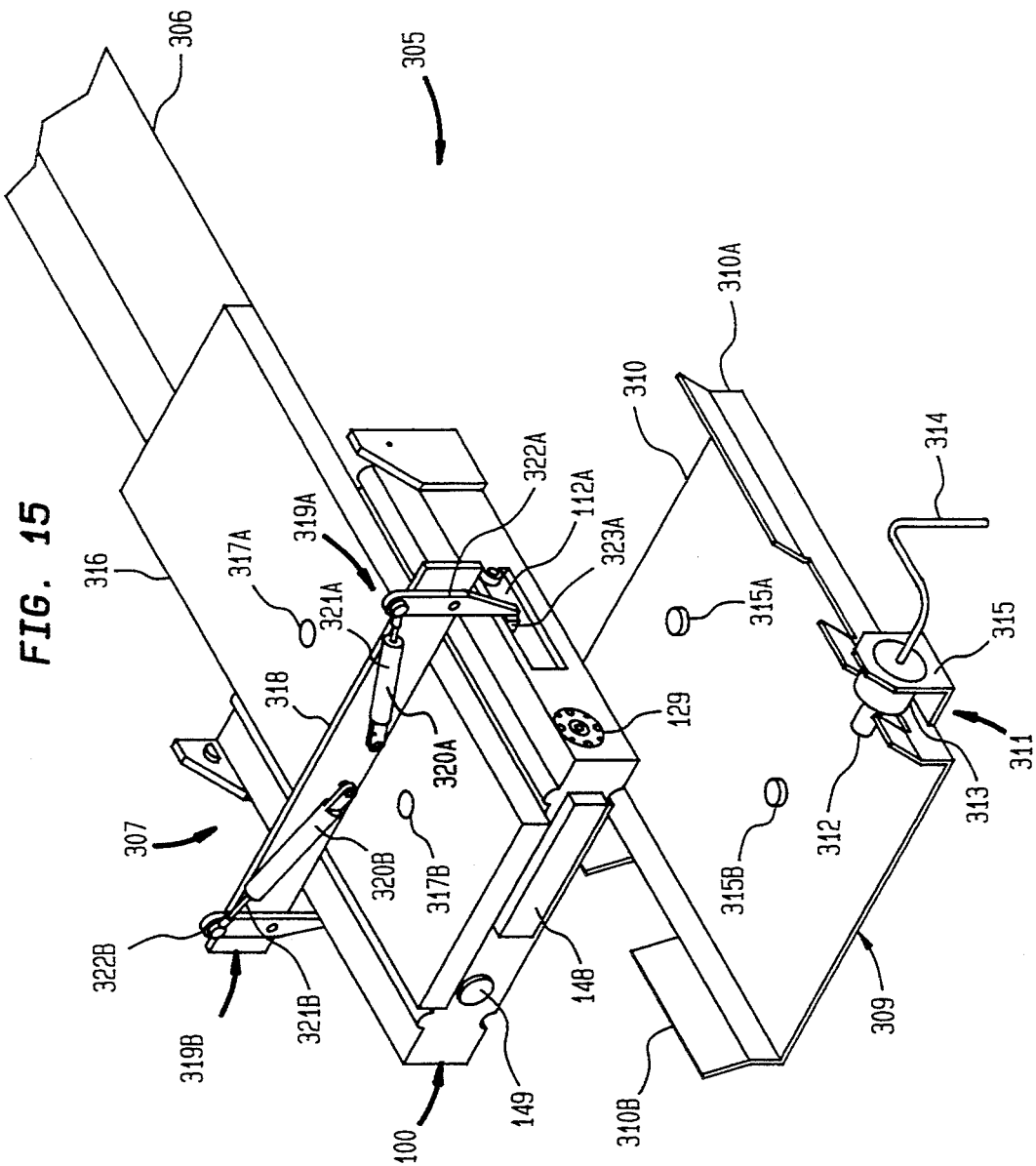
FIG. 15 shows the preferred embodiment of the handling robot which is an essential part of the apparatus of FIG. 14A.
Figure 16:
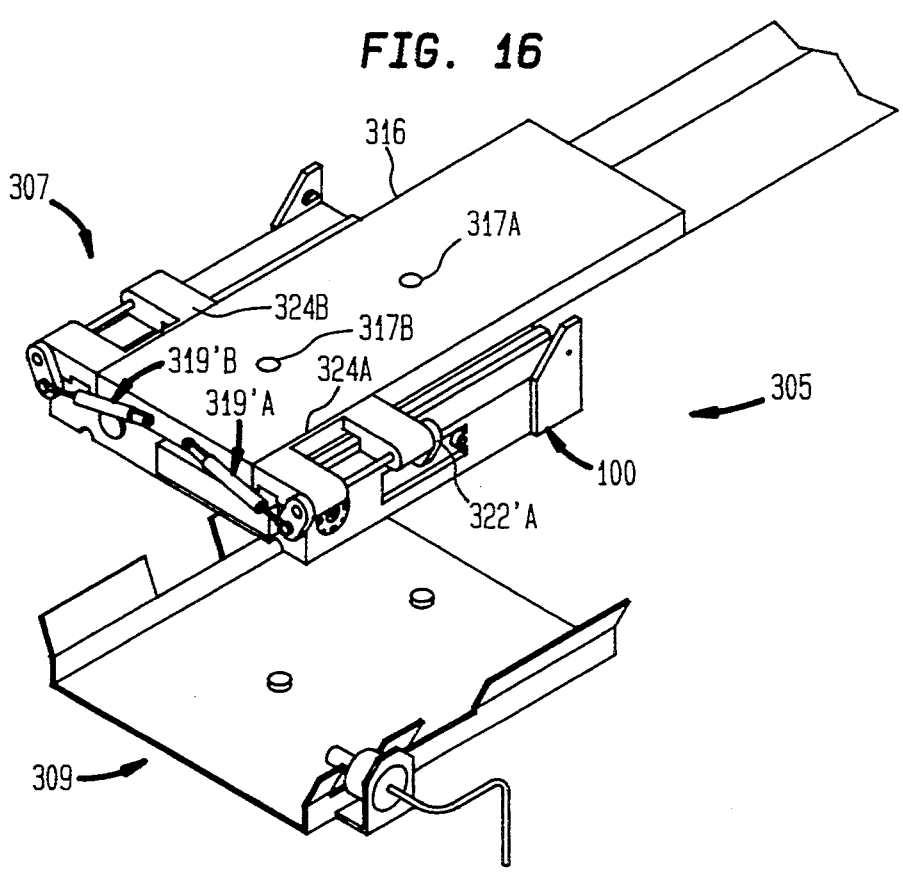
FIGS. 16 and 17 show two variants of the handling robot of FIG. 15.
Figure 17:
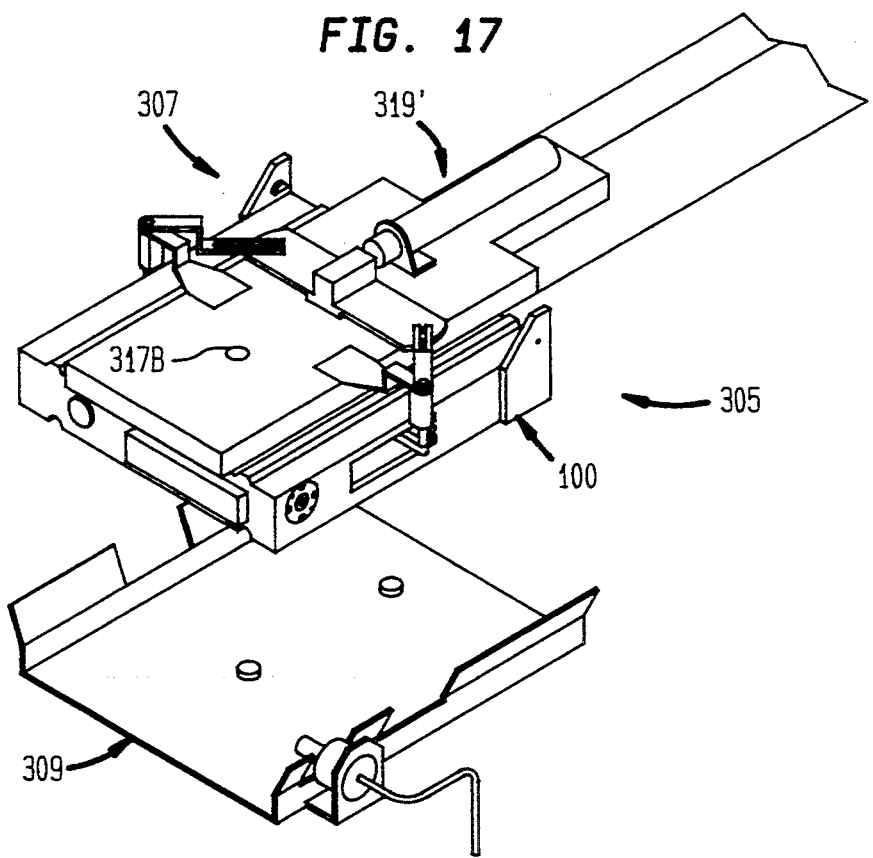

FIGS. 16 and 17 show two variants of the gripping means 307 of FIG. 15, the improvement consists to reduce the height thereof, so that a greater number of containers 100 can be piled in a specified storage column of dispatching apparatus 300. In FIG. 16, the implementation is quite similar to FIG. 15 still with a flange 316 provided with two actuator devices 319'A and B. Only the structure of Jaws 322'A and B is different, because U-shaped parts 324A and B, are now required.

FIG. 17 shows another variant using only one common actuator device 319' and a completely different system of jaws, whose pivoting is now made laterally instead of vertically. Other variants, such as electromagnetic, vacuum or pneumatic gripping means may be envisioned as well.

Overall operation of dispatching apparatus 300 reads as follows. When a processing equipment, which performs a specified processing step, is going to be available (e.g. no more container 100 in the IN section of the corresponding interface apparatus 200), the host computer 601 knows what wafers are waiting for this step in the stocker 302 of dispatching apparatus 300. Thus, according to scheduling defined by the FCS logistic management (depending on the equipment availability, the current wafer priority, the equipment set-up parameters, . . . ), host computer 601 decides which wafer and thus which container has to be moved to this equipment. From its main memory it determines in which bin 309 of stocker 302, the desired container 100 is stored. Now turning to FIGS. 14 and 15, and assuming robot 305 is in the initial position, i.e. in front of the input/output port of by-pass station 401A with arm 306 retracted. Then, under host computer control, the automatic handler 301 rotates the arm 306 and moves it along elevator 304 vertically until it comes in front of the right bin 309. Then, arm 306 is extended in order to put the flange 316 above the wanted container 100 and in registration therewith. Next, the arm 306 gently goes down until flange 316 touches the top of the container, to have the pins 116A and B of the container engaged in the holes 317A and B of flange 316. Then, the jacks 320A and B are actuated in order to rotate the grippers 319A and B, until the container is gripped. Next, the nozzle 312 is retracted cutting-off thereby the gas connection with gas supply installation 700, the arm 306 slightly moves up to release the container 100 from the pins 315A and B of support plate 310. The arm 306 is now retracted, moved vertically downwards and rotated to present the container 100 in front of the input/output port of by-pass station 401A. The arm 306 is extended again and sustain the container slightly above (e.g. 1 mm or less) the secondary conveyor belt of the by-pass station 401A. The actuator devices 320A and B are then activated to open the jaws 322A and B, robot 305 slightly goes up so that the pins 116A and 116B of container 100 are released from flange 316. The arm 306 is retracted and the robot 305 is ready to execute the next operation. Once the container 100 is laid down onto the secondary belt of by-station 401A, it is pushed to the conveyor 401 and moved to the designed process equipment 500. The man skilled in the art may readily implement others techniques to obtain a gentle setting of the container upon the belt conveyor. Shocks and vibrations have obviously to be minimized. Thanks to the capability as explained above, of the bar code readers 604 (FIG. 1) that are Judiciously disposed all along the conveyors 401 to read without contact the identification label 148 stuck on the back of the container 100 location of the latter is continuously checked. The main memory of the host computer is now informed that this bin 309 is henceforth empty and container route sheet is updated. All operations described above may be facilitated should appropriate sensors be used, to detect container position, centering to energize the motors that control the secondary belts, . . . under host computer control. etc.

Figure 18:
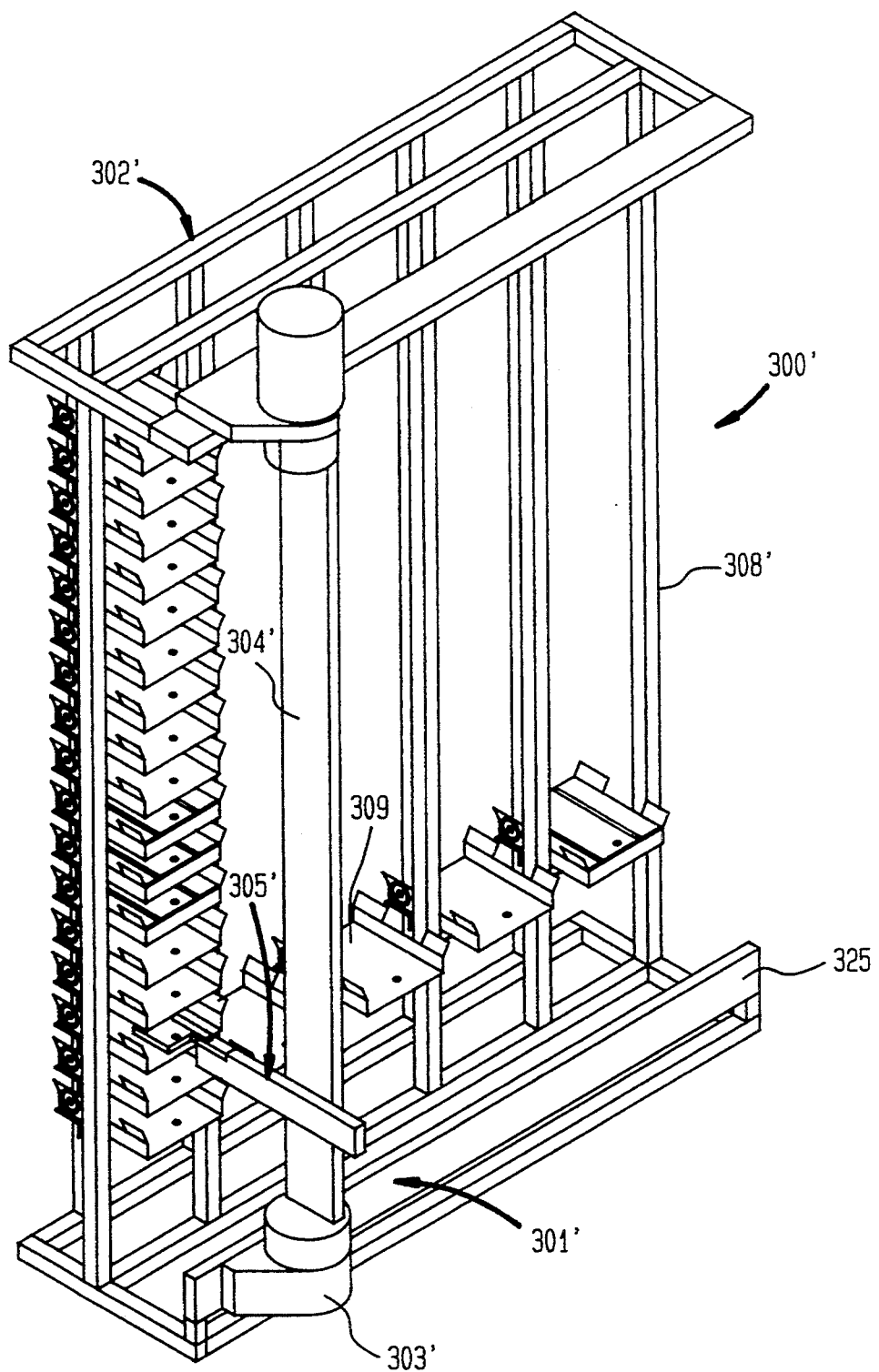
FIG. 18 shows a wall-shaped variant of the dispatching apparatus of FIG. 14A.

FIG. 18 shows a dispatching apparatus referenced 300' including a wall-shaped stocker variant referenced 302', of the tower-shaped stocker 302 of FIG. 14, useful if more storage capacity is needed or if necessitated to meet manufacturing line lay-out requirements. With respect to FIG. 14, in FIG. 18, similar elements bear corresponding references. In this case, the rotatable base now referenced 303' has to be moved along a rectilinear track 325 fixed on the floor. Note there is also a great flexibility in designing this variant.

As apparent from FIGS. 14 and 18 the novel interface apparatus of the COAST concept are flexible, modular fully adapted to conventional conveyors, and thus capable of meeting all user potential needs.

FULLY AUTOMATED AND COMPUTERIZED CONVEYOR BASED MANUFACTURING LINES

For the fabrication of future advanced semiconductor chips, manufacturers are facing different factors among which the most important is certainly to eliminate or at least significantly reduce wafer contamination. Other key factors, such as quality (a constant thrust from the customers), higher yields, lower costs and reduced lead times, are closely related to wafer contamination. On the other hand, the technology continuously evolves towards increased chip integration, ever reduced minimum feature sizes, and increasing process complexity (advanced bipolar structures can require a thousand of processing/treatment steps).

To achieve these desired goals the response is "to automate the fab". The global automation approach as suggested by the COAST concept is a quite satisfactory solution in all respects. It implies both mechanical automation and computerization. Mechanical automation means to have fully automated handling/transportation systems and processing equipments. Computerization means to have an efficient information management system, often referred to as the Floor Control System combined with a complex network of wafer identification devices for permanent wafer tracking. Merging both techniques results in a fully automated and computerized manufacturing line.

Of course, for a full automated operation of a manufacturing line under the FCS control, processing equipments must be adapted in the future to provide all necessary data/information (that are now partially supplied to operators) in a form useable by the FCS and conversely, be responsive to it. These data include parametric process data collected during wafer processing, equipment availability data (down, waiting for wafer, processing complete, processing in work, . . . ), in-situ control data, and set-up data. These data further include logistic data concerning availability of intermediate products such as: raw wafers, reticles, photoresist, . . . that are required in the semiconductor wafer processing. Likewise, they must be capable of accepting commands from the FCS that traditionally have been input by an operator. Note by the way, these the reticles can be handled, stored and transported to their appropriate locations by the same manufacturing line. An operator is then able to load them in the lithography tools wherever required.

What is further required is a dynamically controlled movement to eliminate or at least significantly reduce the idle times, to comply with the CFM concept, and finally operate in the mode of "just-in-time" management. The FCS should know the history identity and status of all the intervening parties: wafers, equipments, fluids, . . . in the factory. The FCS moves the containers to equipments for further wafer processing based on availability and wafer processing scheduling. The FCS must be real time in nature and must operate without human intervention to avoid misprocessing errors that are a major yield detractor. Situations where an equipment languishes idle for extended periods of time in waiting for a wafer to be processed or because after processing the wafer has not been removed from the equipment, contributes to a loss of efficiency in the manufacturing continuous work flow. To achieve an autonomous and real-time automated FCS, all this information must be captured electronically.

Finally, for normal operation, and in case of problems (recovery plan) the operator (or the line management personnel, who has the need to know, must be able to interrogate the different parts of the FCS, inside or outside the facility for instance, via terminals. In other words, the wafer fabrication facility must include a distributed computer network.

In conclusion, while "islands of automation" are a useful stepping stone, full achievement of the previously mentioned goals will only be realized when each piece of the manufacturing line is capable of taking its place as a full partner of such an automated factory and when the FCS is able to assimilate the flow of data it receives and in turn, to execute the correct action.

The previous SMIF solutions as described above are far to be a total solution to such a desired fully automated and computerized manufacturing line. Still according to the COAST concept, there is suggested to merge the three above disclosed novel elements, i.e. the pressurized sealable transportable container, the pressurized interface apparatus and the dispatching apparatus with a conventional conveyor system and a standard distributed information management system referred to as the Floor Control System. The optimal integration of these elements in that context, results in a great variety of efficient, highly flexible, modular, smart manufacturing line architecture which do require only minimal human intervention to operate and have outstanding recovery capabilities to overcome any type of incidents or failures as it will be explained now.

Figure 19:
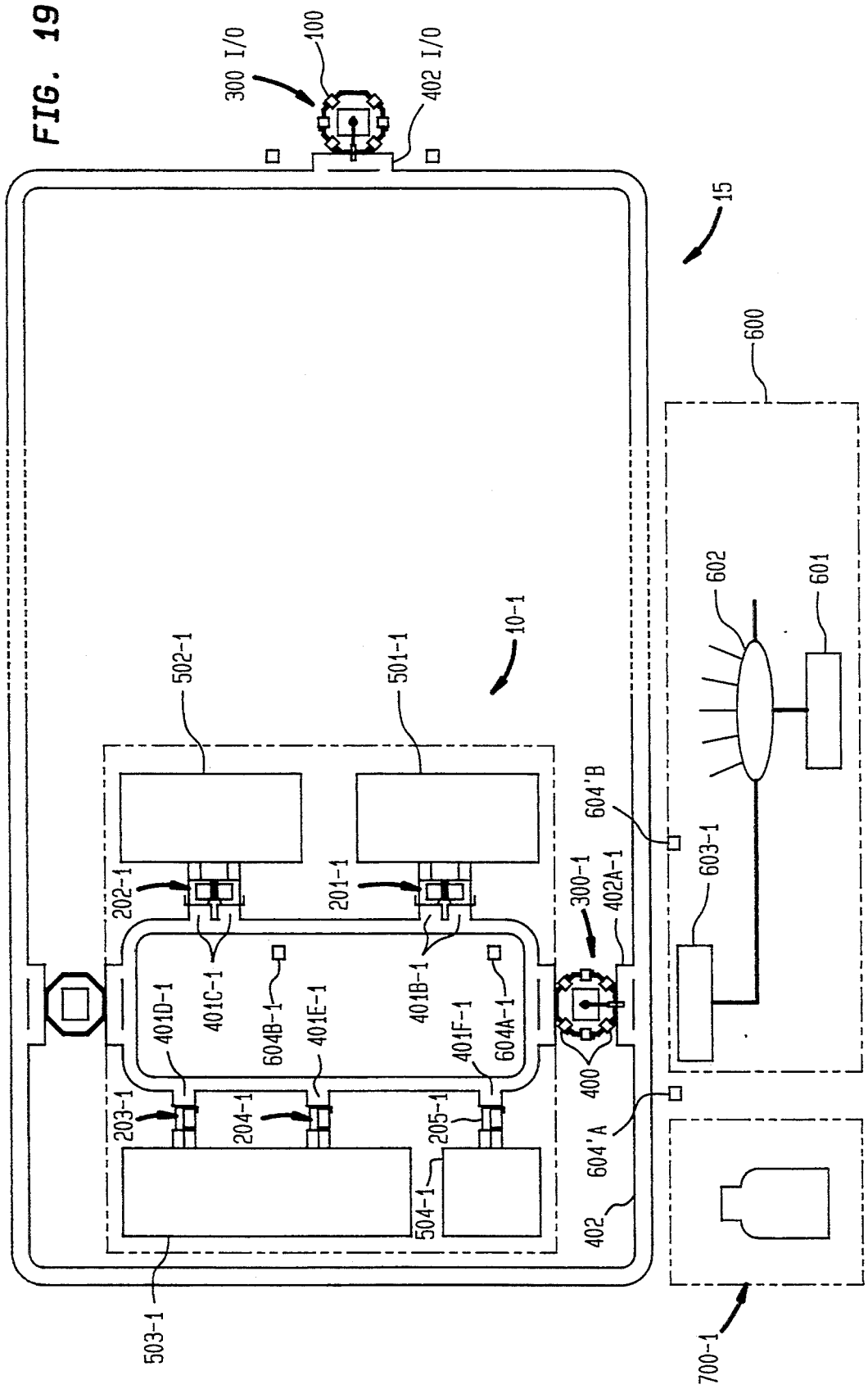
FIG. 19 schematically shows a first embodiment of a fully automated and computerized conveyor based manufacturing line architecture according to the COAST concept.

FIG. 19 schematically illustrates a first embodiment of a novel manufacturing line architecture that implies both conventional intra-bay and extra-bay conveyors combined with a standard distributed information management system.

Now turning to FIG. 19, there is shown a manufacturing line architecture bearing numeral 15 adapted to the COAST concept including the above mentioned base elements and organized around a loop-shaped extra-bay conveyor 402. Process area 10-1 is organized around intra-bay conveyor 401-1 which transports and distributes containers 100 to the adequate processing equipments 501-1, 502-1, . . . (they may be identical or different), via corresponding single port or dual port interface apparatus 201-1, 202-1, . . . etc. For example, interface apparatus 201-1 and 202-1 are of the dual-port type such as described above in conjunction with FIGS. 10 to 12. Unlike, processing equipment 503-1 uses two remote single port interface apparatus referenced 203-1 and 204-1. Finally, processing equipment 504-1 uses only a single port interface apparatus 205-1. The by-pass stations implemented in conveyor 401-1 are referenced 401A-1 . . . etc. A plurality of bar code tag readers 604A-1, . . . are installed at judicious locations of intrabay conveyor 401-1.

The process area 10-1 is associated with dispatching apparatus 300-1, which has the regulating role mentioned above and in particular to store the containers and to transfer them to and from conveyors 402 and 401-1. Extra-bay conveyor 402 is also provided with bar code readers 604'A, . . . etc. Optionally, another dispatching apparatus can be installed on the opposite side of process area 10-1 for higher throughputs according to production simulations. Other process areas 10-2, . . . , 10-N can be installed within extra-bay conveyor 402 in manufacturing line architecture 15.

An input/output buffer dispatching apparatus 300 referenced 300 I/O has also been illustrated in FIG. 19 facing by-pass apparatus 402 I/O. Dispatching apparatus 300 I/O is loaded by containers either manually or automatically by chaining a second extra-bay conveyor (not shown) to it.

The manufacturing line architecture 15 further includes the Floor Control System 600 now comprised of host computer 601, Local Area Network 602 and a plurality of area micro controllers, one for each process area, referenced 603-1, . . . etc. It further includes a compressed ultra-pure neutral gas supply installation 700-1 dedicated to process area 10-1. However, a central gas supply installation 700 for the whole manufacturing line 15 may be envisioned as well. It is a significant advantage of the COAST concept, to have manufacturing line 15 operating in an average clean room and not in an ultra clean room.

Figure 20:
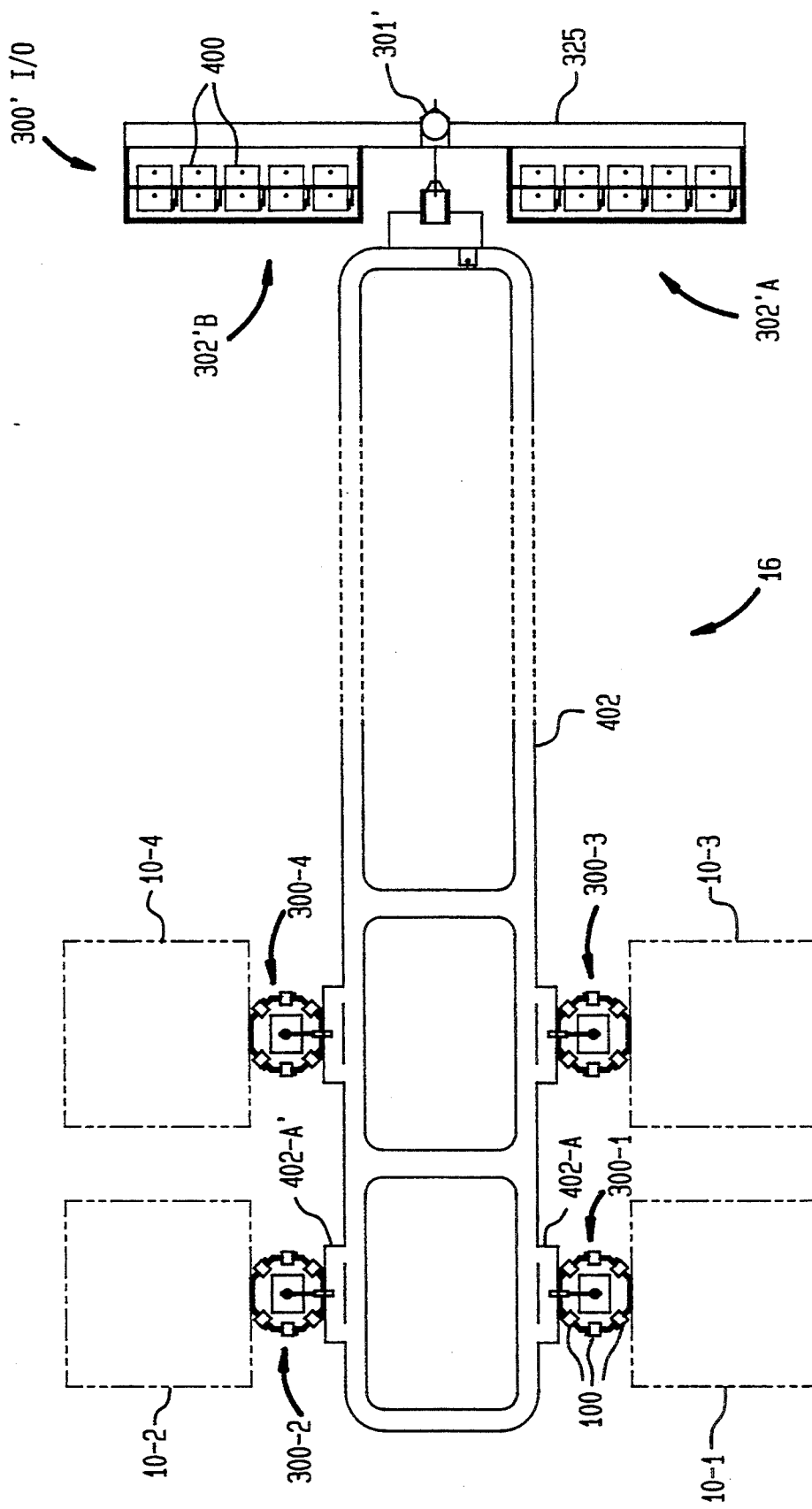
FIG. 20 schematically shows a variant of the manufacturing line architecture of FIG. 19.

FIG. 20 shows another manufacturing line architecture 16, wherein process areas 10-1, . . . have been only schematically illustrated. Process areas 10-1, . . . are disposed at the exterior of a central linear extra bay conveyor 402 which is interestingly provided with bridges 402AA', . . . for higher throughputs. In FIG. 20, the dispatching apparatus 300' I/O is typically of the wall-shaped type and includes two vertical stockers 302'A and 302'B, and automatic handler 301' which moves along rail 325 as explained above. For example, vertical stocker 302'A stores the containers whose wafers are to be processed (raw wafer) and stocker 302'B stores the containers once the wafers have been submitted to the full sequence of processing steps (completed wafers). Other manufacturing line architecture variants may be envisioned as well.

Detailed operation will now be illustrated by reference to FIGS. 1 and 19.

When the container 100 is pushed on the IN section rest zone of interface apparatus 201-1 of processing equipment 501-1, it is immediately clamped and connected to the neutral gas supply installation 700-1. Its identification is sent to the host computer 601 by reader 604A-1. If necessary, host computer 601 first checks if equipment 501-1 matches well the process step planned to be done on the enclosed wafer to avoid any misprocessing. If yes, the procedure to open the container, unload the wafer therefrom and transfer it into the interface port zone as described in conjunction with FIGS. 12A to 12E, is initiated. During the time the wafer is being treated, the host computer 601 is permanently informed by the equipment of the process progresses.

At the end of the processing, the wafer is loaded again in the container 100 at the interface apparatus OUT section according to the procedure described in conjunction with FIGS. 12J to 12N. The processing equipment 501-1 informs the host computer 601 that the process step has been completed and the data of the route sheet of this wafer is now updated. The host computer 601 undertakes the necessary steps of what has to be done for this container. If it is a process operation to be made by another processing equipment, but still supplied by the same dispatching apparatus 300-1, i.e. in the same process area 10-1, the container 100 is just moved directly to it if the designated process equipment is available, or to the dispatching apparatus 300-1 for a temporary storage, if not. Anyway, the container is put on the intra-bay conveyor 401-1, in order to reach the next processing equipment or dispatching apparatus 300-1.

When the next process step has to be done in another process area, e.g. 10-I (not shown) the host computer 601 requests the dispatching apparatus 300-1 to pick up the desired container 100 on the by-pass station 401A-1 of conveyor 401-1 and make all the movements necessary to grip and drop it on the by-pass station 402A where it is moved towards main conveyor 402. From then, it is moved to dispatching apparatus 300-I where is located the right processing equipment. Note that, an additional dispatching apparatus, such as of the type 300' described above, can be only used as a buffer, in manufacturing line 15, to overcome the risk of no available room in the appropriate dispatching apparatus. When the container 100 is on the input/output port of the by-pass station of dispatching apparatus 300-I, robot 305-I is informed that it must grip this container and put it in an available bin as defined by the host computer 601 whose main memory is then updated. If the process equipment is not immediately available, the host computer 601 is aware of this container which is waiting for being processed and which processing equipment is appropriate in that respect. As soon as the processing equipment is made available, this container is moved to it.

Moreover, the manufacturing lines of the COAST concept are well adapted to a recovery plan.

In case of failure of the host computer 601, the area micro-controller of each process area will keep in memory all the data concerning the position and status of all the containers pertaining to it. An operator is then able to drive manually this process area, but he will have to record manually in the area micro-controller all the process operations he has made on each wafer, in order to have the data of the electronic route sheet updated in the host computer when operative again.

In case of failure of a dispatching apparatus, the operator will also be able to know through the host computer where is the right container to be processed, to put it by hand directly on the IN section rest zone of the appropriate processing equipment. Thanks to the host computer 601 he also knows what is the next operation to be completed and in which available bin he has to store the container enclosing the processed wafer. The operator will have to report to the host computer 601 any movement he has made in and out the dispatching apparatus for validation.

More generally, all the containers are identified automatically every time they go in and out a processing equipment or a dispatching apparatus, in order to have the host computer to know permanently where they stand and what is the next process operation to be made thereon. If this information is missing, there is an alarm to inform the operator that there is a failure and an error is reported. A corrective action is undertaken. Data that are recorded in the host computer are useful for subsequent statistical analysis and processing equipment set-up parameter adjustment, for feed-back action.

The above solutions described by references to FIGS. 19 and 20 are therefore an effective and low cost approach to a total solution for automating a wafer fabrication facility in compliance with the CFM concept, because the disclosed novel manufacturing lines and variants thereof are capable to perform the three functions that are required in that respect which are recited below.

1. Global automation
   a) Automatic wafer tracking. Determination at any time of the physical location and status of containers/wafers, because each container is provided with an identification tag and the conveyors are judiciously equipped with adequate readers. As a result, the containers are permanently tracked and identified by the FCS, irrespective of being transported by the conveyors, stored in a dispatching apparatus, or processed in a processing equipment. Note that the novel containers are perfectly suited for direct wafer data identification reading.
   b) Automatic container transport and dispatching. Moving the containers between processing equipments or within process areas is automatically performed by conventional conveyors and novel dispatching apparatus, under host computer control without any human intervention.
   c) Automatic processing equipment loading/unloading. All the operations of loading/unloading the processing equipments with the wafers are safely performed. They are fully automated under host computer control thanks to the novel interface apparatus.
2. Contamination-free wafer fabrication
   All the steps of transport, loading/unloading, storage, and dispatching conducted within the manufacturing line are completed while the wafer is still surrounded by a protective neutral ultra-pure gaseous environment having a positive differential pressure with respect to the outside ambient. As a result, any ingress of contaminants is prevented during the whole sequence of treatment steps.

3. Single wafer treatment

The container and the interface apparatus are perfectly adapted to move towards the single wafer strategy that appears to be inevitable for the future.

POTENTIAL APPLICATIONS OF THE COAST CONCEPT

First of all, major applications can obviously be found in the semiconductor device manufacturing, not only in the fabrication of chips as described above, but also in the fabrication or the handling of raw wafers, photomasks, reticles ... that are extensively used in this industry.

The COAST concept can also find obvious and direct applications in other fields of the technology, e.g. ceramic substrates, compact discs (CDs)-audio or ROM, magnetic disks, ... etc.

More generally, it goes without saying that the novel pressurized sealable transportable containers, the novel pressurized interface apparatus, the novel dispatching apparatus with a gas distribution system, and finally the novel fully automated and computerized conveyor based manufacturing lines deriving therefrom can also be applied everywhere any contamination-free workpiece fabrication is required. In others words, where the fabrication of workpieces under conditions appropriate for an ultra clean facility is necessary, without requiring the huge clean room facility and dramatic related investments. For example, it is possible to extend the COAST concept for fabricating medicaments, foods, chemicals, ... and to use it in the fields of genetic engineering, virology and the like.

We claim:

1. A dispatching apparatus (300) with a gas supply distribution system for handling and storing a plurality of pressurized sealable transportable containers (100) of the type consisting of a box-shaped housing (102) provided with an access opening (104) sealed by releasable door means (124) and gas injection valve means (129) including:

an automatic handler (301) comprising:

a base member with a rotatable head (303);
an elevator arm (304) fixed thereon;
a handling robot (305) affixed on said elevator comprising an extension arm (306) and container gripping means (307); and,
a vertical stocker (302) comprising:
a frame (308) formed by a plurality of hollow vertical tubes, said frame having a plurality of support stations or bins (309) attached thereon; wherein each bin is provided with gas injector means (311) connected on the one hand, to said gas injection valve means and on the other hand to a compressed ultra pure neutral gas supply installation (700) for maintaining a positive differential pressure $\Delta p$ within the container with respect to the outside ambient during the storage time wherein said hollow vertical tubes are used for gas transportation.

2. The dispatching apparatus of claim 1 wherein said plurality of hollow vertical tubes are assembled in a circle configuration centered about an axis passing by the rotable head to produce a tower-shaped configuration.

3. The dispatching apparatus of claim 1 wherein said plurality of hollow vertical tubes are assembled in a linear direction to produce a wall-shaped configuration.

4. The dispatching apparatus of claim 3 wherein the rotable head is moving along a rectilinear track (325).

5. The dispatching apparatus of claim 1 wherein each of said bins consists of a support plate (310) having said gas injector means (311) fixed thereon.

6. The dispatching apparatus of claim 5 wherein said gas injector means comprises a jack (313) actuating a retractable nozzle (312).

7. The dispatching apparatus of claim 6 wherein said gas injector means operates in a first mode, when the nozzle is extended into the container gas injection valve means, the connection to the gas supply installation is thereby achieved, and conversely in a second mode when the nozzle is retracted, and the connection is thereby cut-off.

8. The dispatching apparatus of claim 1 wherein said gas injector means are adapted to establish a positive differential pressure $\Delta p$ approximately in the 500–10 000 Pa range within the container.

9. The dispatching apparatus of claim 8 wherein said differential pressure $\Delta p$ equals about 5 000 Pa.

* * * * *